US 11,152,294 B2

(12) United States Patent
Huang et al.

(10) Patent No.: US 11,152,294 B2
(45) Date of Patent: Oct. 19, 2021

(54) HERMETIC METALLIZED VIA WITH IMPROVED RELIABILITY

(71) Applicant: Corning Incorporated, Corning, NY (US)

(72) Inventors: Tian Huang, Painted Post, NY (US); Mandakini Kanungo, Painted Post, NY (US); Ekaterina Aleksandrovna Kuksenkova, Painted Post, NY (US); Prantik Mazumder, Ithaca, NY (US); Chad Byron Moore, Corning, NY (US); Chukwudi Azubuike Okoro, Corning, NY (US); Ah-Young Park, Corning, NY (US); Scott Christopher Pollard, Big Flats, NY (US); Rajesh Vaddi, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/376,467

(22) Filed: Apr. 5, 2019

(65) Prior Publication Data

US 2019/0313524 A1  Oct. 10, 2019

Related U.S. Application Data

(60) Provisional application No. 62/654,869, filed on Apr. 9, 2018, provisional application No. 62/801,408, filed (Continued)

(51) Int. Cl.
*H01L 23/15* (2006.01)
*H01L 23/48* (2006.01)
(Continued)

(52) U.S. Cl.
CPC .......... *H01L 23/49827* (2013.01); *C03C 3/06* (2013.01); *C03C 15/00* (2013.01);
(Continued)

(58) Field of Classification Search
None
See application file for complete search history.

(56) References Cited

U.S. PATENT DOCUMENTS

| 208,387 A | 9/1878 | Geoege |
| 237,571 A | 2/1881 | Messier |

(Continued)

FOREIGN PATENT DOCUMENTS

| CN | 100494879 C | 6/2009 |
| CN | 104768320 A | 7/2015 |

(Continued)

OTHER PUBLICATIONS

Machine Translation of JP-2007059796-A, Sep. 2007 (Year: 2007).*
(Continued)

*Primary Examiner* — Jeffrey A Vonch
(74) *Attorney, Agent, or Firm* — Amy T. Lang; John P. McGroarty

(57) ABSTRACT

An article includes a glass or glass-ceramic substrate having a first major surface and a second major surface opposite the first major surface, and at least one via extending through the substrate from the first major surface to the second major surface over an axial length in an axial dimension. The article also includes a metal connector disposed within the via that hermetically seals the via. The article has a helium hermeticity of less than or equal to $1.0 \times 10^{-8}$ atm-cc/s after 1000 thermal shock cycles, each of the thermal shock cycle comprises cooling the article to a temperature of −40° C. and heating the article to a temperature of 125° C., and the article has a helium hermeticity of less than or equal to $1.0 \times 10^{-8}$
(Continued)

atm-cc/s after 100 hours of HAST at a temperature of 130° C. and a relative humidity of 85%.

18 Claims, 26 Drawing Sheets

Related U.S. Application Data on Feb. 5, 2019, provisional application No. 62/808,566, filed on Feb. 21, 2019.

(51) Int. Cl.

| | |
|---|---|
| *H01L 23/492* | (2006.01) |
| *H01L 23/498* | (2006.01) |
| *H05K 1/02* | (2006.01) |
| *H05K 1/03* | (2006.01) |
| *H05K 1/11* | (2006.01) |
| *C03C 15/00* | (2006.01) |
| *C23C 18/38* | (2006.01) |
| *H01L 21/768* | (2006.01) |
| *H05K 3/38* | (2006.01) |
| *C23C 14/18* | (2006.01) |
| *C23C 28/02* | (2006.01) |
| *C03C 17/06* | (2006.01) |
| *C03C 3/06* | (2006.01) |
| *C03C 23/00* | (2006.01) |
| *C03C 17/00* | (2006.01) |
| *H05K 3/42* | (2006.01) |
| *C25D 7/12* | (2006.01) |
| *C03C 3/076* | (2006.01) |
| *H01L 21/48* | (2006.01) |
| *H01L 23/00* | (2006.01) |
| *H05K 3/00* | (2006.01) |

(52) U.S. Cl.
CPC .......... *C03C 17/06* (2013.01); *C03C 23/0025* (2013.01); *C23C 14/18* (2013.01); *C23C 18/38* (2013.01); *C23C 28/02* (2013.01); *H01L 21/76877* (2013.01); *H01L 23/15* (2013.01); *H01L 23/481* (2013.01); *H01L 23/49838* (2013.01); *H05K 1/0271* (2013.01); *H05K 1/0306* (2013.01); *H05K 1/115* (2013.01); *H05K 3/388* (2013.01); *C03C 3/076* (2013.01); *C25D 7/123* (2013.01); *H01L 21/486* (2013.01); *H01L 23/4924* (2013.01); *H01L 23/49866* (2013.01); *H01L 23/564* (2013.01); *H05K 3/002* (2013.01); *H05K 3/0029* (2013.01); *H05K 3/0055* (2013.01); *H05K 3/423* (2013.01); *H05K 3/425* (2013.01); *H05K 3/428* (2013.01); *H05K 2201/068* (2013.01); *H05K 2201/0989* (2013.01); *H05K 2201/09545* (2013.01); *H05K 2201/09563* (2013.01); *H05K 2201/09609* (2013.01); *H05K 2201/09827* (2013.01); *H05K 2201/09854* (2013.01); *H05K 2201/10378* (2013.01); *H05K 2203/1194* (2013.01); *H05K 2203/1361* (2013.01); *H05K 2203/143* (2013.01); *H05K 2203/1438* (2013.01); *H05K 2203/162* (2013.01); *Y10T 428/24273* (2015.01); *Y10T 428/24479* (2015.01); *Y10T 428/24851* (2015.01); *Y10T 428/24917* (2015.01); *Y10T 428/24926* (2015.01)

(56) References Cited

U.S. PATENT DOCUMENTS

| | | |
|---|---|---|
| 3,798,013 A | 3/1974 | Hasegawa et al. |
| 4,214,886 A | 7/1980 | Shay et al. |
| 4,395,271 A | 7/1983 | Beall et al. |
| 4,776,869 A | 10/1988 | Offenbacher et al. |
| 5,166,037 A | 11/1992 | Atkinson et al. |
| 5,340,947 A | 8/1994 | Credle et al. |
| 5,745,236 A | 4/1998 | Haga |
| 5,746,884 A | 5/1998 | Gupta et al. |
| 5,909,284 A | 6/1999 | Nakamura |
| 5,933,230 A | 8/1999 | Imaino et al. |
| 5,969,422 A | 10/1999 | Ting et al. |
| 6,072,624 A | 6/2000 | Dixon et al. |
| 6,077,780 A | 6/2000 | Dubin |
| 6,234,755 B1 | 5/2001 | Bunker et al. |
| 6,344,242 B1 | 2/2002 | Stolk et al. |
| 6,406,777 B1 | 6/2002 | Boss et al. |
| 6,734,101 B1 | 5/2004 | Bao et al. |
| 6,906,795 B2 | 6/2005 | Goto et al. |
| 6,951,816 B2 | 10/2005 | Nopper et al. |
| 7,019,257 B2 | 3/2006 | Stevens |
| 7,043,072 B2 | 5/2006 | Goto et al. |
| 7,211,899 B2 | 5/2007 | Taniguchi et al. |
| 7,407,889 B2 | 8/2008 | Tsunetomo et al. |
| 7,514,149 B2 | 4/2009 | Bocko et al. |
| 7,528,967 B2 | 5/2009 | Okawauchi et al. |
| 7,626,665 B2 | 12/2009 | Koike |
| 7,683,370 B2 | 3/2010 | Kugimiya et al. |
| 7,749,809 B2 | 7/2010 | How et al. |
| 7,894,870 B1* | 2/2011 | Lucisano ............. A61B 5/1473 600/345 |
| 7,994,503 B2 | 8/2011 | Hino et al. |
| 8,119,462 B2 | 2/2012 | Takasawa et al. |
| 8,163,649 B2 | 4/2012 | Koike et al. |
| 8,187,716 B2 | 5/2012 | Sutter et al. |
| 8,338,957 B2 | 12/2012 | Nilsson |
| 8,354,337 B2 | 1/2013 | Matsumoto et al. |
| 8,384,083 B2 | 2/2013 | Mori et al. |
| 8,411,459 B2 | 4/2013 | Yu et al. |
| 8,482,189 B2 | 7/2013 | Goto et al. |
| 8,531,679 B2 | 9/2013 | Scheiner |
| 8,535,997 B2 | 9/2013 | Kawakami et al. |
| 8,569,165 B2 | 10/2013 | Gordon et al. |
| 8,643,129 B2 | 2/2014 | Laming et al. |
| 8,673,779 B1 | 3/2014 | Yoon et al. |
| 8,699,037 B2 | 4/2014 | Cox |
| 8,742,588 B2 | 6/2014 | Nilsson et al. |
| 8,836,126 B2 | 9/2014 | Ochimizu et al. |
| 8,871,641 B2 | 10/2014 | Nilsson |
| 8,873,067 B2 | 10/2014 | Lee et al. |
| 9,024,443 B2 | 5/2015 | Inaba et al. |
| 9,093,381 B2 | 7/2015 | Barriere et al. |
| 9,140,539 B2 | 9/2015 | Scheiner |
| 9,232,652 B2 | 1/2016 | Fushie et al. |
| 9,236,274 B1* | 1/2016 | Mobley ................. C03B 25/025 |
| 9,278,886 B2 | 3/2016 | Boek et al. |
| 9,296,646 B2 | 3/2016 | Burket et al. |
| 9,305,470 B2 | 4/2016 | Miki et al. |
| 9,337,060 B1* | 5/2016 | Mobley ................. H05K 3/4038 |
| 9,346,706 B2 | 5/2016 | Bazemore et al. |
| 9,374,892 B1* | 6/2016 | Mobley ............. H01L 23/49883 |
| 9,377,583 B2 | 6/2016 | Giaretta et al. |
| 9,517,963 B2 | 12/2016 | Marjanovic et al. |
| 9,656,909 B2 | 5/2017 | Burket et al. |
| 9,676,046 B2 | 6/2017 | Hamada et al. |
| 9,745,220 B2 | 8/2017 | Burket et al. |
| 9,760,986 B2 | 9/2017 | Ramamurthy et al. |
| 9,850,160 B2 | 12/2017 | Marjanovic et al. |
| 10,144,093 B2 | 12/2018 | Marjanovic et al. |
| 10,203,476 B2 | 2/2019 | Cui |
| 10,410,883 B2 | 9/2019 | Bellman et al. |
| 10,440,835 B1 | 10/2019 | Grober |
| 10,454,571 B2 | 10/2019 | Gutman et al. |
| 2002/0004301 A1 | 1/2002 | Chen et al. |
| 2002/0051563 A1 | 5/2002 | Goto et al. |
| 2002/0180015 A1 | 12/2002 | Yamaguchi et al. |

(56) References Cited

U.S. PATENT DOCUMENTS

| | | |
|---|---|---|
| 2003/0082356 A1* | 5/2003 | Suemasu ............... H01L 21/288 428/209 |
| 2003/0137056 A1 | 7/2003 | Taniguchi et al. |
| 2003/0206651 A1 | 11/2003 | Goto et al. |
| 2003/0221967 A1 | 12/2003 | Tsuchida et al. |
| 2004/0058476 A1 | 3/2004 | Enquist et al. |
| 2004/0094524 A1 | 5/2004 | Stevens |
| 2004/0166340 A1 | 8/2004 | Cairns et al. |
| 2004/0203181 A1 | 10/2004 | Shang et al. |
| 2004/0235294 A1 | 11/2004 | Imori et al. |
| 2004/0256619 A1 | 12/2004 | Nomura et al. |
| 2005/0029238 A1 | 2/2005 | Chen |
| 2005/0033184 A1 | 2/2005 | Christoph |
| 2005/0064707 A1 | 3/2005 | Sinha |
| 2005/0067295 A1* | 3/2005 | Dory ................. H01L 21/76877 205/184 |
| 2005/0079650 A1 | 4/2005 | Mancini et al. |
| 2005/0266320 A1 | 12/2005 | Amemiya |
| 2006/0012766 A1 | 1/2006 | Klosner et al. |
| 2006/0093732 A1 | 5/2006 | Schut et al. |
| 2006/0192978 A1 | 8/2006 | Laguarta et al. |
| 2006/0233963 A1 | 10/2006 | Imori et al. |
| 2006/0283629 A1 | 12/2006 | Kikuchi et al. |
| 2007/0187142 A1* | 8/2007 | Suemasu ............... H01L 23/481 174/262 |
| 2008/0296768 A1 | 1/2008 | Fok et al. |
| 2008/0054467 A1 | 3/2008 | Ohba et al. |
| 2008/0067073 A1* | 3/2008 | Kagawa ................ H01L 21/486 205/125 |
| 2008/0087549 A1 | 4/2008 | Ishizuka et al. |
| 2008/0150138 A1 | 6/2008 | Bright et al. |
| 2009/0029189 A1 | 1/2009 | Moriwaki et al. |
| 2009/0032510 A1 | 2/2009 | Ando et al. |
| 2009/0263965 A1 | 10/2009 | Gordon et al. |
| 2009/0283910 A1 | 11/2009 | Hinomura |
| 2010/0096712 A1* | 4/2010 | Knechtel ................ B81B 7/007 257/415 |
| 2010/0133697 A1* | 6/2010 | Nilsson ................ H05K 3/4076 257/774 |
| 2010/0284027 A1 | 11/2010 | Scheiner |
| 2010/0320604 A1 | 12/2010 | Isobayashi |
| 2011/0032467 A1 | 2/2011 | Koike |
| 2011/0049718 A1 | 3/2011 | Matsumoto et al. |
| 2011/0132883 A1 | 6/2011 | Sheng et al. |
| 2011/0147055 A1* | 6/2011 | Ma ..................... H01L 21/4803 174/255 |
| 2011/0294649 A1 | 12/2011 | Gomez et al. |
| 2011/0308942 A1 | 12/2011 | Liu et al. |
| 2012/0013022 A1 | 1/2012 | Sabuncuoglu Tezcan et al. |
| 2012/0048604 A1 | 3/2012 | Cornejo et al. |
| 2012/0092681 A1 | 4/2012 | Cox |
| 2012/0121870 A1 | 5/2012 | Toury et al. |
| 2012/0125892 A1 | 5/2012 | Shimoi et al. |
| 2012/0125893 A1 | 5/2012 | Shimoi et al. |
| 2012/0133047 A1* | 5/2012 | Besling ................ H01L 23/481 257/774 |
| 2012/0139127 A1 | 6/2012 | Beyne |
| 2012/0152843 A1 | 6/2012 | McEvoy et al. |
| 2012/0168412 A1 | 7/2012 | Hooper |
| 2012/0217165 A1 | 8/2012 | Feng et al. |
| 2012/0235969 A1* | 9/2012 | Burns .................... H05K 3/42 345/211 |
| 2012/0241919 A1 | 9/2012 | Mitani |
| 2012/0276743 A1 | 11/2012 | Won et al. |
| 2013/0026645 A1* | 1/2013 | Mohammed ........ H01L 23/5329 257/774 |
| 2013/0050226 A1* | 2/2013 | Shenoy ................. B81B 7/007 345/501 |
| 2013/0062210 A1* | 3/2013 | Fushie .................. H05K 3/423 205/103 |
| 2013/0075146 A1* | 3/2013 | Fushie .................. H05K 3/423 174/262 |
| 2013/0089701 A1* | 4/2013 | Hooper ............... B23K 26/382 428/131 |
| 2013/0105213 A1 | 5/2013 | Hu et al. |
| 2013/0119555 A1* | 5/2013 | Sundaram ......... H01L 21/76843 257/774 |
| 2013/0163801 A1 | 6/2013 | Ha et al. |
| 2013/0205835 A1 | 8/2013 | Giaretta et al. |
| 2013/0224492 A1 | 8/2013 | Bookbinder et al. |
| 2013/0228918 A1 | 9/2013 | Chen et al. |
| 2013/0247615 A1 | 9/2013 | Boek et al. |
| 2013/0249109 A1* | 9/2013 | Ma ....................... H01L 23/481 257/774 |
| 2013/0286610 A1* | 10/2013 | Nakagawa ............. H05K 3/426 361/760 |
| 2013/0330515 A1 | 12/2013 | Oh et al. |
| 2013/0337599 A1 | 12/2013 | Yun |
| 2013/0340480 A1* | 12/2013 | Nattermann .......... C03B 25/025 65/112 |
| 2014/0034374 A1 | 2/2014 | Cornejo et al. |
| 2014/0084466 A1 | 3/2014 | Matsumoto et al. |
| 2014/0127899 A1 | 5/2014 | Cabral, Jr. et al. |
| 2014/0144681 A1* | 5/2014 | Pushparaj ............... C23C 28/34 174/257 |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0166199 A1 | 6/2014 | Bellman et al. |
| 2014/0170378 A1 | 6/2014 | Bellman et al. |
| 2014/0186617 A1 | 7/2014 | Zhang et al. |
| 2014/0199519 A1 | 7/2014 | Schillinger et al. |
| 2014/0254004 A1 | 9/2014 | Wooder et al. |
| 2014/0262801 A1 | 9/2014 | Jayaraju et al. |
| 2014/0300728 A1 | 10/2014 | Drescher et al. |
| 2014/0363971 A1 | 12/2014 | Matsumoto |
| 2014/0376006 A1 | 12/2014 | Scheiner |
| 2015/0021775 A1 | 1/2015 | Matsumoto et al. |
| 2015/0036065 A1 | 2/2015 | Yousefpor et al. |
| 2015/0060402 A1* | 3/2015 | Burkett .................. C03C 15/00 216/41 |
| 2015/0076677 A1* | 3/2015 | Ebefors ............. H01L 23/49838 257/676 |
| 2015/0083469 A1* | 3/2015 | Sunohara ............... H01L 23/481 174/255 |
| 2015/0102498 A1 | 4/2015 | Enicks et al. |
| 2015/0166393 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0274583 A1 | 10/2015 | An et al. |
| 2015/0306847 A1 | 10/2015 | Bellman et al. |
| 2015/0329415 A1 | 11/2015 | Bellman et al. |
| 2015/0353348 A1 | 12/2015 | Vandemeer et al. |
| 2016/0026842 A1 | 1/2016 | Withers et al. |
| 2016/0107925 A1 | 4/2016 | Burket et al. |
| 2016/0111380 A1 | 4/2016 | Sundaram et al. |
| 2016/0166395 A9 | 6/2016 | Weiman |
| 2016/0176751 A1* | 6/2016 | Lautenschlaeger ....... C03C 4/00 428/34.4 |
| 2016/0199944 A1 | 7/2016 | Hosseini |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1* | 7/2016 | Vandemeer ....... H01L 21/76898 |
| 2016/0237571 A1 | 8/2016 | Liu et al. |
| 2016/0282584 A1 | 9/2016 | Cui |
| 2016/0305764 A1 | 10/2016 | Cui et al. |
| 2016/0312365 A1 | 10/2016 | Cordonier et al. |
| 2016/0327744 A1 | 11/2016 | Giaretta et al. |
| 2016/0334203 A1 | 11/2016 | Cui et al. |
| 2016/0351410 A1 | 12/2016 | Fu et al. |
| 2016/0368100 A1 | 12/2016 | Marjanovic et al. |
| 2017/0008122 A1 | 1/2017 | Wieland et al. |
| 2017/0036419 A1 | 2/2017 | Adib et al. |
| 2017/0160077 A1 | 6/2017 | Featherstone et al. |
| 2017/0207160 A1* | 7/2017 | Gowda .................. H01L 25/16 |
| 2017/0228884 A1 | 8/2017 | Yoshida |
| 2017/0229318 A1 | 8/2017 | Tsunetomo et al. |
| 2017/0252859 A1 | 9/2017 | Kumkar et al. |
| 2017/0276951 A1 | 9/2017 | Kumkar et al. |
| 2017/0287728 A1 | 10/2017 | Dahlberg et al. |
| 2017/0301585 A1* | 10/2017 | Koelling ................. B22F 3/093 |

(56) References Cited

U.S. PATENT DOCUMENTS

| | | | |
|---|---|---|---|
| 2017/0363417 | A1 | 12/2017 | Cui et al. |
| 2018/0057390 | A1 | 3/2018 | Hackert et al. |
| 2018/0062342 | A1 | 3/2018 | Comstock et al. |
| 2018/0068868 | A1 | 3/2018 | Jaramillo et al. |
| 2018/0093914 | A1 | 4/2018 | Akarapu et al. |
| 2018/0215647 | A1 | 8/2018 | Ortner et al. |
| 2018/0249581 | A1* | 8/2018 | Mamezaki .......... H05K 3/0094 |
| 2018/0340262 | A1* | 11/2018 | Hiranuma .......... C03C 23/0025 |
| 2018/0342450 | A1 | 11/2018 | Huang et al. |
| 2018/0342451 | A1* | 11/2018 | Dahlberg .......... H01L 23/49827 |
| 2019/0239353 | A1* | 8/2019 | Jayaraman ........ H01L 23/49827 |
| 2019/0269013 | A1 | 8/2019 | Takagi et al. |
| 2019/0273038 | A1* | 9/2019 | Nagano ............. H01L 23/49822 |
| 2019/0304877 | A1* | 10/2019 | Mobley .................... C03C 8/18 |
| 2019/0327840 | A1* | 10/2019 | Bookbinder .......... H05K 3/422 |
| 2020/0227277 | A1* | 7/2020 | Brown ................ C03C 17/3607 |
| 2021/0043464 | A1* | 2/2021 | Nolet ................ H01L 23/49827 |

FOREIGN PATENT DOCUMENTS

| | | | | |
|---|---|---|---|---|
| CN | 104897062 | A | | 9/2015 |
| CN | 105448809 | A | | 3/2016 |
| EP | 0247993 | A1 | | 12/1987 |
| EP | 280918 | A2 | | 9/1988 |
| EP | 2095698 | B1 | * | 9/2011 ....... H01L 21/76898 |
| EP | 3166372 | A1 | | 5/2017 |
| JP | 2001044197 | A | * | 2/2001 |
| JP | 2002134659 | A | * | 5/2002 |
| JP | 2003-148931 | A | | 5/2003 |
| JP | 2004-311919 | A | | 11/2004 |
| JP | 2004-363212 | A | | 12/2004 |
| JP | 2005-257339 | A | | 9/2005 |
| JP | 2006287019 | A | * | 10/2006 |
| JP | 2007059796 | A | * | 3/2007 |
| JP | 2008-288577 | A | | 11/2008 |
| JP | 2010-074017 | A | | 4/2010 |
| JP | 2011-171334 | A | | 9/2011 |
| JP | 2011-178642 | A | | 9/2011 |
| JP | 2013106015 | A | * | 5/2013 |
| JP | 2013-220958 | A | | 10/2013 |
| JP | 2014093406 | A | | 5/2014 |
| JP | 2014093406 | A | * | 5/2014 |
| JP | 2015-060981 | A | | 3/2015 |
| JP | 2015082598 | A | * | 4/2015 |
| JP | 2015095590 | A | * | 5/2015 |
| JP | 2015-146410 | A | | 8/2015 |
| JP | 2016213253 | A | * | 12/2016 |
| JP | 2017022220 | A | * | 1/2017 |
| JP | 2017204527 | A | * | 11/2017 |
| JP | 2018113392 | A | * | 7/2018 |
| JP | 2018163986 | A | * | 10/2018 ....... H01L 21/76898 |
| KR | 10-0803004 | B1 | | 2/2008 |
| KR | 20190003050 | A | * | 1/2019 ............. H01L 23/32 |
| WO | 9400966 | A1 | | 1/1994 |
| WO | 03/21004 | A1 | | 3/2003 |
| WO | 2004024191 | A2 | | 3/2004 |
| WO | 2005/063645 | A1 | | 7/2005 |
| WO | 2008/110061 | A1 | | 9/2008 |
| WO | 2011/050073 | A1 | | 4/2011 |
| WO | 2012/027220 | A2 | | 3/2012 |
| WO | 2015/113023 | A1 | | 7/2015 |
| WO | 2015/157202 | A1 | | 10/2015 |
| WO | 2016/010954 | A2 | | 1/2016 |
| WO | 2016/089844 | A1 | | 6/2016 |
| WO | 2016118683 | A1 | | 7/2016 |
| WO | WO-2016114133 | A1 | * | 7/2016 ............. H01L 23/32 |
| WO | 2016/176171 | A1 | | 11/2016 |
| WO | 2017/038075 | A1 | | 3/2017 |
| WO | 2017/062798 | A1 | | 4/2017 |
| WO | 2017/210376 | A1 | | 12/2017 |
| WO | 2018/101468 | A1 | | 6/2018 |
| WO | 2018/162385 | A1 | | 9/2018 |
| WO | 2019055745 | A1 | | 3/2019 |

OTHER PUBLICATIONS

Machine Translation of EP-2095698-B1, Mar. 2011 (Year: 2011).*

Machine Translation of JP-2018163986-A, Oct. 2018 (Year: 2018).*

Choa, Microsystem Technologies, Reliability study of hermetic wafer level MEMS packaging with through-wafer interconnect, Feb. 2009, vol. 15, pp. 677-686 (Year: 2009).*

Lueck et al., Through glass vias (TGV) and aspects of reliability, 2015, 2015 IEEE 65th Electronic Components and Technology Conference (ECTC), pp. 672-677 (Year: 2015).*

Demir et al., Reliability of Copper Through-Package Vias in Bare Glass Interposers, Jun. 2017, IEEE Transactions on Components, Packaging and Manufacturing Technology, vol. 7, No. 6, pp. 829-837 (Year: 2017).*

Anthony et al., Microfabrication in Foturan Photosensitive Glass Using Focused Ion Beam, Jan. 2007, Proceedings of the World Congress on Engineering (Year: 2007).*

Schott, Schott HermeS®—Hermetic Through Glass Vias (TGV), Jul. 2016 (Year: 2016).*

TJ Green Associates, "Hermetic vs "Near Hermetic" Packaging: A Technical Review", Sep. 2016, <https://www.tjgreenllc.com/2016/09/21/hermetic-vs-near-hermetic-packaging-a-technical-review/> (Year: 2016).*

Department of Defense, MIL-STD-750E, Nov. 2006 (Year: 2006).*

ESPEC Corp., The Concept Of Relative Humidity In HAST, Feb. 2013, <https://www.test-navi.com/eng/research/handbook/pdf/07_TheConceptOfRelativeHumidityInHAST.pdf> (Year: 2013).*

University of Maryland, Temperature Humidity Bias, Jun. 2008, <https://calce.umd.edu/temperature-humidity-bias> (Year: 2008).*

Schott, "MEMS Tightly Sealed with Schott HermeS™", Jan. 2010, Tech Buzz: Electronic Packaging, Issue 2, <https://www.schott.com/d/epackaging/8e070fc9-4009-40c2-bca7-323542ee3a15/1.4/schott_tech_buzz_jan_2010.pdf> (Year: 2010).*

Li et al., Fabrication of high-density electrical feed-throughs by deep-reactive-ion etching of Pyrex glass, Dec. 2002, Journal of Microelectromechanical Systems, vol. 11, Issue 6, pp. 625-630 (Year: 2002).*

Töpper et al., 3-D Thin Film Interposer Based on TGV (Through Glass Vias): An Alternative to Si-Interposer, Jun. 2010, 2010 Proceedings 60th Electronic Components and Technology Conference (ECTC) (Year: 2010).*

Sukumaran et al., Low-Cost Thin Glass Interposers as a Superior Alternative to Silicon and Organic Interposers for Packaging of 3-D ICs, Sep. 2012, IEEE Transactions on Components, Packaging and Manufacturing Technology, vol. 2, Issue 9, pp. 1426-1433 (Year: 2012).*

Liu et al., Failure analysis of through-silicon vias in free-standing wafer under thermal-shock test, Jan. 2013, Microelectronics Reliability, vol. 53, Issue 1, pp. 70-78 (Year: 2013).*

Takahashi et al., Development of Through Glass Via (TGV) formation technology using electrical discharging for 2.5/3D integrated packaging, May 2013, 2013 IEEE 63rd Electronic Components and Technology Conference (Year: 2013).*

Lee et al., Through-glass copper via using the glass reflow and seedless electroplating processes for wafer-level RF MEMS packaging, Jun. 2013, Journal of Micromechanics and Microengineering, vol. 23, No. 8 (Year: 2013).*

Mobley et al., High-reliability via interconnections in glass wafers for 2.5D packaging, Oct. 2014, Chip Scale Review, vol. 18, No. 5, pp. 36-38 (Year: 2014).*

Bush, Glass seals MEMS for harsh environments, Nov. 2014, Electronics Weekly, <https://www.electronicsweekly.com/news/business/manufacturing/glass-seals-mems-harsh-environments-2014-11/> (Year: 2014).*

Shorey et al., Advancements in fabrication of glass interposers, May 2014, 2014 IEEE 64th Electronic Components and Technology Conference (ECTC) (Year: 2014).*

Fu et al., Adhesive enabling technology for directly plating copper onto glass/ceramic substrates, May 2014, 2014 IEEE 64th Electronic Components and Technology Conference (ECTC) (Year: 2014).*

(56) References Cited

OTHER PUBLICATIONS

Ogutu et al., Superconformal Filling of Through Vias in Glass Interposers, Jun. 2014, ECS Electrochemistry Letters, vol. 3, No. 8 (Year: 2014).*

Keusseyan et al., Material and Process Developments for Robust and High Reliability Glass Wafers for 2.5D Packaging, Jan. 2015, Additional Conferences (Device Packaging, HiTEC, HiTEN, and CICMT) 2015 (Year: 2015).*

Takahashi, TGV and Integrated Electronics, Jan. 2015, European 3D TSV Summit (Year: 2015).*

Sprengard et al., Ultra-thin glasses for semiconductor packaging, Oct. 2016, International Symposium on Microelectronics (Year: 2016).*

Woehrmann et al., Glass based interposers for RF applications up to 100GHz, Sep. 2016, 2016 6th Electronic System-Integration Technology Conference (ESTC) (Year: 2016).*

Takahashi et al., Development of High Frequency Device Using Glass or Fused Silica with 3D Integration, Jun. 2017, 2017 IEEE 67th Electronic Components and Technology Conference (ECTC) (Year: 2017).*

Kuramochi et al., Glass Substrate with TGV(Thru Glass Via) Manufacturing Technology for Display Electronics, Jun. 2017, Society for Information Display Digest of Technical Papers, vol. 48, Issue 1, pp. 1201-1204 (Year: 2017).*

Shah et al., Low-Loss, High-Linearity RF Interposers Enabled by Through Glass Vias, Nov. 2018, IEEE Microwave and Wireless Components Letters, vol. 28, Issue 11, pp. 960-962 (Year: 2018).*

Chang et al., Communication—Defect-Free Filling of High Aspect Ratio Through Vias in Ultrathin Glass, Nov. 2018, Journal of Electrochemical Society, vol. 166, No. 1 (Year: 2018).*

Kröhnert et al., Through Glass Vias for hermetically sealed High Frequency Application, Jan. 2019, Additional Conferences (Device Packaging, HiTEC, HiTEN, and CICMT) 2019 (Year: 2019).*

Allvia; "Allvia Launches New Product Lines for Through Glass Vias (TGV) and Through Quartz Vias (TQV)"; 2 Pages; https://www.allvia.com/news/1606_allvia_launches_new_product_lines_for_through_glass_vias_and_through_quartz_vias.html; retrieved on Sep. 30, 2019.

Bain et al; "Formation of Monolayers by the Coadsorption of Thiols on Gold: Variation in the Head Group, Tail Group, and Solvent" ; Journal of the American Chemical Society; 111 pp. 7155-7164 (1989.

Cui et al; "The Evolution of Pd/Sn Catalytic Surfaces in Electroles Copper Deposition" Journal of the Electrochemical Society; 158, (3), pp. D172-D177 (2011.

Demir et al; "First Demonstration of Reliable Copper-Plated 30m Diameter Through-Package-Vias in Ultra-Thin Bare Glass Interposers" 2014 IEEE 64th Electronic Components and Technology Conference (ECTC.

Dixit et al; "Structural and Electronic Properties of a Mn Oxide Diffusion Barrier Layer Formed by Chemical Vapor Deposition"; IEEE Transactions on Device and Materials Reliability, vol. 11, No. 2; pp. 295-302 (2011.

Dow et al; "Through-Hole Filling by Copper Electroplating"; Journal of the Electrochemical Society, 155 (12) D750-D757, (2008.

Gordon et al; "Chemical Vapor Deposition (CVD) of Manganese Self-Aligned Diffusion Barries for Cu Interconnections in Microelectronics"; Advanced Metallization Conference 2008; pp. 321-329 (2009.

Hunegnaw et al; Vitrocoat GI—Ultra-Thin Adhesive Layer for Metallization of Glass Interposer: 2015 10th International Microsystems, Packaging, Assembly, and Circuits Technology Conference (Impact) 4 Pages.

Intergrace, "Borosilicate Glass: Technical Glass By Pulles & Hanique: Duan & Pyrex," Pulles & Hanique B.V., 2 Pgs. Published Mar. 15, 2012, Retrieved From: https://web.archive.org/web/20120315092729/http://www.pulleshanique.com/02_borosilicate-glass.htm.

Kanemoto et al; "Electroless Copper Plating Process by Applying Alternating One-Side Air Stirring Method for High-Aspect-Ratio Through-Holes"; J. Electrochem. Soc. 2017 vol. 164, Issue 12, D771-D777.

Liu et al; "Electroless and Electrolytic Copper Plating of Glass Interposer Combined With Metal Oxide Adhesion Layer for Manufacturing 3D RF Devices" ; IEEE 66th Electronic Components and Technology Conference; pp. 62-67 (2016).

U.S. Appl. No. 16/578,751 titled; "Methods for Increasing Adhesion Between Metallic Films and Glass Surfaces and Articles Made Therefrom", Bookbinder et al, filed Sep. 23, 2019. 37 pgs.

Takahashi et al; "Development of High Frequency Device Using Glass or Fused Silica With 3D Integration" ; 67th Electornic Componsents and Technology Conference; IEEE; pp. 758-763 (2017.

Sukumaran; "Through-Package-Via Hole Formation, Metallization and Characterization for Ultra-Thin 3D Glass" 2014; Georgia Institute of Technology, A Dissertation; 201 Pages.

Shorey et al; "Progress and Application of Through Glass Via (TGV) Technolgy", Corning Incorporated; 6 Pages (2016).

Metwalli et al; "Surface Characterization of Mono-, Di-, and Tri-Aminosiline Treated Glass Surface" ; Journal of Colloid and Interface Science, 298 (2006) pp. 825-831.

Neishi et al; "Formation of a Manganese Oxide Barrier Layer With Thermal Chemical Vapor Deposition for Advanced Large-Scale Integrated Interconnect Structure" ; Appl. Phys. Lett.; 93; pp. 032106-1-032106-3 (2008).

Ogutu et al; "Hybrid Method for Metallization of Glass Interposer"; Journal of the Electrochemical Society; vol. 160; No. 12; pp. D3228-D3236 (2013).

Pallavicini et al; "Self-Assembled Monolayers of Silver Nanoparticles Firmly Grafted on Glass Surfaces: Low Ag+ Release for an Efficient Antibacterial Activity"; Journal of Colloid and Interface Science; 350 (2010) 110-116.

Phuong et al; "Structural Characterization of a Manganese Oxide Barrier Layer Formed by Chemical Vapor Deposition for Advanced Interconnects Application on SiOC Dielectric Substrates" ; J. Phys. Chem. C; 117; pp. 160-164 (2013).

Shachman-Diamond et al; "30 Years of Electroless Plating for Semiconductor and Polymer Mirco-Systems" ; Microelectronic Engineering; 132 (2015) pp. 35-45.

Shen et al; "Periodic Pulse Reverse Cu Plating for Through-Hole Filling" ECS Electrochem. Lett. 2013 vol. 2, Issue 5, D23-D25, 2013.

Shorey et al; "Advancements in Fabrication of Glass Interposers"; 2014 Electronic Components & Technology Conference; IEEE; pp. 20-25 (2014).

Ryu et al; "Impact of Near-Surface Thermal Stresses on Interfacial Reliability of Throughsilicon Vias for 3-D Interconnects"; IEEE Transactions on Device and Materials Reliability; 2011 vol. 11, No. 1; pp. 35-43.

Lu et al, "Thermo-Mechanical Reliability of 3-D ICs Containing Through Silicon Vias," Electronics Components and Technology Conference, 2009.

Ogutu et. al., "Superconformal Filling of High Aspect Ratio through Glass Vias (TGV) for Interposer Applications Using TNBT and NTBC Additives", J Echem Soc 162 (9) 2015, D457-D464, doi:10.1149/2.0641509jes.

Demir et al, "Reliability of Copper Through-Package Vias in Bare Glass interposers," IEEE Trans. Components, Packaging and Manufacturing Tech. 7(6) Jun. 2017, pp. 829-837.

Invitation to Pay Additional Fees of the European International Searching Authority; PCT/US2019/026342 dated Jul. 16, 2019, 14 Pgs.

Benjamin et al; "The Adhesion of Evaporated Metal Films on Glass"; Proc. Roy. Soc. A., vol. 261, (1962); pp. 516-531.

Borghi et al; "M2 Factor of Bessel-Gauss Beams"; Optics Letters; vol. 22, No. 5; (1997) pp. 262-264.

Chen et al. "Development of an AOI system for chips with a hole on backside based on a frame imager" Proc. of SPIE vol. 9903, 2016. 6 pgs.

Dow et al; "Through-Hole Filling by Copper Electroplating"; Journal of the Electrochemical Society, 155 (12) 0750-0757, (2008).

(56) References Cited

OTHER PUBLICATIONS

Gordon et al. "Chemical Vapor Deposition {CVD) of Manganese Self-Aligned Diffusion Barriers for Cu Interconnections in Microelectronics," Advanced Metallization Conference, 2008-2009, 9 pgs.
International Search Report and Written Opinion of the International Searching Authority; PCT/US19/026342; dated Oct. 22, 2019; 20 Pages; European Patent Office.
Invitation to Pay Additional Fees of the International Searching Authority; PCT/US2019/026342; dated Jul. 16, 2019; 14 Pages; European Patent Office.
Invitation to Pay Additional Fees of the International Searching Authority; PCT/US2019/057757; dated Mar. 2, 2020; 12 Pages; European Patent Office.
Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.
Koike et al; "P-33: Cu—Mn Electrodes for a-Si TFT and Its Electrical Characteristics"; SID Symposium Digest of Technical Papers, 41:1, 1343-1346 (2010).
Koike et al; "Self-Forming Diffusion Barrier Layer in Cu—Mn Alloy Metallization"; Appl Phys. Lett. 87, 041911-1-041911-3 (2005).
Microchemicals, "Silicon Wafers, Quartz Wafers, Glass Wafers," Product Specifications: Brochure. 2014, 28 pgs.
Shorey; "Leveraging Glass for Advanced Packaging and IoT"; Apr. 21, 2016, Retrieved Form the Internet: URL:http://www.corning.com/media/worldwide/cdt/documents/iMAPs%20-%20Corning%200verview%20-%204-21-16%20FINALpptx.pdf.
Siegman; "New Development in Laser Resonators"; SPIE, vol. 1227, Optical Resonators (1990) pp. 2-14.
Thiele; "Relation Between Catalytic Activity and Size of Particle"; Industrial and Engineering Chemistry, vol. 31, No. 7; (1939) pp. 916-920.
Topper et al; "3-D Thin Film Interposer Based on TGV (Through Glass Vias): an Alternative to Si-Interposer"; IEEE, Electronic Components and Technology Conference; 2010; pp. 66-73.
U.S. Appl. No. 62/846,059; Cai et al. "Silicate Glass Compositions Useful for the Efficient Production of Through Glass Vias", filed May 10, 2019, 43 pgs.
U.S. Appl. No. 62/846,102; Guo et al. "High Silicate Glass Articles Possessing Through Glass Vias and Methods of Making and Using Thereof", filed May 10, 2019,36 pgs.
Wakayama et al. "Small size probe for inner profile measurement of pipes using optical fiber ring beam device" Proc. of SPIE vol. 8563, 2012. 7 pgs.
Wu et al, "A Study on Annealing Mechanisms With Different Manganese Contents in CuMn Alloy"; Journal of Alloys and Compounds, vol. 542, 2012, pp. 118-123.
Yun et al; "P-23:The Contact Properties and TFT Structures of a-IGZO TFTS Combined With Cu—Mn Alloy Electrodes"; SID Symposium Digest of Technical Papers 42:1, 1177-1180.
Zavyalov, "3D Hole Inspection Using Lens with High Field Curvature" Measurement Science Review, V. 15, No. 1, 2015. pp. 52-57.
Keusseyan et al., RDL Multilayer Metallization Approaches for TGV, Jan. 2017, Additional Conferences (Device Packaging, HiTEC, HiTEN, and CICMT) (Year 2017).

* cited by examiner

HERMETIC METALLIZED VIA WITH IMPROVED RELIABILITY

This application claims the benefit of priority to U.S. Provisional Application Ser. No. 62/654,869 filed on Apr. 9, 2018; U.S. Provisional Application Ser. No. 62/801,408 filed on Feb. 5, 2019; and U.S. Provisional Application Ser. No. 62/808,566 filed on Feb. 21, 2019. The content of each of the above provisional application is relied upon and incorporated herein by reference in their entirety.

FIELD

This description pertains to vias in glass and glass ceramic substrates.

BACKGROUND

Glass and glass ceramic substrates with vias are desirable for many applications, including for use as in interposers used as an electrical interface, RF filters, and RF switches. Glass substrates have become an attractive alternative to silicon and fiber reinforced polymers for such applications.

It is desirable to fill such vias with a conductor. Copper is presently the most desirable material for such conductors. A hermetic seal between copper and glass is desired for some applications. Such a seal is difficult to obtain because copper does not adhere well to glass, and because of a large mismatch in the coefficient of thermal expansions of many conductor materials, such as copper, and many desirable glass and glass ceramic substrate compositions.

SUMMARY

In a first embodiment, an article comprises: a glass or glass-ceramic substrate having a first major surface and a second major surface opposite the first major surface, and at least one via extending through the substrate from the first major surface to the second major surface over an axial length in an axial dimension. The via defines: an interior surface, a first axial portion, a second axial portion and a third axial portion, wherein the second axial portion is disposed between the first axial portion and the third axial portion along the axial dimension. An adhesion layer is disposed on the interior surface in the first and third axial portions. The adhesion layer is not disposed on the interior surface in the second axial portion. A metal connector is disposed within the via. The metal connector is adhered to the adhesion layer in the first axial portion and the third axial portion. The metal connector coats the interior surface of the via along the axial length of the via from the first major surface to a first cavity length to define a first cavity, with a coating thickness at each position along the axial length of the first cavity that is less than 50% of the via diameter at the first major surface. The metal connector coats the interior surface of the via along the axial length of the via from the second major surface to a second cavity length to define a second cavity, with a coating thickness at each position along the axial length of the second cavity that is less than 50% of the via diameter at the second major surface. The first cavity length is 5% to 45% of the axial length of the via. The second cavity length is 5% to 45% of the axial length of the via. The metal connector fully fills the via for at least 10% of the axial length of the via between the first cavity and the second cavity.

In a second embodiment, for the article of the first embodiment, the via has a diameter of 10 to 200 microns.

In a third embodiment, for the article of the second embodiment, the via has a diameter of 40 to 60 microns.

In a fourth embodiment, for the article of any of the first through third embodiments, the via has a length of 10 microns to 2 mm.

In a fifth embodiment, for the article of the fourth embodiment, the via has a length of 240 microns to 360 microns.

In a sixth embodiment, for the article of any of the first through fifth embodiments: the first axial portion has a length that is 2% to 40% of the length of the via; the second axial portion has a length that is 2% to 40% of the depth of the via; and the third axial portion has a length that is 20% to 96% of the depth of the via.

In a seventh embodiment, for the article of any of the first through sixth embodiments: the first axial portion includes the intersection of the via with the first major surface, and the second axial portion includes the intersection of the via with the second major surface.

In an eighth embodiment, for the article of any of the first through seventh embodiments, the adhesion layer is disposed along the entire perimeter of at least one of the first axial portion and the third axial portion.

In a ninth embodiment, for the article of any of the first through eighth embodiments, the substrate comprises a material. The material comprises 50 mol % to 100 mol % $SiO_2$ on an oxide basis.

In a tenth embodiment, for the article of the ninth embodiment, the material comprises 75 mol % to 100 mol % $SiO_2$ on an oxide basis.

In an eleventh embodiment, for the article of any of the first through tenth embodiments, the adhesion layer comprises Ti.

In a twelfth embodiment, for the article of any of the first through eleventh embodiments, the metal connector consists essentially of copper.

In a thirteenth embodiment, for the article of any of the first through twelfth embodiments, the metal connector hermetically seals the via.

In a fourteenth embodiment, for the article of any of the first through thirteenth embodiments the via has: a first diameter at the first major surface; a second diameter at the second major surface; a via waist between the first major surface and the second major surface. The via waist has the smallest diameter along the axial length of the via. The diameter of the via waist is 75% of the first diameter or less, and the diameter of the via waist is 75% of the second diameter or less.

In a fifteenth embodiment, for the article of any of the first through fourteenth embodiments, at each point along the first cavity length, the coating thickness is 5% to 40% of the via diameter at the first major surface, and, at each point along the second cavity length, the coating thickness is 5% to 40% of the via diameter at the second major surface.

In a sixteenth embodiment, a method of fabricating the article of any of the first through fifteenth embodiments comprises depositing the adhesion layer on the first and third portions of the interior surface of the via using a line of sight technique at a deposition angle different from the direction of the axial length of the via.

In a seventeenth embodiment, an article comprises a glass or glass-ceramic substrate having a first major surface and a second major surface opposite the first major surface, and a via extending through the substrate from the first major surface to the second major surface over an axial length in an axial direction, the via defining an interior surface; and a first axial portion, a third axial portion, and a second axial portion disposed between the first axial portion and the third axial portion along the axial direction. The article further comprises a helium hermetic adhesion layer disposed on the interior surface; and a metal connector disposed within the via, wherein the metal connector is adhered to the helium hermetic adhesion layer, wherein: the metal connector coats the interior surface of the via along the axial length of the via from a first major surface to a first cavity length to define a first, the metal connector comprising a coating thickness of less than 12 µm at the first major surface; the metal connector coats the interior surface of the via along the axial length of the via from the second major surface to a second cavity length to define a second cavity, the metal connector comprising a coating thickness of less than 12 µm at the second major surface; and the metal connector fully fills the via between the first cavity and the second cavity.

In an eighteenth embodiment, the glass article comprises the glass article of the seventeenth embodiment, wherein the metal connector comprises an average coating thickness of less than 12 µm in the first axial portion and the third axial portion.

In a nineteenth embodiment, the glass article comprises the glass article of any of the seventeenth or eighteenth embodiments, wherein the coating thickness within the via at the first major surface and the coating thickness within the via at the second major surface are each less than a coating thickness in the second axial portion.

In a twentieth embodiment, the glass article comprises the glass article of any of the seventeenth to nineteenth embodiments, wherein the first cavity length and the second cavity length are each greater than or equal to 3% of the axial length of the via and less than or equal to 97% of the axial length of the via.

In a twenty-first embodiment, the glass article comprises the glass article of any of the seventeenth to twentieth embodiments, wherein the via has a first diameter at the first major surface, a second diameter at the second major surface, and a third diameter in the second axial portion, and wherein the third diameter is less than the first diameter and the second diameter.

In a twenty-second embodiment, the glass article comprises the glass article of twenty-first embodiment, wherein the first diameter and the second diameter are each greater than or equal to 30 µm and less than or equal to 80 µm.

In a twenty-third embodiment, the glass article comprises the glass article of the twenty-second embodiment, wherein the first diameter and the second diameter are each greater than or equal to 40 µm and less than or equal to 60 µm.

In a twenty-fourth embodiment, the glass article comprises the glass article of the twenty-third embodiment, wherein the first diameter and the second diameter are each greater than or equal to 45 µm and less than or equal to 55 µm.

In a twenty-fifth embodiment, the glass article comprises the glass article of any of the twenty-first to twenty-fourth embodiments, wherein the third diameter is greater than or equal to 10 µm and less than or equal to 40 µm.

In a twenty-sixth embodiment, the glass article comprises the glass article of the twenty-fifth embodiment, wherein the third diameter is greater than or equal to 17 µm and less than or equal to 20 µm.

In a twenty-seventh embodiment, the glass article comprises the glass article of the twenty-sixth embodiment, wherein the third diameter is greater than or equal to 18 µm and less than or equal to 20 µm.

In a twenty-eighth embodiment, the glass article comprises the glass article of any of the twenty-first through twenty-seventh embodiments, wherein a ratio of the third diameter to the first diameter and a ratio of the third diameter to the second diameter is less than or equal to 1:6.

In a twenty-ninth embodiment, the glass article comprises the glass article of any of the twenty-first through twenty-eighth embodiments, wherein the coating thickness within the via at the first major surface and the coating thickness within the via at the second major surface are each less than one half of the third diameter.

In a thirtieth embodiment, the glass article comprises the glass article of any of the seventeenth through twenty-ninth embodiments, wherein the helium hermetic adhesion layer is disposed on the interior surface in the first axial portion and the third axial portion, and wherein the helium hermetic adhesion layer is not disposed on the interior surface in the second axial portion.

In a thirty-first embodiment, the glass article comprises the glass article of the thirtieth embodiment, wherein the helium hermetic adhesion layer is disposed along an entire perimeter of at least one of the first axial portion and the third axial portion.

In a thirty-second embodiment, the glass article comprises the glass article of any of the seventeenth through thirty-first embodiments, wherein the helium hermetic adhesion layer comprises one or more of Ti, TiN, Ta, TaN, Cr, Ni, TiW, W, and a metal oxide.

In a thirty-third embodiment, the glass article comprises the glass article of any of the seventeenth through thirty-second embodiments, wherein the helium hermetic adhesion layer has a thickness of greater than or equal to 1 nm and less than or equal to 500 nm.

In a thirty-fourth embodiment, the glass article comprises the glass article of any of the seventeenth through thirty-third embodiments, wherein the metal connector consists essentially of copper.

In a thirty-fifth embodiment, the glass article comprises the glass article of any of the seventeenth through thirty-fourth embodiments, wherein the metal connector hermetically seals the via.

In a thirty-sixth embodiment, the glass article comprises the glass article of any of the seventeenth through the thirty-fifth embodiments, wherein at least one of the first cavity and the second cavity is filled with one or more materials that are not copper.

In a thirty-seventh embodiment, the glass article comprises the glass article of any of the seventeenth through the thirty-sixth embodiments, wherein the article is free of cracks and has a helium permeability of less than $10^{-5}$ atm-cc/s before and after being heated to a temperature of 450° C. and cooled to a temperature of 23° C.

In a thirty-eighth embodiment, the glass article comprises the glass article of any of the seventeenth through thirty-seventh embodiments, wherein the substrate comprises at least 90 mol % silica.

In a thirty-ninth embodiment, a method of fabricating a glass article comprises depositing a helium hermetic adhesion layer on portions of an interior surface of a via extending through a glass or glass-ceramic substrate, the substrate having a first major surface and a second major surface opposite the first major surface with the via extending through the substrate from the first major surface to the second major surface in an axial direction, the via comprising a first axial portion, a third axial portion, and a second axial portion disposed between the first axial portion and the third axial portion, wherein the helium hermetic adhesion layer is deposited on the interior surface of the via; depositing a metal connector on the first, second, and third axial portions of the via with an electroplating bath comprising a metal salt and a metal deposition inhibitor, wherein: the metal connector is adhered to the helium hermetic adhesion layer; the metal connector coats the interior surface of the via along the axial length of the via from a first major surface to a first cavity length to define a first cavity, with a coating thickness of less than 12 µm at the first major surface; the metal connector coats the interior surface of the via along the axial length of the via from a second major cavity surface to a second cavity length to define a second cavity, with a coating thickness of less than 12 µm at the second major surface; and the metal connector fully fills the via between the first cavity and the second cavity.

In a fortieth embodiment, the method comprises the method of the thirty-ninth embodiment, wherein a plating rate of the metal connector is higher in the second axial portion than in the first axial portion and the third axial portion.

In a forty-first embodiment, the method comprises the method of any of the thirty-ninth or fortieth embodiments, wherein the metal salt comprises a copper salt.

In a forty-second embodiment, the method comprises the method of any of the thirty-ninth through forty-first embodiments, wherein depositing the metal connector comprises applying a current at a current density of greater than or equal to 1.5 mA/cm$^2$ and less than or equal to 5 mA/cm$^2$.

In a forty-third embodiment, the method comprises the method of any of the thirty-ninth through forty-second embodiments, wherein the metal deposition inhibitor comprises nitroblue tetrazolium chloride (NTBC), methylthiazole tetrazolium (MTT), or tetranitroblue tetrazolium chloride (TNBT).

In a forty-fourth embodiment, the method comprises the method of any of the thirty-ninth through forty-third embodiments, and further comprises filling at least one of the first cavity and the second cavity with one or more materials that are not copper.

In a forty-fifth embodiment, the method comprises the method of any of the thirty-ninth through forty-third embodiments, wherein the helium hermetic adhesion layer is deposited on the interior surface of the via in the first axial portion and the third axial portion and the helium hermetic adhesion layer is not disposed on the interior surface of the via in the second axial portion.

In a forty-sixth embodiment, a process comprises heating a glass or glass ceramic article comprising copper-metallized through vias from a first temperature to a second temperature, wherein the first temperature is greater than or equal to 200° C. and less than or equal to 300° C., and wherein the second temperature is greater than or equal to 350° C. and less than or equal to 450° C., wherein an average heating rate during the heating of the glass or glass ceramic article comprising copper-metallized through vias from the first temperature to the second temperature is greater than 0.0° C./min and less than 8.7° C./min.

In a forty-seventh embodiment, the process comprises the process of the forty-sixth embodiment, wherein the heating of the glass or glass ceramic article comprising copper-metallized through vias from the first temperature to the second temperature does not cause radial cracks in the glass or glass ceramic article comprising copper-metallized through vias.

In a forty-eighth embodiment, the process comprises the process of any of the forty-sixth or forty-seventh embodiments, further comprising heating the glass or glass ceramic article comprising copper-metallized through vias from room temperature to the first temperature.

In a forty-ninth embodiment, the process comprises the process of any of the forty-eighth embodiment, wherein an average heating rate during the heating of the glass or glass ceramic article comprising copper-metallized through vias from room temperature to a first temperature is greater than 0.0° C./min and less than 8.7° C./min.

In a fiftieth embodiment, the process comprises a process of any of the forty-sixth through forty-ninth embodiments, wherein the first temperature is from greater than or equal to 225° C. and less than or equal to 275° C.

In a fifty-first embodiment, the process comprises a process of any of the forty-sixth through fiftieth embodiments, wherein the second temperature is from greater than or equal to 375° C. and less than or equal to 425° C.

In a fifty-second embodiment, the process comprises a process of any of the forty-sixth through fifty-first embodiments, wherein the average heating rate during the heating of the glass or glass ceramic article comprising copper-metallized through vias from the first temperature to a second temperature is greater than or equal to 1.0° C./min and less than or equal to 6.5° C./min.

In a fifty-third embodiment, the process comprises a process of any of the forty-sixth through fifty-second embodiments, wherein the average heating rate during the heating of the glass or glass ceramic article comprising copper-metallized through vias from the first temperature to a second temperature is substantially constant.

In a fifty-fourth embodiment, the process comprises a process of any of the forty-sixth through fifty-third embodiments, wherein the average heating rate during the heating of the glass or glass ceramic article comprising copper-metallized through vias from the first temperature to a second temperature is variable In a fifty-fifth embodiment, the process comprises a process of any of the forty-sixth through fifty-fourth embodiments, wherein the process further comprises holding the glass or glass ceramic article comprising copper-metallized through vias at the first temperature for a duration of greater than or equal to 10 minutes and less than or equal to an hour.

In a fifty-sixth embodiments, the process comprises a process of any of the forty-sixth through fifty-fifth embodiments, wherein the process further comprises holding the glass or glass ceramic article comprising copper-metallized through vias at the second temperature for a duration of greater than or equal to 10 minutes and less than or equal to an hour.

In a fifty-seventh embodiment, the process comprises a process of any of the forty-sixth through fifty-sixth embodiments, wherein the heating of the glass or glass ceramic article comprising copper-metallized through vias from the first temperature to a second temperature comprises holding the glass or glass ceramic article comprising copper-metallized through vias at a constant temperature for a duration that is greater than or equal to 10 minutes and less than or equal to 45 minutes.

In a fifty-eighth embodiment, the process comprises a process of any of the forty-sixth through fifty-seventh embodiments, wherein a diameter of the through vias in the glass or glass ceramic article comprising copper-metallized through vias is greater than or equal to 25 µm and less than or equal to 75 µm.

In a fifty-ninth embodiment, the process comprises a process of any of the forty-sixth through fifty-eighth embodiments, wherein a pitch of the through vias in the glass or glass ceramic article comprising copper-metallized through vias is greater than or equal to 60 μm and less than or equal to 800 μm.

In a sixtieth embodiment, the process comprises process of any of the forty-sixth through fifty-ninth embodiments, wherein a depth of the through vias in the glass or glass ceramic article comprising copper-metallized through vias is greater than or equal to 50 μm and less than or equal to 600 μm.

In a sixty-first embodiment, the process comprises a process of any of the forty-sixth through sixtieth embodiments, wherein the glass or glass ceramic article comprises at least 90 mol % silica.

A sixty-second embodiment includes a process, comprising: heating the glass or glass ceramic article comprising copper-metallized through vias from a first temperature to a second temperature, wherein the first temperature is greater than or equal to 240° C. and less than or equal to 260° C., and wherein the second temperature is greater than or equal to 400° C. and less than or equal to 450° C., wherein an average heating rate during the heating of the glass or glass ceramic article comprising copper-metallized through vias from the first temperature to a second temperature is greater than 0.0° C./min and less than or equal to 6.5° C./min.

A sixty-third embodiment includes a glass or glass ceramic article comprising: a glass or glass ceramic substrate comprising at least one through via penetrating the glass or glass ceramic substrate in a thickness direction; and copper present in the at least one through via, wherein the glass or glass ceramic article does not comprise radial cracks after annealing to ≤450° C.

In a sixty-fourth embodiments, a glass or glass ceramic article comprises a glass or glass ceramic article of the sixty-third embodiment, wherein the glass or glass ceramic substrate comprises at least 90 mol % silica.

In a sixty-fifth embodiment, a glass or glass ceramic article comprises a glass or glass ceramic article of any one of the sixty-third or sixty-fourth embodiments, wherein a diameter of the at least one hole in the glass or glass ceramic substrate is greater than or equal to 25 μm and less than or equal to 75 μm.

In a sixty-sixth embodiment, a glass or glass ceramic article comprises a glass or glass ceramic article of any one of the sixty-third to sixty-fifth embodiments, wherein a pitch of at least one through via in the glass or glass ceramic article is greater than or equal to 60 μm and less than or equal to 800 μm.

In a sixty-seventh embodiment, a glass or glass ceramic article comprises a glass or glass ceramic article of any one of the sixty-third through sixty-sixth embodiments, wherein a depth of at least one through via in the glass or glass ceramic substrate is greater than or equal to 50 μm and less than or equal to 600 μm.

A sixty-eighth embodiment comprises: a glass or glass-ceramic substrate having a first major surface and a second major surface opposite the first major surface, and at least one via extending through the substrate from the first major surface to the second major surface over an axial length in an axial dimension; and a metal connector disposed within the via that hermetically seals the via, wherein the article has a helium hermeticity of less than or equal to $1.0\times10^{-8}$ atm-cc/s after 1000 thermal shock cycles, each of the thermal shock cycle comprises cooling the article to a temperature of −40° C. and heating the article to a temperature of 125° C., and the article has a helium hermeticity of less than or equal to $1.0\times10^{-8}$ atm-cc/s after 100 hours of highly accelerated stress test (HAST) at a temperature of 130° C. and a relative humidity of 85%.

In a sixty-ninth embodiment, a glass or glass ceramic article according to the sixty-eighth embodiment has a helium hermeticity of less than or equal to $1.0\times10^{-8}$ atm-cc/s after 3000 thermal shock cycles.

In a seventieth embodiment, a glass or glass ceramic article according to any one of the sixty-eighth embodiment or the sixty-ninth embodiment has a helium hermeticity of less than or equal to $1.0\times10^{-8}$ atm-cc/s after 300 hours of HAST.

In a seventy-first embodiment, a glass or glass ceramic article according to any one of the sixty-eighth through seventieth embodiments has a helium hermeticity of less than or equal to $1.0\times10^{-8}$ atm-cc/s after 2000 thermal shock cycles, and a helium hermeticity of less than or equal to $1.0\times10^{-8}$ atm-cc/s after 200 hours of HAST.

In a seventy-second embodiment, a glass or glass ceramic article according to any one of the sixty-eighth through seventy-first embodiments has a helium hermeticity of less than or equal to $1.0\times10^{-8}$ atm-cc/s after 3000 thermal shock cycles, and a helium hermeticity of less than or equal to $1.0\times10^{-8}$ atm-cc/s after 300 hours of HAST.

In a seventy-third embodiment, a glass or glass ceramic article according to any one of the sixty-eighth through seventy-second embodiments has a helium hermeticity of less than or equal to $1.0\times10^{-8}$ atm-cc/s after 4000 thermal shock cycles, and a helium hermeticity of less than or equal to $1.0\times10^{-8}$ atm-cc/s after 400 hours of HAST.

In a seventy-fourth embodiment, a glass or glass ceramic article according to any one of the sixty-eighth through seventy-third embodiments includes a via having a diameter of 10 to 200 microns.

In a seventy-fifth embodiment, a glass or glass ceramic article according to any one of the sixty-eighth through seventy-fourth embodiments includes a via having a diameter of 40 to 60 microns.

In a seventy-sixth embodiment, a glass or glass ceramic article according to any one of the sixty-eighth through seventy-fifth embodiments includes a via having a length of 10 microns to 2 mm.

In a seventy-seventh embodiment, a glass or glass ceramic article according to any one of the sixty-eighth through seventy-sixth embodiments includes a via having a length of 240 microns to 360 microns.

In a seventy-eighth embodiment, a glass or glass ceramic article according to any one of the sixty-eighth through seventy-seventh embodiments includes a substrate comprising a material, the material comprising 50 mol % to 100 mol % $SiO_2$ on an oxide basis.

In a seventy-ninth embodiment, a glass or glass ceramic article according to the seventy-eighth embodiment, wherein the material comprises 75 mol % to 100 mol % $SiO_2$ on an oxide basis.

In an eightieth embodiment, a glass or glass ceramic article according to any one of the sixty-eighth through seventy-ninth embodiments having a metal connector that consists essentially of copper.

Additional features and advantages will be set forth in the detailed description which follows, and in part will be readily apparent to those skilled in the art from that description or recognized by practicing the embodiments described herein, including the detailed description which follows, the claims, as well as the appended drawings.

The limitations of the various embodiments may be combined in any permutation that does not include mutually exclusive limitations. The first through twentieth embodiments may be incorporated into the twenty-first embodiment in any permutation.

DETAILED DESCRIPTION

Glass and Glass Ceramic Substrates with Vias

Glass and glass ceramic substrates with vias are desirable for a number of applications. For example, 3D interposers with through package via (TPV) interconnects that connect the logic device on one side and memory on the other side are desirable for high bandwidth devices. The current substrate of choice is organic or silicon. Organic interposers suffer from poor dimensional stability while silicon wafers are expensive and suffer from high dielectric loss due to semiconducting property. Glass and glass ceramic may be a superior substrate material due to its low dielectric constant, thermal stability, and low cost. There are applications for glass or glass ceramic substrates with through glass vias (TGV). These vias typically need to be fully or conformally filled by conducting metals such as copper to form a metal connector that provides an electrical pathway. Copper is a particularly desirable conducting metal.

Figure 1:
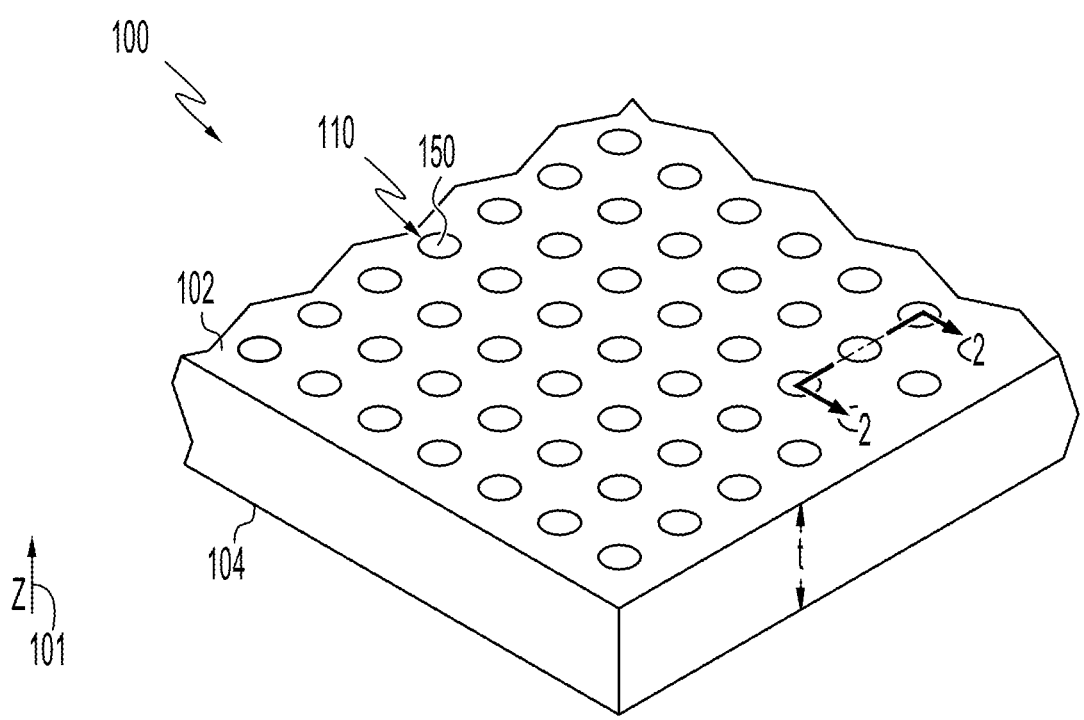
FIG. 1 shows a perspective view of a substrate with vias.

FIG. 1 shows an article comprising a substrate 100, schematically depicted in a partial perspective view. Substrate 100 comprises a first major surface 102 and a second major surface 104 opposite first major surface 102. A plurality of vias 110 extend through the bulk of substrate 100 from first major surface 102 to second major surface 104. Metal connectors 150 fill vias 110. It should be understood that any number of vias 110 may extend through substrate 100 in any arrangement. Coordinate marker 101 shows the direction of axial dimension z, which is normal to the plane of first major surface 102 and second major surface 104. Unless otherwise specified, the "length" of a via or metal connector is in the axial dimension z. The thickness t of substrate 100, which is in the axial dimension, may be any appropriate thickness depending on the application.

In various embodiments, the substrate 100 may comprise any suitable glass or glass ceramic substrate. In some particular embodiments, high silica glass or glass ceramic substrates are desirable for certain applications due to their dielectric properties. For example, a glass or glass ceramic material having a silica content of 50 mol %, 55 mol %, 60 mol %, 65 mol %, 70 mol %, 75 mol %, 80 mol %, 85 mol %, 90 mol %, 95 mol %, or 100 mol %, or any range having any two of these values as endpoints, including endpoints, may be used. A glass or glass ceramic material having a silica content of 50 mol % to 100 mol %, or 75 mol % to 100 mol % may be used. In some embodiments, the substrate comprises at least 90 mol % silica.

For substrates having the dimensions described herein, it is particularly difficult to achieve a hermetically sealed via in high silica glass with copper metal connectors for at least two reasons. First, copper does not adhere well to glass. Second, the CTE mismatch between copper and high silica glass is particularly large. The articles and methods described herein achieve a hermetic seal notwithstanding these reasons by providing a superior stress relief mechanism.

Figure 2:
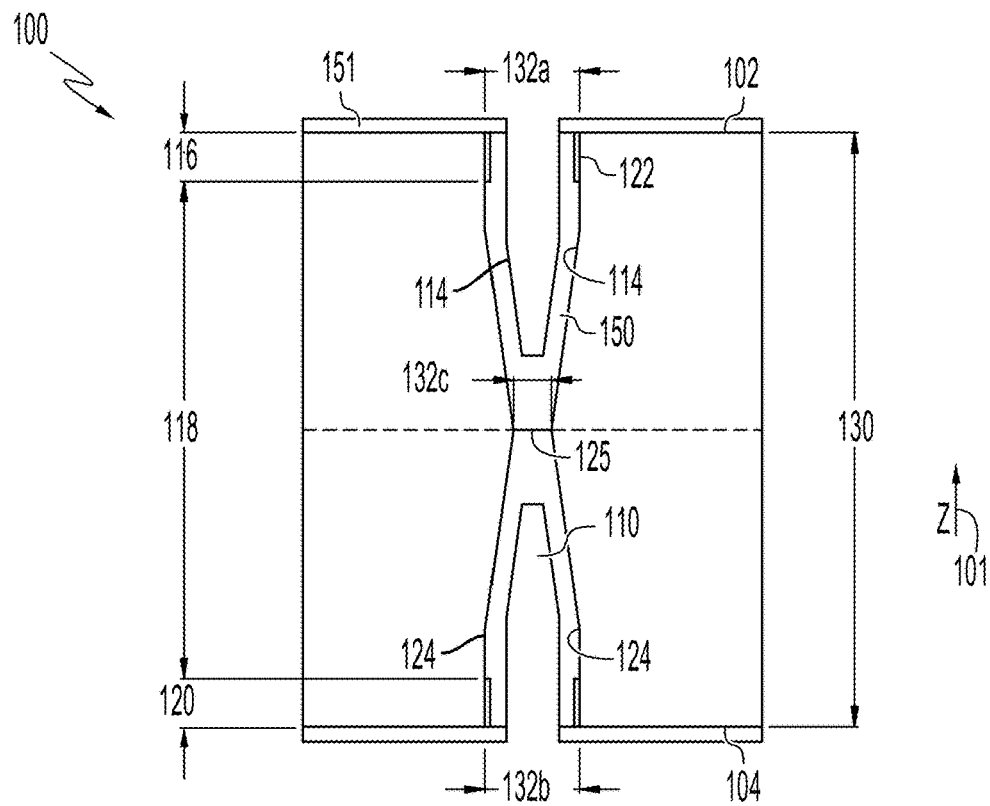
FIG. 2 shows a cross section of a via, taken along line 2-2' of FIG. 1.

FIG. 2 shows an article comprising substrate 100, schematically depicted as a cross section of FIG. 1 along line 2-2'. FIG. 2 shows substrate 100, coordinate marker 101, first major surface 102, second major surface 104, via 110 and metal connector 150 of FIG. 1. Interior surface 114 of via 110 is divided into a first axial portion 116, a second axial portion 118 and a third axial portion 120. An adhesion layer 122 is disposed on interior surface 114 in first axial portion 116 and third axial portion 120. Adhesion layer 122 is not present in second axial portion 118. The axial length of first axial portion 116 and third axial portion 120 may be referred to as the "adhesion length," because it is the length into via 110 for which metal connector 150 adheres strongly to substrate 100. In second axial portion 118, adhesion layer 122 is not present, so metal connector 150 does not bond to strongly to interior surface 114. Via 110 has a via length 130 in the axial direction. Via 110 has a first diameter 132a at the first major surface, and a second diameter 132b at the second major surface.

FIG. 2 shows an article comprising the substrate 100, schematically depicted as a cross section of FIG. 1 along line 2-2'. FIG. 2 shows the substrate 100, the coordinate marker 101, the first major surface 102, the second major surface 104, the via 110 and the metal connector 150 of FIG. 1. The interior surface 114 of the via 110 is divided into a first axial portion 116, a second axial portion 118 and a third axial portion 120. A helium hermetic adhesion layer 122 is disposed on the interior surface 114 of the via 110 in the first axial portion 116 and the third axial portion 120. In embodiments, the helium hermetic adhesion layer 122 is disposed on the interior surface 114 of the via 110 along an entire perimeter of at least one of the first axial portion 116 and the third axial portion 120. The helium hermetic adhesion layer 122 is not present in the second axial portion 118.

The phrase "helium hermetic adhesion layer," as used herein, means an adhesion layer that provides helium hermeticity to helium at a permeability of less than 10-5 atm-cc/s, or even less than 10-8 atm-cc/s as measured using a vacuum-based helium leak testing system by adhering the metal connector 150 to the interior surface 114 of the via 110. Suitable helium hermetic adhesion layer materials include metals, like titanium (Ti), chrome (Cr), tantalum (Ta), vanadium (V), nickel (Ni), tungsten (W), or metal oxides, like titanium oxide, tungsten oxide, and manganese oxide, or nitrides, like titanium nitride (TiN) and tantalum nitride (TaN). In various embodiments, the helium hermetic adhesion layer comprises titanium (Ti). The helium hermetic adhesion layer has a thickness of greater than or equal to 1 nm and less than or equal to 500 nm. For example, in some particular embodiments, the helium hermetic adhesion layer has a thickness of about 100 nm.

In some embodiments, such as embodiments that are partially bonded, the axial length of the first axial portion 116 or the third axial portion 120 may be referred to as the "adhesion length," because it is the length into the via 110 along which the metal connector 150 adheres strongly to the substrate 100. In some such embodiments, the adhesion length is greater than or equal to 5 μm and less than or equal to 148 μm. The adhesion length may be greater than or equal to 10 μm and less than or equal to 135 μm, greater than or equal to 10 μm and less than or equal to 130 μm, greater than or equal to 10 μm and less than or equal to 125 μm, greater than or equal to 10 μm and less than or equal to 120 μm, greater than or equal to 10 μm and less than or equal to 115 μm, greater than or equal to 15 μm and less than or equal to 140 μm, greater than or equal to 15 μm and less than or equal to 135 μm, greater than or equal to 15 μm and less than or equal to 130 μm, greater than or equal to 15 μm and less than or equal to 125 μm, greater than or equal to 15 μm and less than or equal to 120 μm, greater than or equal to 20 μm and less than or equal to 140 μm, greater than or equal to 20 μm and less than or equal to 135 μm, greater than or equal to 20 μm and less than or equal to 130 μm, greater than or equal to 20 μm and less than or equal to 125 μm, greater than or equal to 25 μm and less than or equal to 140 μm, greater than or equal to 25 μm and less than or equal to 135 μm, greater than or equal to 25 μm and less than or equal to 130 μm, greater than or equal to 30 μm and less than or equal to 140 μm, greater than or equal to 30 μm and less than or equal to 135 μm, or greater than or equal to 35 μm and less than or equal to 140 μm. In some embodiments, the adhesion length is greater than or equal to 40 μm and less than or equal to 140 μm, greater than or equal to 40 μm and less than or equal to 130 μm, greater than or equal to 40 μm and less than or equal to 120 μm, greater than or equal to 40 μm and less than or equal to 110 μm, greater than or equal to 40 μm and less than or equal to 100 μm, greater than or equal to 40 μm and less than or equal to 90 μm, greater than or equal to 40 μm and less than or equal to 80 μm, greater than or equal to 40 μm and less than or equal to 70 μm, or greater than or equal to 40 μm and less than or equal to 60 μm. For example, the adhesion length may be about 40 μm, 50 μm, 60 μm or 70 μm. It is contemplated that other adhesion lengths may be employed in various embodiments.

In the second axial portion 118, the helium hermetic adhesion layer 122 is not present, so the metal connector 150 does not bond as strongly to the interior surface 114 along the second axial portion 118. The via 110 has a via length 130 in the axial direction. The via 110 has a first diameter 132a at the first major surface 102, a second diameter 132b at the second major surface 104, and a third diameter 132c in the second axial portion 118.

Via Shape

Via 110 of FIG. 2 has a tapered interior surface 114 that tapers or narrows from first diameter 132a at first major surface 102, and from second diameter 132b at second major surface 104, to a waist 125 having a waist diameter. As used herein, the "waist" of a via refers to the part of a variable-diameter via having the smallest diameter. The diameter of via 110 changes as a function of axial position. The overall "diameter" of via 110 is the maximum diameter. Unless otherwise specified, "via diameter" refers to the maximum diameter. When via 110 is not circular, the "diameter" of via 100 is the diameter of a circle having the same cross-sectional area as via 110, in a plane normal to the axial direction.

The via waist 125 has the smallest diameter along the axial length of the via. The diameter of the via waist as a percentage of the first diameter may be 10%, 15%, 20%, 25%, 30%, 35%, 40%, 45%, 50%, 55%, 60%, 65%, 70%, 75%, 80%, or any range having any two of these values as endpoints, including endpoints. The diameter of the via waist as a percentage of the second diameter may be 10%, 15%, 20%, 25%, 30%, 35%, 40%, 45%, 50%, 55%, 60%, 65%, 70%, 75%, 80%, or any range having any two of these values as endpoints, including endpoints. The diameter of the via waist may be 75% of the first diameter or less, and the diameter of the via waist may be 75% of the second diameter or less. The diameter of the via waist may be 20% to 50% of the first diameter or less, and the diameter of the via waist may be 20% to 50% of the second diameter or less. In various embodiments, the third diameter 132*c*, or the via waist, is greater than or equal to 10 μm and less than or equal to 40 μm. The third diameter 132*c* may be greater than or equal to 20 μm and less than or equal to 30 μm, or greater than or equal to 22 μm and less than or equal to 27 μm. For example, the third diameter 132*c* may be 10 μm, 15 μm, 20 μm, 22 μm, 25 μm, 27 μm, 30 μm, 35 μm, or 40 μm. In various embodiments, a ratio of the third diameter 132*c* to the first diameter 132*a* is less than or equal to 1:6, less than or equal to 1:5, less than or equal to 1:4, less than or equal to 1:3, or less than or equal to 1:2 and/or a ratio of the third diameter 132*c* to the second diameter 132*b* is less than or equal to 1:6, less than or equal to 1:5, less than or equal to 1:4, less than or equal to 1:3, or less than or equal to 1:2.

Via 110 may have any suitable via length 130. As non-limiting examples, the thicknesses of substrate 100 (and via length 130) may be 10 μm, 60 μm, 120 μm, 180 μm, 240 μm, 300 μm, 360 μm, 420 μm, 480 μm, 540 μm, 600 μm, 720 μm, 840 μm, 960 μm, 1080 μm, 1500 μm, 2000 μm, or any range having any two of these values as endpoints, including endpoints. In some embodiments, thickness t and via length is 10 μm to 2000 μm, or 240 μm to 360 μm.

The via 110 may have any suitable first diameter 132*a* and second diameter 132*b*. As non-limiting examples, these diameters may be 30 μm, 40 μm, 50 μm, 60 μm, 70 μm, 80 μm, or any range having any two of these values as endpoints, including endpoints. In some embodiments, the via diameter may be greater than or equal to 30 μm and less than or equal to 80 μm, greater than or equal to 40 μm and less than or equal to 60 μm, or greater than or equal to 45 μm and less than or equal to 55 μm. First diameter 132*a* may be the same as or different from second diameter 132*b*. As described hereinabove, the first diameter 132*a* and the second diameter 132*b* are each greater than the third diameter 132*c*.

The axial length of first, second and third axial portions may be any suitable length. It is desirable to choose lengths that achieve a combination of low maximum principle stress and helium hermeticity. Lower lengths for the first and third axial portions reduce stress, as demonstrated by the models described herein, such that the glass does not crack resulting in loss of helium hermeticity. But, if the lengths of the first and third axial portions are too low, helium hermeticity may be lost because there is inadequate bonding, even in the absence of cracking. In some embodiments, the first and third axial portions have lengths that are independently chosen from 1%, 2%, 3%, 4%, 5%, 6%, 7%, 8%, 9%, 10%, 15%, 20%, 25%, 30%, 35% and 40% of the length of the via, or any range having any two of these values as endpoints, including endpoints. The second axial portion has a length that is 20%, 25%, 30%, 35%, 40%, 45%, 50%, 55%, 60%, 65%, 70%, 75%, 80%, 81%, 82%, 83%, 84%, 85%, 86%, 87%, 88%, 89%, 90%, 91%, 92%, 93%, 94%, 95%, 96%, 97%, or 98%, of the length of the via, or any range having any two of these values as endpoints, including endpoints. The first and third axial portions may have lengths that are 2% to 40% of the length of the via, while the second axial portion has a length that is 20% to 96% of the length of the via. while the second axial portion has a length that is 20% to 96% of the length of the via. It is desirable, in embodiments, to choose the smallest length for first and third axial portions that reliably provides a hermetic seal.

In various embodiments, the vias are high aspect ratio vias with a via length of 240 μm to 360 μm and a via diameter of 40 μm to 60 μm. As used herein, an "aspect ratio" refers to the ratio of the average thickness of the glass substrate to the average diameter of the vias. A "high aspect ratio" refers to aspect ratios of greater than 3. Without being bound by theory, for such vias, first and third axial portions having lengths of 20 μm, 25 μm, 30 μm, 35 μm and 40 μm, or any range having any two of these values as endpoints, including endpoints, may be desired to achieve a reduced stress, although other lengths are contemplated. The length of the second axial portion makes up the remainder of the via length.

It is expected that the desirable dimensions will change in the future, and that the concepts described herein may be used to provide hermetically sealed vias for those dimensions.

In some embodiments, the first axial portion includes the intersection of the via with the first major surface, and the second axial portion includes the intersection of the via with the second major surface. This geometry is well matched with fabrication methods described herein.

The via 110 optionally has rounded fillets 124 at interior edges to reduce stress concentration, including at the via waist 125. As used herein, "fillets" refers to a rounded corner along an interior corner of the via 110. Such rounded fillets may be used at any edge in a via shape. The rounded fillets 124 may have any suitable diameter, such as 3 mm, 4 mm, 5 mm, 6 mm, 7 mm, 8 mm, or any or any range having any two of these values as endpoints, including endpoints. Other diameters may be used.

Via 110 has an interior surface 114 with two distinct slopes, with a slope change at fillet 124. Via 110 may have a single slope from each of first major surface 102 and second major surface 104 to waist 125, two slopes as illustrated in FIG. 2, or more complex shapes. One or more of the slopes may be perpendicular to first major surface 102 and second major surface 104, as illustrated in FIG. 2.

Metal Connector

Figure 3:
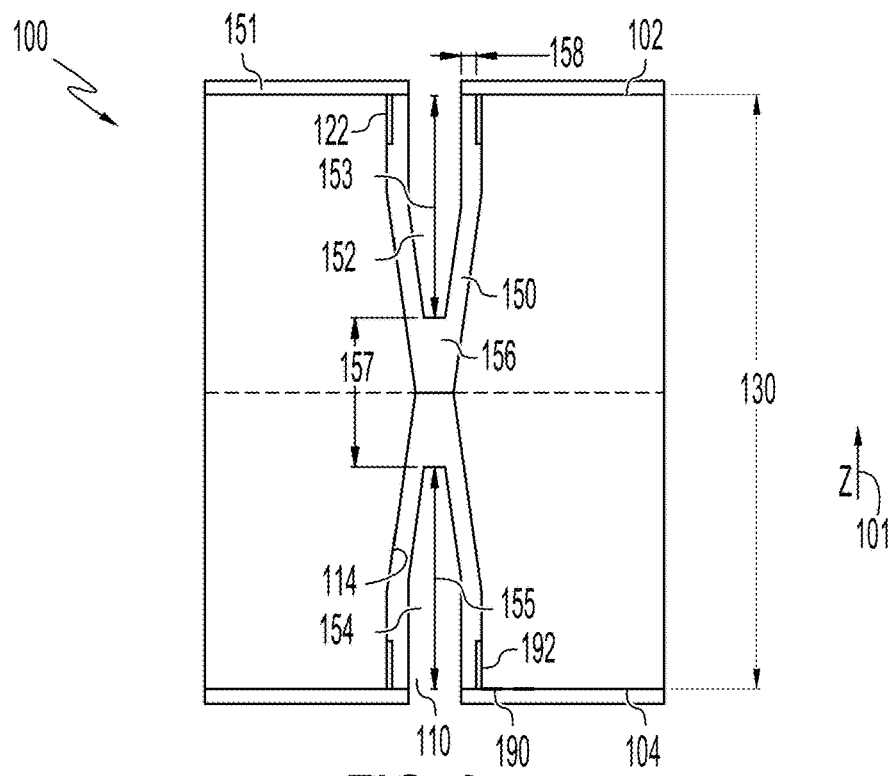
FIG. 3 shows the via of FIG. 2 a via with focus on the features of the metal connector.

FIG. 3 shows the same via 110 as FIG. 2, but is labeled to illustrate the parts of the metal connector 150. The metal connector 150 defines a first cavity 152 spanning the first axial portion 116 and a second cavity 154 spanning the third axial portion 120. The first cavity 152 is separated from the second cavity 154 by a filled portion 156 within the second axial portion 118. The first cavity 152 has a first cavity length 153 in the axial dimension, and the second cavity 154 has a second cavity length 155 in the axial dimension. At each position in the axial dimension along the first cavity length 153 and the second cavity length 155, the metal connector 150 coats the interior surface 114 without completely filling the via 110. The filled portion 156 has a filled length 157 in the axial dimension. The metal connector 150 has a coating thickness 158 along the first cavity length 153 and the second cavity length 155. Although illustrated as a constant thickness (a conformal layer), coating thickness 158 may vary with axial position and distance from the first major surface and/or second major surface.

In various embodiments, the metal connector 150 has a coating thickness 158 of less than 12 μm at the first major surface 102 and at the second major surface 104. For example, the metal connector 150 may have a coating thickness 158 of 5 μm, 6 μm, 7 μm, 8 μm, 9 μm, 10 μm, or 11 μm at the first major surface 102 and at the second major surface 104. In some embodiments, the metal connector 150 has an average coating thickness of less than 12 μm in the first axial portion and in the second axial portion. In some embodiments, the metal connector 150 has an average coating thickness of less than 12 μm over the length from the first major surface 102 to the adjacent rounded fillet 124 and over the length from the second major surface 104 to the adjacent rounded fillet 124.

The use of a via 110 with a tapered shape, i.e., a waist 125 with a diameter narrower than the first diameter 132a and the second diameter 132b, enables fabrication of metal connector 150 with the unique geometry shown in FIGS. 2 and 3. Specifically, that shape has the first cavity 152 and the second cavity 154 extending from the first major surface 102 and the second major surface 104, respectively. At the same time, the metal connector 150 includes a filled portion 156 in proximity to the waist 125. The geometry of the metal connector 150 allows for a hermetic seal to the substrate 100 with degrees of freedom for stress relief not available with other geometries. In particular, the helium hermetic adhesion layer 122 forms a hermetic seal between the metal connector 150 and the substrate 100 at the first major surface 102 and the second major surface 104, for the axial lengths of the first axial portion 116 and the third axial portion 120, respectively. The filled portion 156 completes the hermetic seal, such that gas and liquid cannot pass through the via 110 between the first major surface 102 and the second major surface 104. The lack of adhesion in the second axial portion 118 provides an extra degree of freedom for the metal connector 150 to relieve stress during thermal cycling. Additionally, the first cavity 152 and the second cavity 154 provide yet another degree of freedom for stress relief. These degrees of freedom for stress relief result in a metal connector that can survive thermal cycling without causing the substrate to fail due to the differential in the coefficients of thermal expansion between the metal connector and the substrate.

In some embodiments, first cavity 152 and second cavity 154 extend sufficiently far into via 110 that they overlap with second axial portion 118. This overlap results in axial portions of metal connector 150 that are neither bonded to substrate 100 nor filled. Such a geometry provides further avenues for stress relief.

The first cavity length may be 3%, 5%, 10%, 15%, 20%, 25%, 30%, 35%, 40%, 45%, 50%, 60%, 70%, 80%, 90%, 95%, or 97% of the axial length of the via 110, or any range having any two of these values as endpoints, including endpoints. The second cavity length 155 may be 3%, 5%, 10%, 15%, 20%, 25%, 30%, 35%, 40%, 45%, 50%, 60%, 70%, 80%, 90%, 95%, or 97% of the axial length of the via 110, or any range having any two of these values as endpoints, including endpoints. The second cavity length 155 may be the same as or different from the first cavity length 153. In various embodiments, the first cavity length 153 and the second cavity length 155 are each greater than or equal to 10 μm and less than or equal to 150 μm. For example, the first cavity length 153 and the second cavity length 155 may each be 10 μm, 15 μm, 20 μm, 25 μm, 30 μm, 35 μm, 40 μm, 45 μm, 50 μm, 60 μm, 70 μm, 80 μm, 90 μm, 100 μm, 110 μm, 120 μm, 130 μm, 140 μm, 150 μm, or any range having any two of these values as endpoints, including endpoints.

The filled portion 156 has an axial length that makes up the difference between the axial via length 130 on one hand, and the first cavity length 153 and the second cavity length 155 on the other. In some embodiments, the metal conductor fully fills the via for at least 10% of the axial length of the via 110.

Along the axial length of the via where the first cavity 152 and the second cavity 154 are present, the coating thickness 158 is less than 50% of the via diameter at each point along the axial length. In various embodiments herein, the coating thickness 158 is measured as the thickness of the metal connector, and does not include the thickness of the helium hermetic adhesion layer. As a result, the coating thickness does not extend to the center of the via 110, such that the first cavity 152 and the second cavity 154 may be formed. The coating thickness 158 may be 5%, 10%, 15%, 20%, 25%, 30%, 35%, 40%, 45% or 49% of the via diameter at each point along the axial length, or any range having any two of these values as endpoints, including endpoints. The coating thickness 158 may be constant with the axial position, or may change with the axial position. The coating thickness 158 may be, along the axial length of the via where the first cavity 152 and the second cavity 154 are present, 1 μm, 2 μm, 3 μm, 4 μm, 5 μm, 6 μm, 8 μm, 10 μm, or less than 12 μm, or any range having any two of these values as endpoints, including endpoints, so long as the coating thickness 158 is sufficiently small to not completely fill the via where the first cavity 152 and the second cavity 154 are present. However, as will be described in greater detail below, the coating thickness 158 of various embodiments is less than 12 μm. In various embodiments, the coating thickness 158 within the via at the first major surface and the coating thickness 158 within the via at the second major surface are each less than the coating thickness in the second axial portion. In some embodiments, the coating thickness 158 is less than one half of the diameter of the third diameter 153c within the via at each of the first major surface 102 and the second major surface 104.

Although depicted in FIGS. 2 and 3 as being empty or unfilled, in some embodiments, the first cavity 152 and/or the second cavity 154 may be filled with one or more materials that are not copper. Such filling of the first cavity 152 and/or the second cavity 154 may reduce or eliminate contamination or degradation of the metal connector 150 as a result of corrosive materials used in processing of the glass article. In embodiments, the material may have a CTE that is lower than the CTE of the metal connector 150, have plasticity, and/or have one or more degrees of freedom beyond the degrees of freedom of the metal connector 150. In particular embodiments, the material may further reduce the stress of the glass article, or even result in a net zero stress of the glass article. In some embodiments, the material does not covalently bind the metal connector 150.

Suitable materials that may be used to fill the first cavity 152 and/or the second cavity 154 can include, by way of example and not limitation, materials that do not degrade at temperatures of greater than or equal to 400° C. or even 500° C. For example, sol gel silica, sol gel metal oxides, polymers, composites, alloys, or other types of inorganic materials may be used depending on the particular embodiment. The first cavity 152 and/or the second cavity 154 may be filled using any one of a variety of methods known and used in the art, including, but not limited to, inkjet printing, spray coating, or another deposition method. It is contemplated that the particular method for filling the first cavity 152 and/or the second cavity 154 may depend on the particular material to be used.

Fabrication Methods

Through-glass vias with a tapered shape may be fabricated by any suitable method. One method is to form a damage track in substrate 100 with a laser, followed by etching. Exemplary methods are described in U.S. Pat. No. 9,656,909, and U.S. Patent Application 62/588,615, which are incorporated herein by reference in their entireties. Another method is to modify photosensitive glass with a laser, followed by etching.

Figure 4:
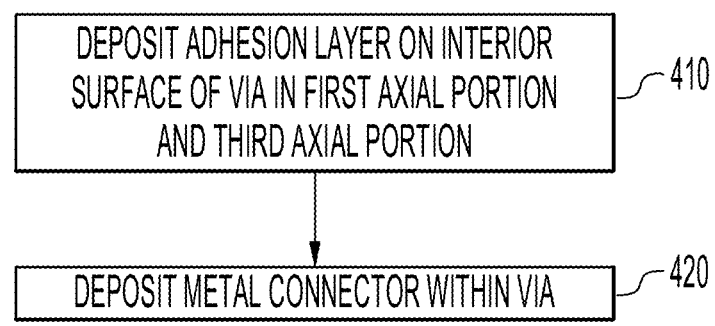
FIG. 4 shows a flowchart for a process of making a via.

FIG. 4 shows a flowchart illustrating a process for metallizing a through glass via. In a step 410, an adhesion layer is deposited on the interior surface of a via in first axial portion and third axial portion, but not the second axial portion. In a subsequent step 420, a metal connector is deposited within the via, such that the metal connector adheres to the adhesion layer in the first axial portion and the third axial portion.

An adhesion layer may be deposited on first and third axial portions, but not second axial portion, by any suitable method. For example, the length of first and third axial portions in the z dimension may be readily controlled using line of sight deposition methods such as sputtering, and adjusting deposition angle. The substrate may be rotated during deposition to ensure that the length of the first and third axial portions are constant around the entire perimeter of the interior surface of the via in the first axial portion and the third axial portion.

Suitable adhesion layer materials include metals, like titanium, chrome, tantalum, vanadium or metal oxides, like zinc oxide, and manganese oxide, or nitrides, like titanium nitride and tantalum nitride. These adhesion films can be applied to the glass surface using many different methods, like sputtering, ebeam deposition, ion beam deposition, atomic layer deposition, chemical vapor deposition and solution coating.

In embodiments, Helium hermetic adhesion layers in the form of films formed from metals, metal oxides, or metal nitrides can also be applied to the glass surface using many different methods, like sputtering, ebeam deposition, ion beam deposition, atomic layer deposition, chemical vapor deposition and solution coating.

The metal connector may be fabricated from any suitable metal. In some embodiments, copper may be a desirable metal due to its particularly high conductivity. Gold, silver, and other conductive metals may be used, as well as alloys of conductive metals. In embodiments, the metal connector comprises copper. In some particular embodiments, the metal connector consists essentially of copper.

The metal connector may be deposited by any suitable means. One suitable method for depositing copper (and other metals) is depositing a catalyst such as Pd on the helium hermetic adhesion layer, followed by electroless deposition of copper, followed by electroplating copper. It should be understood that the catalyst, such as Pd, may be deposited on components other than, or in addition to the helium hermetic adhesion layer as desired. In various embodiments, the electroplating process includes the use of an electroplating bath comprising a metal salt and a metal deposition inhibitor and application of a current at a current density of greater than or equal to 1.5 mA/cm$^2$ and less than or equal to 5 mA/cm$^2$, or greater than or equal to 1.5 mA/cm$^2$ and less than or equal to 2.5 mA/cm$^2$. The metal salt can be a salt of the metal forming the metal connector, such as $CuSO_4$. The metal deposition inhibitor may be selected to specifically inhibit or slow the plating rate of the metal at or near the first and second major surfaces, enabling the formation of a metal connector with a coating thickness that is thinner within the via at the first and second major surfaces than at the waist of the via.

One example of a metal deposition inhibitor is nitroblue tetrazolium chloride (NTBC). Without being bound by theory, it is believed that NTBC preferentially adsorbs on copper ions near the entrances to the vias, which leads to a suppression of copper deposition in the region where the NTBC has been adsorbed. The preferential adsorption of NTBC also leads to a concentration gradient of adsorbed NTBC along the axial length of the via, with more NTBC near the first and second major surfaces and very little NTBC near the waist of the via. Accordingly, copper may be deposited faster near the waist of the via as compared to near and on the first and second major surfaces. Therefore, by maintaining the differential plating rate, the via center may be plugged while the coating thickness at the first and second major surfaces is less than one half of the diameter of the waist.

Although various embodiments described herein include NTBC as a metal deposition inhibitor, other metal deposition inhibitors and methods for achieving and maintaining a differential plating rate are contemplated. For example, Ni—B (NTB), methylthiazole tetrazolium (MTT), and/or tetranitroblue tetrazolium chloride (TNBT) may be used as metal deposition inhibitors.

Other suitable methods for depositing the metal connector include filling the via with metal paste and sintering or chemical vapor deposition (CVD). Suitable methods for depositing copper are further described in US Patent Publication US 2017-0287728 (see, for example, paragraphs [0004]-[0005], which is incorporated by reference in its entirety.

Delamination

Delamination is one failure mechanism. Delamination occurs when a conductive metal, such as copper, detaches from the interior of a via. When there is a weak bond between the conductor and the substrate, the stress caused by thermal cycling can lead to delamination. If delaminated, the metal may plastically deform out the end of the vias during thermal cycling. In the printed circuit board industry, this expansion is called metal pumping or pistoning. In many applications for TGVs, a thin film metal redistribution layer (RDL) is subsequently applied to the metallized TGVs. These RDLs are used to route power or signals coming through the metal TGVs to electronic components. Any metal pumping or pistoning will rip apart the electrical connection between the metal TGV and the RDL.

Delamination can also lead to loss of helium hermeticity, as gas and liquid may penetrate the substrate along the boundary between the delaminated metal connector and the interior surface of the via.

Delamination may be reduced or eliminated by forming a sufficiently strong bond between the substrate and the metal connector. An adhesion layer disposed on the interior surface of the via, between the substrate and the metal connector, may be used to form such a bond. As used herein, and "adhesion layer" refers to any layer or surface treatment that leads to a bond between the metal connector and the substrate sufficiently strong to survive thermal cycling from 400° C. to 25° C. Any suitable adhesion layer may be used, an adhesion layers may be deposited by any suitable means. For example, oxide adhesion layers may be deposited by sputtering. Deposition parameters may be adjusted to control where the adhesion layer deposits. For example, the angle of deposition during a sputtering process may be adjusted to control the length of first axial portion 116 and third axial portion 120, where material is deposited by sputtering. This same adjustment controls the length of second axial portion 118, where material is not deposited by sputtering.

Circumferential Cracking

Delamination may be prevented by forming a strong bond between the metal connector and substrate. But, this stronger bond prevents the metal connector from moving relative to the substrate during thermal cycling. As a result, thermal cycling may cause stress in the substrate that leads to cracking and loss of helium hermeticity.

The 2-D plane-strain solution to the classical Lame problem in elasticity to predict stress field in glass is as follows.

$$\sigma_r^A = -\sigma_\theta^A = \frac{-E_f \varepsilon_T}{1 - 2v_f + \frac{1+v_m}{1+v_f}\frac{E_f}{E_m}} \left(\frac{D_f}{2r}\right)^2$$

where σr, σθ, and σz are the radial, circumferential, and axial stresses, respectively, and εT=(αf-αm)ΔT is the mismatch strain due to a thermal load ΔT. The material properties α, E, and ν are the CTE, Young's modulus, and Poisson's ratio, with the subscripts f and m for the via (fiber) and Glass (matrix), respectively.

Failure can be occurred in both heating and cooling part of thermal cycling. During heating, the greatest expansion mismatch is at the hottest temperatures. Much of the stress in the substrate is compressive at higher temperatures, because the metal connector has expanded more than the substrate. Circumferential tensile stress in the glass, which is dominant during heating, around the metal connector can lead to radial cracking. It can be propagated to the next via. During cooling, the greatest shrinking mismatch is at the lowest temperatures. Much of the stress in the substrate is tensile at lower temperatures, because the metal connector has shrunk more than the substrate. The radial stress, which is dominant during cooling, can lead to cracking. The radial stress is tensile in glass near the surface, which may cause circumferential cracking (C-cracks) of the glass. For both heating and cooling, the presence of the shear stress along the interface can induce interfacial failure by delamination.

Toward the end of a cooling part of thermal cycling, metal connector 150 has shrunk more than substrate 100 due to the difference in CTE. Because metal connector 150 is adhered to substrate 100. The shrinkage of metal connector 150 pulls on substrate 100, placing substrate 100 in tensile stress. Without sufficient degrees of freedom for stress relief, this tensile stress will cause microcracks in substrate 100. These microcracks cause loss of helium hermeticity.

Various embodiments described herein may exhibit helium hermeticity and no cracking after being subjected to thermal cycling. In particular, in the various embodiments described herein, the presence of the conformal copper coating having a limited coating thickness at the major surfaces of the substrate and with a fully filled midsection, and the absence of a helium hermetic adhesion layer along the second axial portion of the via provides helium hermeticity while enabling the substrate and the metal connector to shrink at different rates without generating an amount of tensile stress sufficient to generate microcracks.

Modeling

For modeling, the geometry of FIGS. 2 and 3 was used, where the interior surface of the via is conformally coated with copper everywhere except for 75 μm of axial length, 37.5 μm on each side of waist 125, where the via is filled all the way through. Via length 130 was 300 μm. First diameter 132a and second diameter 132b were each 50 μm. The 50 μm diameter is maintained for a distance of 50 μm along the axial length from both surfaces. Starting at 50 μm from the surfaces, the via tapers inwards to a diameter of 20 μm at waist 125, halfway along the axial length. On both the top and bottom surfaces, a 20 μm thick, flat copper overburden 151 (shown in FIGS. 2 and 3) is included. It is expected that the modeling results will extent to other via and metal connector shapes having cavities in the metal connector and a second axial portion without strong bonding between the metal connector and substrate.

In one process flow for fabricating an actual device, the geometry of FIG. 2 and FIG. 3, including copper overburden 151, is present when the most severe thermal cycling occurs. Afterwards, the overburden is removed and further processing may occur. But, the geometry of FIG. 2 and FIG. 3 has relevance to the thermal cycling modeled herein.

The modeling was based on theories drawn from Ryu S K, Lu K H, Zhang X, Im J H, Ho P S, Huang R. *Impact of near-surface thermal stresses on interfacial reliability of through-silicon vias for 3-D interconnects*. IEEE Transactions on Device and Materials Reliability. 2011 March; 11(1):35- ("Ryu"). According to Ryu, there is an analytical solution to predict via and wafer surface stresses when a via is placed in a wafer. But, there is no closed form to predict stresses through thickness. So, modeling is required. For modeling, a single isolated hole in finite plate is modeled. 2D axi-symmetry is assumed and small enough mesh size of ~0.5 μm is used.

Figure 5A:
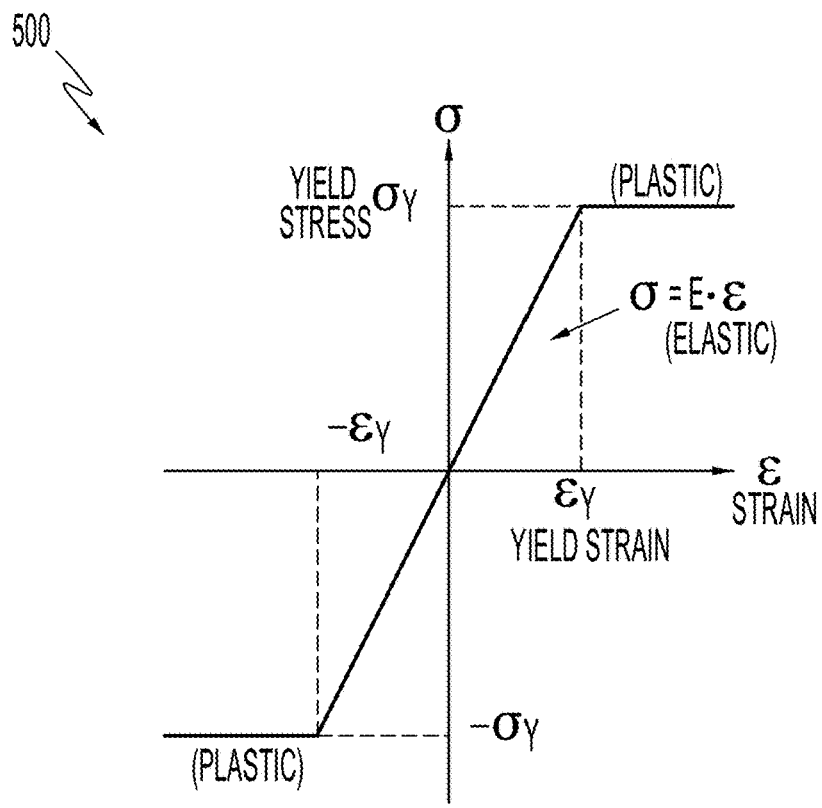
FIG. 5A shows the stress-strain relationship for an elastically perfect plastic model used in modeling.
Figure 5B:
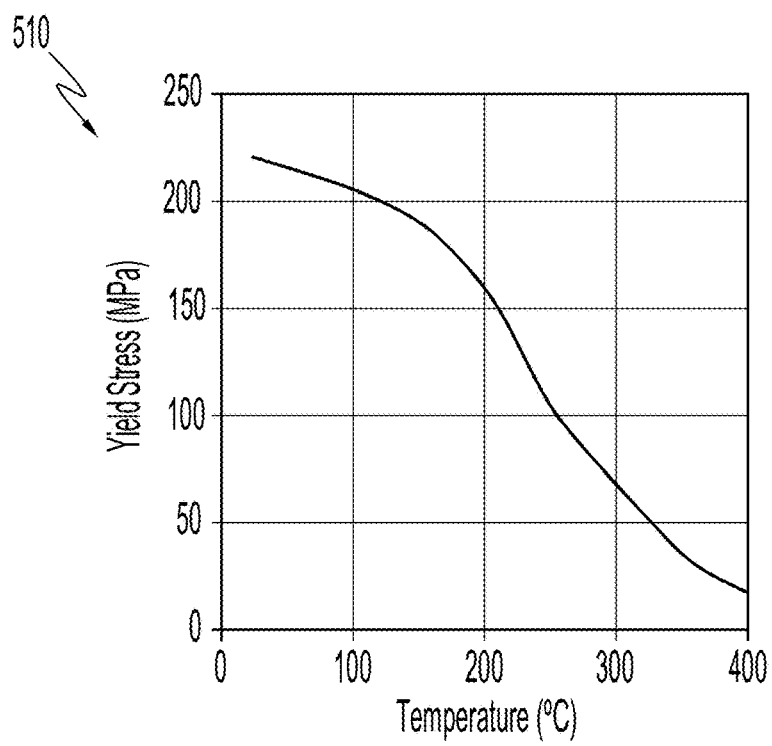
FIG. 5B shows the temperature dependent copper yield stress used in modeling.

For the modeling, it was assumed that the glass is elastic, with the properties of fused silica: E (Young's modulus)=73 GPa; ν (Poisson's ratio)=0.17 and α (coefficient of thermal expansion)=0.55 ppm/° C. It was assumed that copper has elastically perfect plastic properties, with temperature dependent yield stresses. FIG. 5A shows graph 500, which illustrates the stress-strain relationship for an elastically perfect plastic material. FIG. 5B shows graph 510, which illustrates the temperature dependent copper yield stress. The elastic properties of copper used for the modeling were: E (Young's modulus)=121 GPa; ν (Poisson's ratio)=0.35 and α (coefficient of thermal expansion)=17 ppm/° C. It was also assumed that the system including the copper via and fused silica was in a stress-free state at 25° C. The modeling calculated stresses after a thermal cycle from 25° C. to 400° C. and back down to 25° C.

If the glass cracks, it will crack first where the first principal stress is largest, i.e., the "maximum first principal stress." With reference to FIG. 3, modeling showed the highest first principal stress at two points. First, there was a high maximum principal stress on the surface of substrate 100 along line 190, a short distance from the interface between adhesion layer 122 and substrate 100. This first point of high stress corresponds to a failure mechanism observed in the samples, microcracks in the surface.

Second, there was a high maximum principal stress at point 192, where adhesion layer 122 ends. This point essentially a crack tip. The type of solid mechanics based modeling used does not accurately predict behavior at crack tips due to singularity. An alternate model, fracture mechanics, is a better predictor of behavior. In any event, loss of helium hermeticity due to fracture along the interface between metal connector 150 and substrate 100 is not believed to be the primary failure mechanism.

Figure 6:
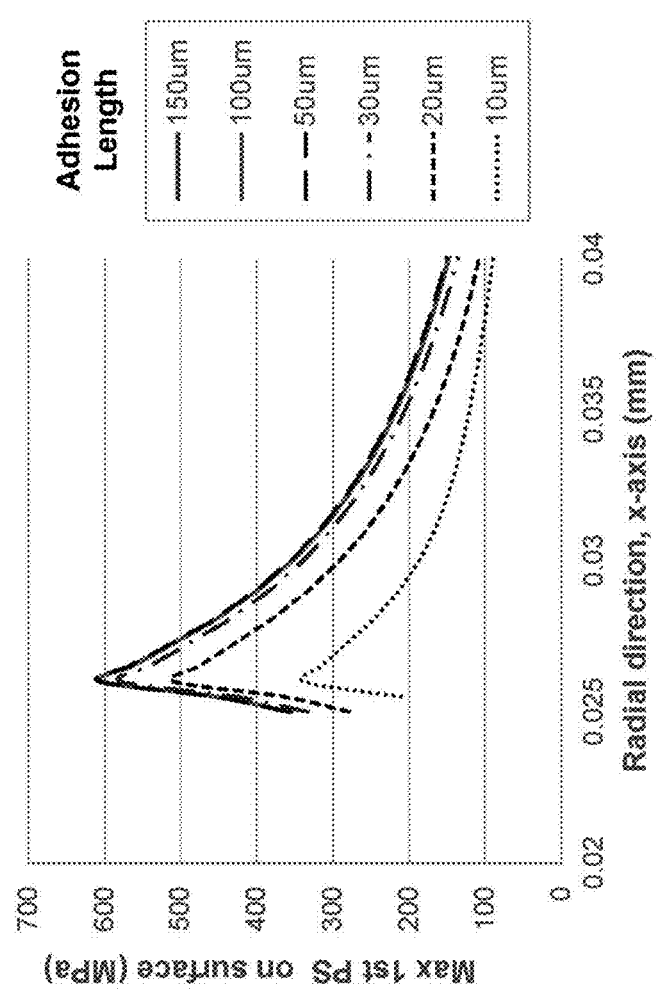
FIG. 6 shows a plot of maximum principal stress vs. radial position for different adhesion depths.

FIG. 6 shows a plot of modeled maximum principal stress vs. radial position along line 190 of FIG. 3 for different adhesion lengths. For the modeling of FIG. 6, coating thickness 158 was held constant at 10 μm. Table 1 shows the maximum first principal stress from each of the lines plotted in FIG. 6.

TABLE 1

| Adhesion depth from both surfaces | Max 1$^{st}$ Principal Stress on surface |
| --- | --- |
| 150 μm (full adhesion) | 602.76 MPa |
| 100 μm | 603.94 MPa |
| 50 μm | 607.02 MPa |
| 30 μm | 557.8 MPa |
| 10 μm | 338.77 MPa |

FIG. 6 and Table 1 show that the maximum principal stress corresponding to microcracks decreases as adhesion length decreases. Microcracks are expected when the maximum first principal stress of Table 1 exceeds a threshold value. If the fabricated real system was perfect without defects, such as flaws, scratches, and interior voids, and if the modeling were perfect, this threshold strength would be the tensile yield strength of glass. However, cracks may be generated at much lower stress than the tensile yield strength of glass because of defects of the system. And, the modeled values depend in part on model parameters such as mesh size. So, the values in Table 1 are significantly higher than the tensile yield strength. So, the values of Table 1 are useful to show trends and to demonstrate the surprising improvement achieved by the geometries described herein. The modeling also allows one of skill in the art to determine an adhesion length sufficiently short to reduce stress, while also enabling consideration of an adhesion length sufficiently large to provide a hermetic seal.

Figure 7:
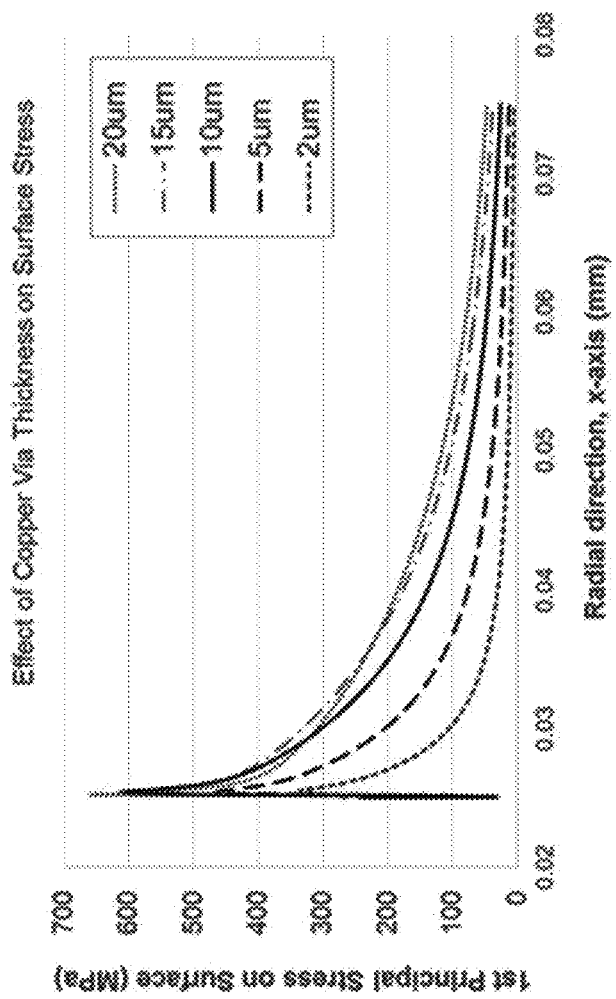
FIG. 7 shows a plot of maximum principal stress vs. radial position for different metal connector coating thicknesses.

FIG. 7 shows a plot of maximum principal stress vs. radial position along line 190 of FIG. 3 for different coating thicknesses 158. For the modeling of FIG. 6, adhesion length was held constant at 50 μm. Table 2 shows the maximum first principal stress from each of the lines plotted in FIG. 7.

TABLE 2

| Copper Coating Thickness | Max 1$^{st}$ Principal Stress on surface |
| --- | --- |
| 2 um | 336.48 MPa |
| 5 um | 465.96 MPa |
| 10 um | 607.02 MPa |
| 15 um | 622.45 MPa |
| 20 um | 651.83 MPa |

FIG. 7 and Table 2 show that the maximum principal stress corresponding to microcracks decreases as coating thickness 158 decreases. As with FIG. 6 and Table 1, the data of FIG. 7 and table 2 allow one of skill in the art to make informed choices about a metal connector parameter, in this case coating thickness 158. As with adhesion length, coating thickness should not be reduced too much, as some coating thickness is needed to form a hermetic seal, and to achieve the desired conductivity through metal connector 150.

More generally, Tables 1 and 2 illustrate that the maximum first principal stress may be reduced by including in the via structure a second axial portion where the metal connector is not adhered to the interior surface of the via, between first and third axial portions where the metal connector is adhered to the interior surface of the via.

Figure 8:
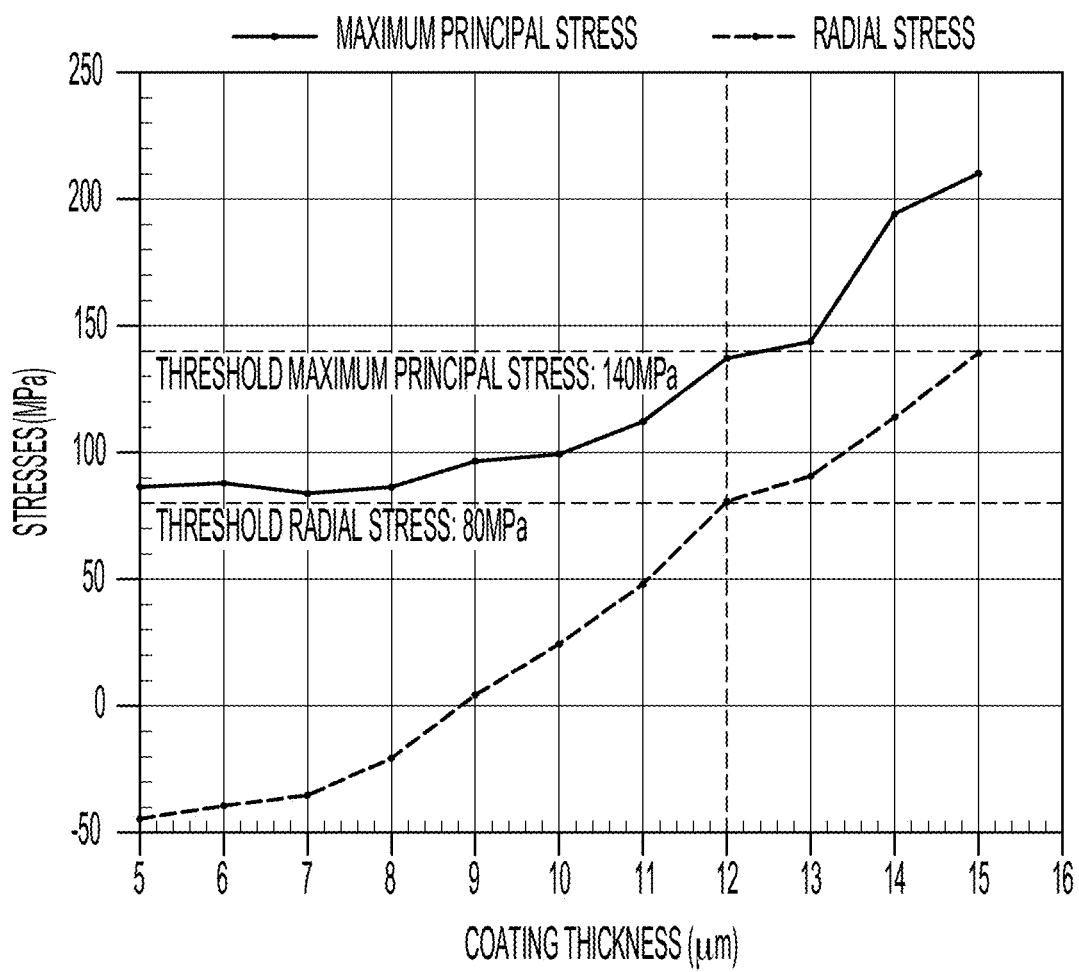
FIG. 8 shows a plot of the modeled first maximum principal stress and the modeled maximum radial stress (y-axis) for various copper coating thicknesses (x-axis)

Third, there was a maximum principal stress at a point where the helium hermetic adhesion layer 122 ends. This point is the dominant stress component to induce crack initiation and propagation. FIG. 8 shows a plot of modeled maximum first principal stress and maximum radial stress along line 190 for different copper wall thicknesses. As shown in FIG. 8, at a coating thickness of 12 μm, both the maximum first principal stress and maximum radial stress meet or exceed threshold values (140 MPa for maximum first principal stress and 80 MPa for maximum radial stress for the configurations depicted in FIGS. 2 and 3).

Figure 9:
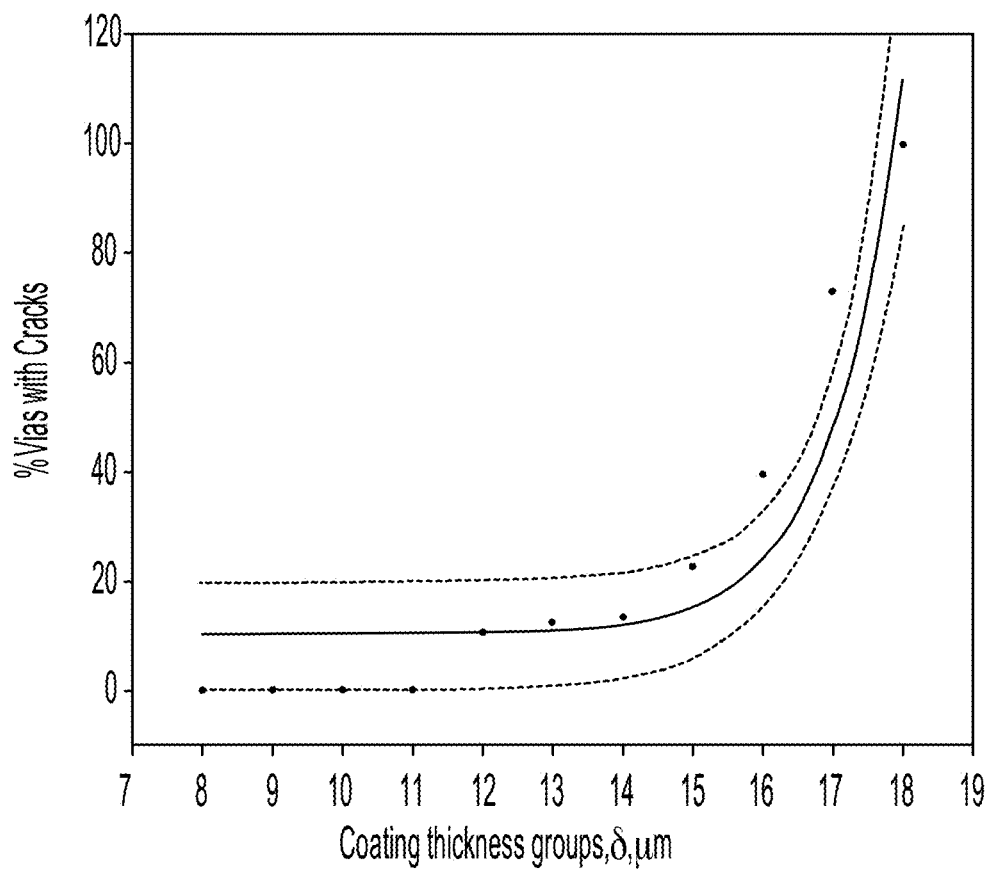
FIG. 9 shows a plot of the percentage of vias with cracks (y-axis) as a function of copper coating thickness (x-axis)

FIG. 9 shows a plot of the percentage of vias with cracks for different copper coating thicknesses after the wafer was annealed to a maximum temperature of 400° C., with the dashed lines representing 95% confidence boundaries for the regression fit. The coating thickness was measured at the first or second major surface, and groups were formed based on the integer of the coating thickness measurement. In other words, the group "8 μm" includes coating thicknesses of from 8.00 μm to 8.99 μm, the group "9 μm" includes coating thicknesses of from 9.00 μm to 9.99 μm, and so on. As shown in FIG. 9, cracking does not occur in vias until the coating thickness is greater than or equal to 12 μm. The modeling allows one of skill in the art to make informed choices about a metal connector parameter, in this case the coating thickness 158. The coating thickness should not be reduced too much, as some coating thickness is needed to form a hermetic seal, and to achieve the desired conductivity through the metal connector 150.

Figure 10A:
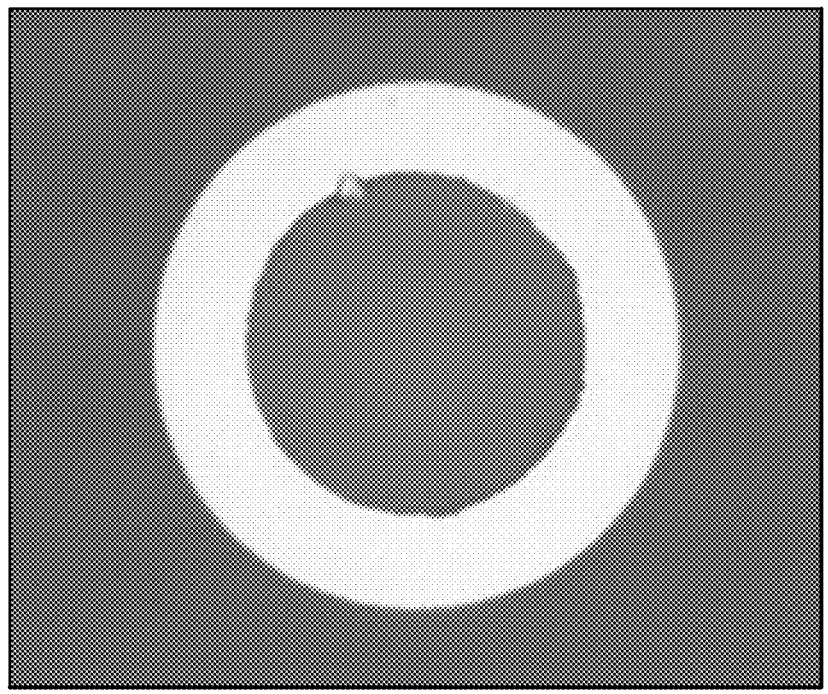
FIG. 10A shows an example via having a copper coating thickness of less than 12 μm and having no microcracks.
Figure 10B:
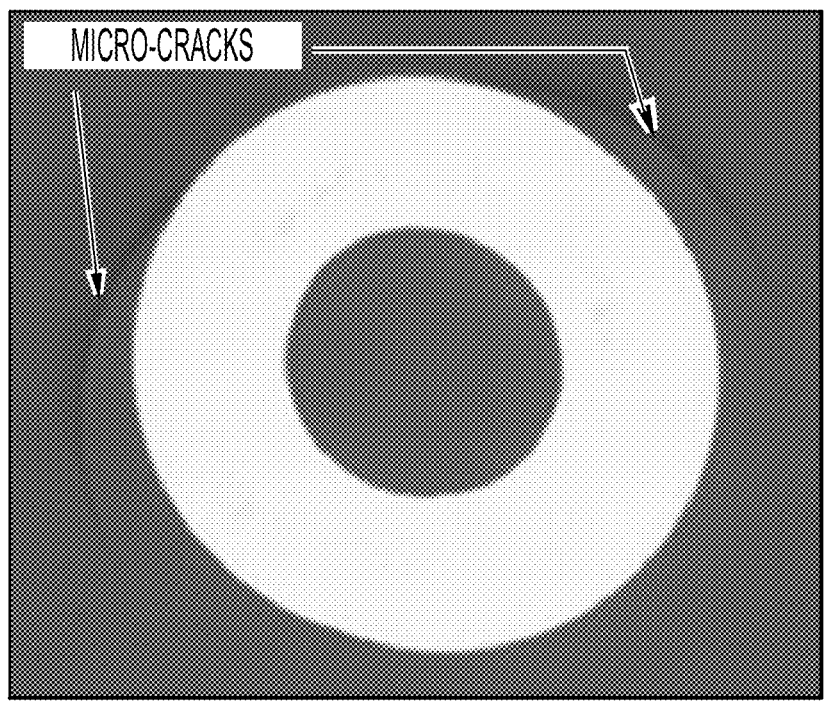
FIG. 10B shows an example via having a copper coating thickness of greater than or equal to 12 μm and exhibiting circumferential microcracks.
Figure 11:
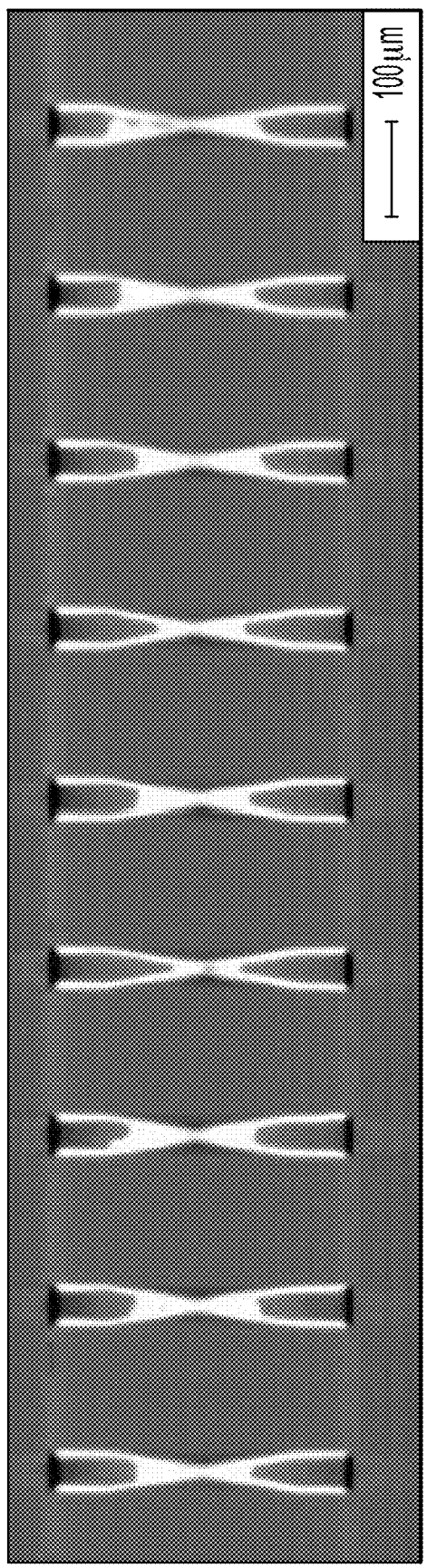
FIG. 11 is an X-ray CT scan of an example metallized TGV.
Figure 12A:
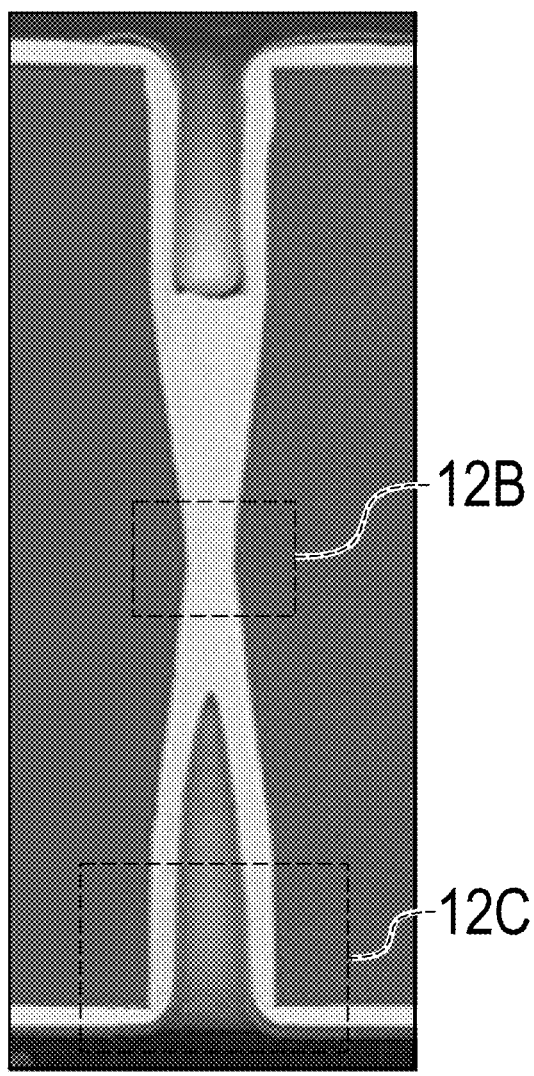
FIG. 12A depicts an SEM image of the example metallized TGV of FIG. 9 to validate the copper coating thickness profile.
Figure 12B:
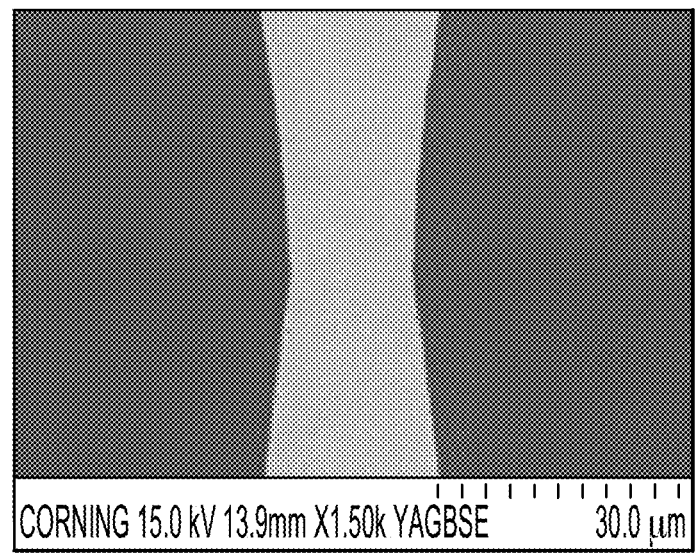
FIG. 12B depicts an SEM image of the waist of the example metallized TGV of FIG. 9 to validate the copper coating thickness profile.
Figure 12C:
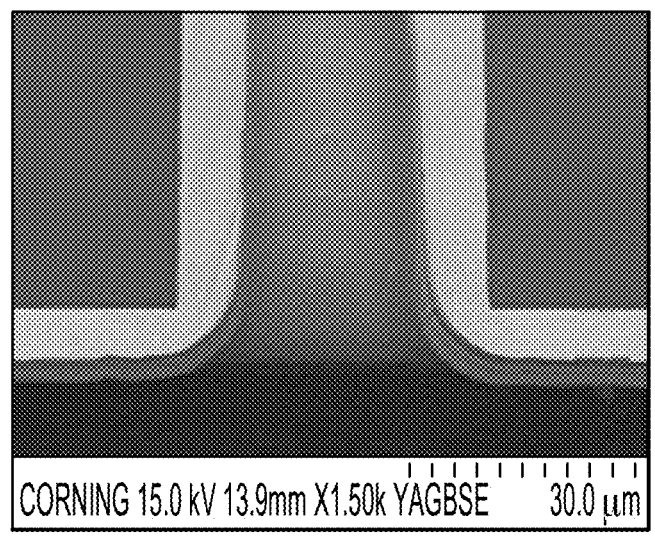
FIG. 12C depicts an SEM image of the entrance of the example metallized TGV of FIG. 9 to validate the copper coating thickness profile.

FIGS. 10A and 10B are cross-section images of metallized through-glass vias having different copper coating thicknesses. As shown in FIG. 10A, if the coating thickness of the copper is less than 12 μm, there are no cracks, whereas circumferential microcracks are shown in FIG. 10B, where the coating thickness of the copper is greater than or equal to 12 μm.

Radial Cracking

Glass and glass ceramic substrates with filled vias are often subject to thermal cycling. This thermal cycling may occur during device operation, or during fabrication steps subsequent to via filling. In some embodiments, for example, the glass substrate may be subjected to thermal cycling for annealing.

As described above, there is a large mismatch between the coefficient of thermal expansion (CTE) of copper and other metals, and the CTE of many glass and glass ceramic materials. Because of the CTE mismatch, upon heating, the metal connector expands more quickly than the surrounding glass or glass ceramic substrate. Similarly, upon cooling, the metal connector contracts more quickly than the surrounding substrate. This difference in expansion and contraction causes stress which can lead to a number of failure mechanisms, such as delamination or cracking. These failure mechanisms can cause loss of helium hermeticity and other problems.

Common practices to prevent the formation of cracks include using better CTE matching glass or glass ceramic compositions, use of annular or conformally plated through vias, lower annealing temperatures (usually <300° C., corresponding to the reflow temperature of lead-free solders), smaller hole sizes, or the use of metallization materials having with lower electrical conductivity than copper, but better CTE matching with the glass or glass ceramic. However, these solutions can limit the application of metallized through-holes. For instance, annular holes and small diameter holes, are not preferred for high current carrying applications, such as power devices, where thick layer of metallization is required. Also, for high frequency applications, high silica content glasses are generally used.

To address the above and other issues, processes according to embodiments disclosed and described herein comprise heating a glass or glass ceramic article comprising copper-metallized through vias from a first temperature to a second temperature, wherein the first temperature is greater than or equal to 200° C. and less than or equal to 300° C., and wherein the second temperature is greater than or equal to 350° C. and less than or equal to 450° C., wherein an average heating rate during the heating of the glass or glass ceramic article comprising copper-metallized through vias from the first temperature to the second temperature is greater than 0.0° C./min and less than 8.7° C./min. Embodiments also include a glass or glass ceramic article comprising a glass or glass ceramic substrate comprising at least one through via penetrating the glass or glass ceramic substrate in a thickness direction, and copper present in the at least one through via, wherein the glass or glass ceramic article does not comprise radial cracks.

Figure 13:
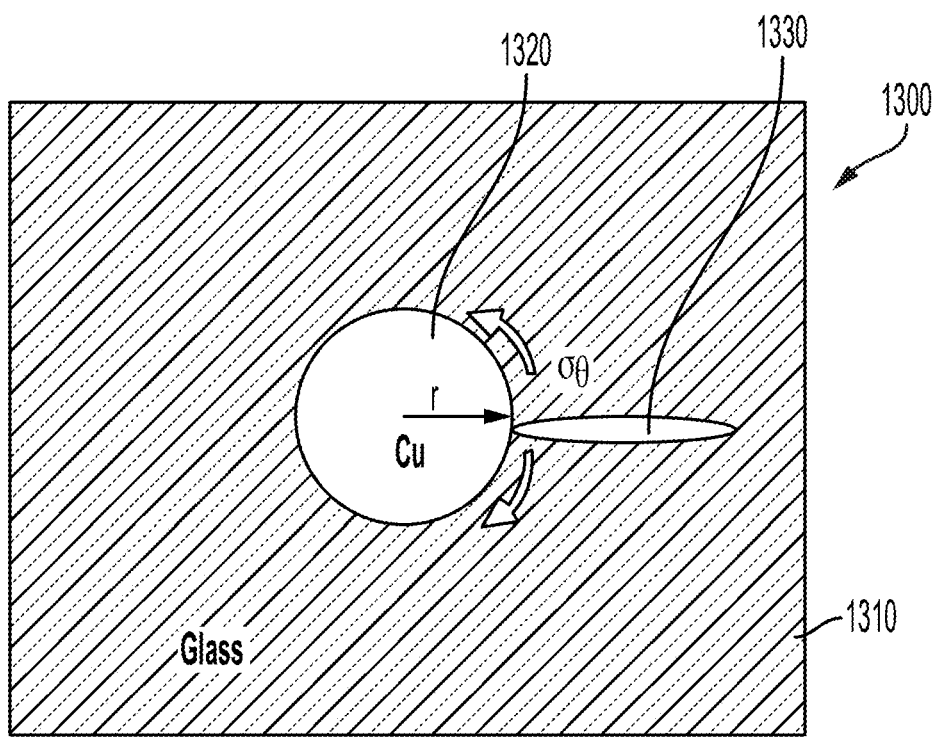
FIG. 13 schematically depicts a top view of a copper-metallized through via in a glass or glass ceramic substrate that comprises a radial crack.

As discussed above, and with reference to FIG. 13, embodiments of a glass or glass ceramic article 1300 comprise a glass or glass ceramic substrate 1320 and a copper-metallized through via 1320. The copper-metallized through via 1320 is cylindrical in shape and comprises a copper metal in at least a portion of the through via. It should be understood that any through via geometry can be used according to embodiments disclosed and described herein. Such geometries include, but are not limited to conical through vias, frustoconical through vias, or pinched through vias (e.g., through vias with an hour-glass type shape). The copper-metallized through via 1320 has a radius "r". The CTE mismatch between the glass or glass ceramic substrate 1310 and the CTE of the copper that is present in the through via may cause the formation of cracks 130 that extend in a radial direction from the copper-metallized through via 1320. These cracks 130 that extend in a radial direction from the copper-metallized through via 1320 are referred to herein as radial cracks. Without being bound by any particular theory, it is believed that as the glass or glass ceramic article 1300 comprising copper-metallized through vias is heated the relatively low expansion of the glass or glass ceramic substrate 1310 constrains the free expansion of the copper present in the copper-metallized through via 1320, such that high stresses are built up and radial cracks 1330 are formed in the glass or glass ceramic substrate 1310.

Although embodiments are directed to copper-metallized through vias, it should be understood that the processes disclosed and described herein may be used on through vias that are metallized with any metallic material. In particular, because processes disclosed and described herein are directed to glass and glass ceramic substrates having a CTE mismatch with the material present in a through via, radial cracks can be minimized or eliminated in glass or glass ceramic substrates having through vias that are metallized with any metal material.

Figure 14:
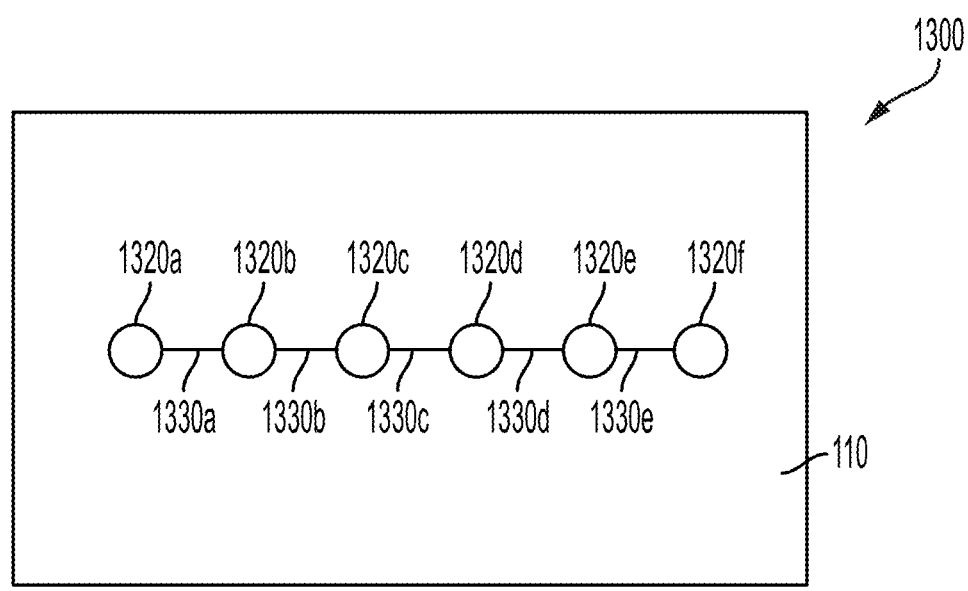
FIG. 14 schematically depicts a top view of a glass or glass ceramic article having a plurality of copper-metallized through vias that comprises radial cracks.

In some embodiments, and with reference now to FIG. 14, the glass or glass ceramic substrate 1310 may comprise a plurality of copper-metallized through vias 1320a-1320f that are positioned along a straight line in the glass or glass ceramic substrate 1310. In such a configuration, a plurality of radial cracks 1330a-1330e may be formed in the glass or glass ceramic substrate 1310 such that the radial cracks 1330a-1330e span the distance between adjacent copper-metallized through vias 1320a-1320f. For instance, a radial crack 1330a may extend between adjacent copper-metallized through vias 1320a and 1320b and a radial crack 1330b may extend between adjacent copper-metallized through vias 1320b and 1320c. In this way, radial cracks 1330a-1330e can, span between each of the copper-metallized through vias 1320a-1320f in the glass or glass ceramic substrate 1310.

As mentioned above, stresses present in the glass or glass ceramic article 1300 with copper-metallized through vias may cause radial cracks 1330 to form upon heating the glass or glass ceramic article 1300. These stresses that may cause the radial cracks 1330 can be approximated theoretically as shown below and, according to embodiments disclosed and described herein, processes that control the stresses and minimize or eliminate radial cracks in the glass or glass ceramic article 1300 with copper-metallized through vias can be developed.

Because the copper-metallized through vias 1320 in the glass or glass ceramic substrate 1310 are generally cylindrical and are encased by a glass or glass ceramic matrix, the stresses in glass or glass ceramic can be determined using Lame's thick/solid wall cylinder equation, where the in-plane stresses—radial and circumferential stresses—are equal but opposite at the central region of the glass or glass ceramic thickness as shown in the following equation:

$$\sigma_r = -\sigma_\theta$$

where $\sigma_r$ is the radial stress and $\sigma_\theta$ is the circumferential (or hoop) stress.

Figure 15:
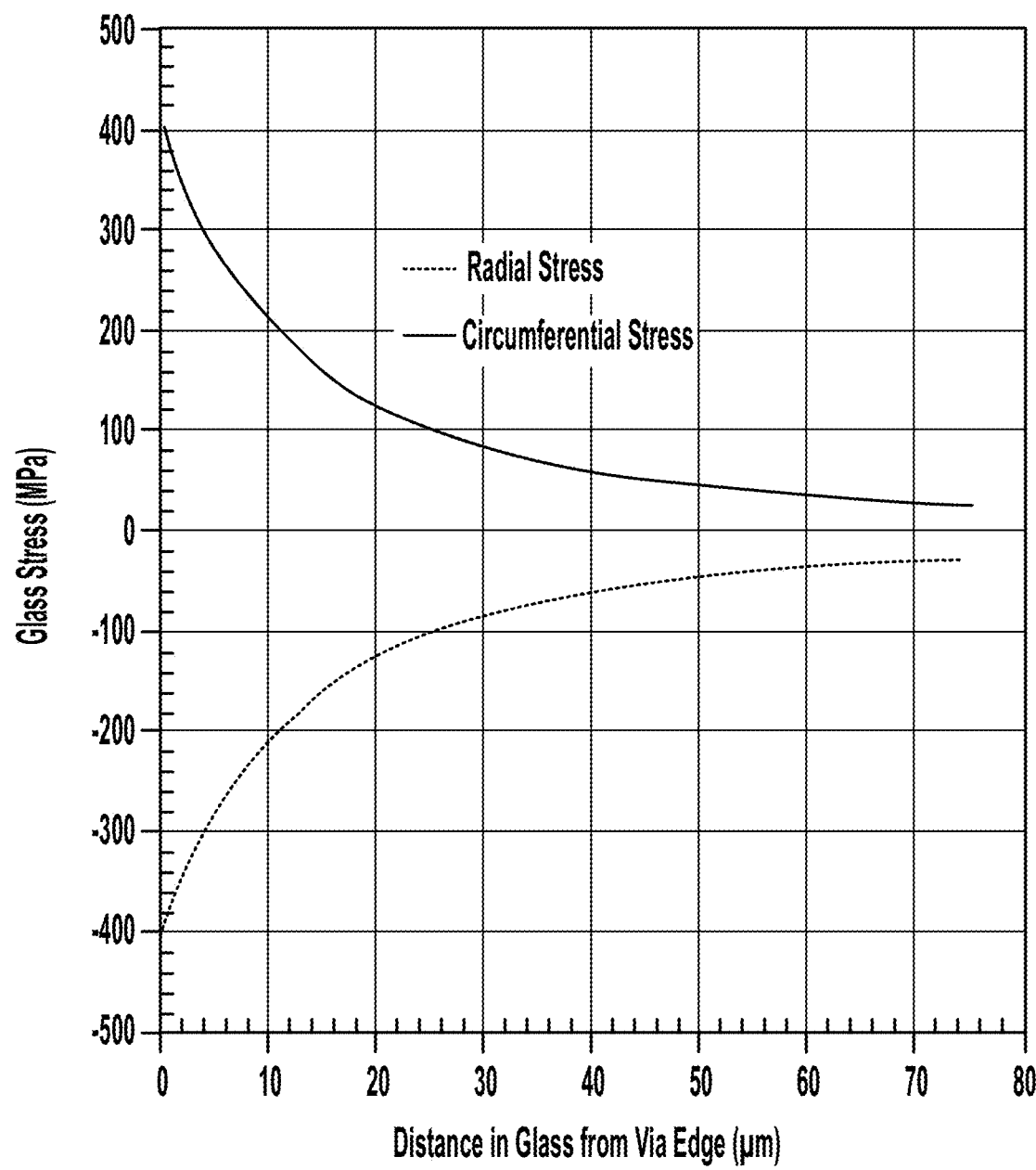
FIG. 15 graphically depicts radial stress and circumferential stress that occur during heating a glass or glass ceramic article comprising copper-metallized through vias.

The in-plane thermo-mechanical stresses in glass or glass ceramic surrounding a single copper via can be calculated using the following equation with exemplary values that follow:

$$\sigma_r = -\sigma_\theta = \left[ \frac{-E_{Cu}(\alpha_{Cu} - \alpha_{glass})\Delta T}{(1 - 2\nu_{Cu}) + \left(\frac{1 + \nu_{glass}}{1 + \nu_{Cu}}\right)\left(\frac{E_{Cu}}{E_{glass}}\right)} \left(\frac{D_{Cu}}{2r}\right)^2 \right]$$

where $\alpha_{Cu}$ is the CTE for copper (16.7 ppm/° C.); $\alpha_{glass}$ is the CTE of glass or glass ceramic (0.6 ppm/° C.); $\nu_{glass}$ and $\nu_{Cu}$ are the Poisson ratios for the glass or glass ceramic (0.26) and copper (0.35), respectively; r is the distance in glass or glass ceramic from the center of the hole. This means that at the interface between the glass or glass ceramic substrate and the copper, r is the radius of the metallized through via. $D_{Cu}$ is the diameter of the through via (50 μm); $E_{Cu}$ and $E_{glass}$ are the elastic modulus of copper (120 GPa) and the glass or glass ceramic (70 GPa), respectively; and ΔT is the change in temperature. Using equation 2 and the values provided above for copper and glass or glass ceramic, the stress in a glass or glass ceramic substrate during heating from room temperature (about 25° C.) to a maximum temperature can be calculated; where copper and glass or glass ceramic are assumed to be elastic materials. The calculated glass or glass ceramic stresses from the through via edge is presented in FIG. 3, where it is shown that the circumferential and the radial stresses are equal in magnitude but opposite in direction. In FIG. 15, the tensile circumferential stress in glass or glass ceramic is expected to be a primary cause for the formation of radial cracks during heating, as cracks are known to form due to tensile stress field. The maximum stresses occur at the edge of the via, which exponentially decays away from the through via edge, where the through via is not closely adjacent to another through via.

Figure 16:
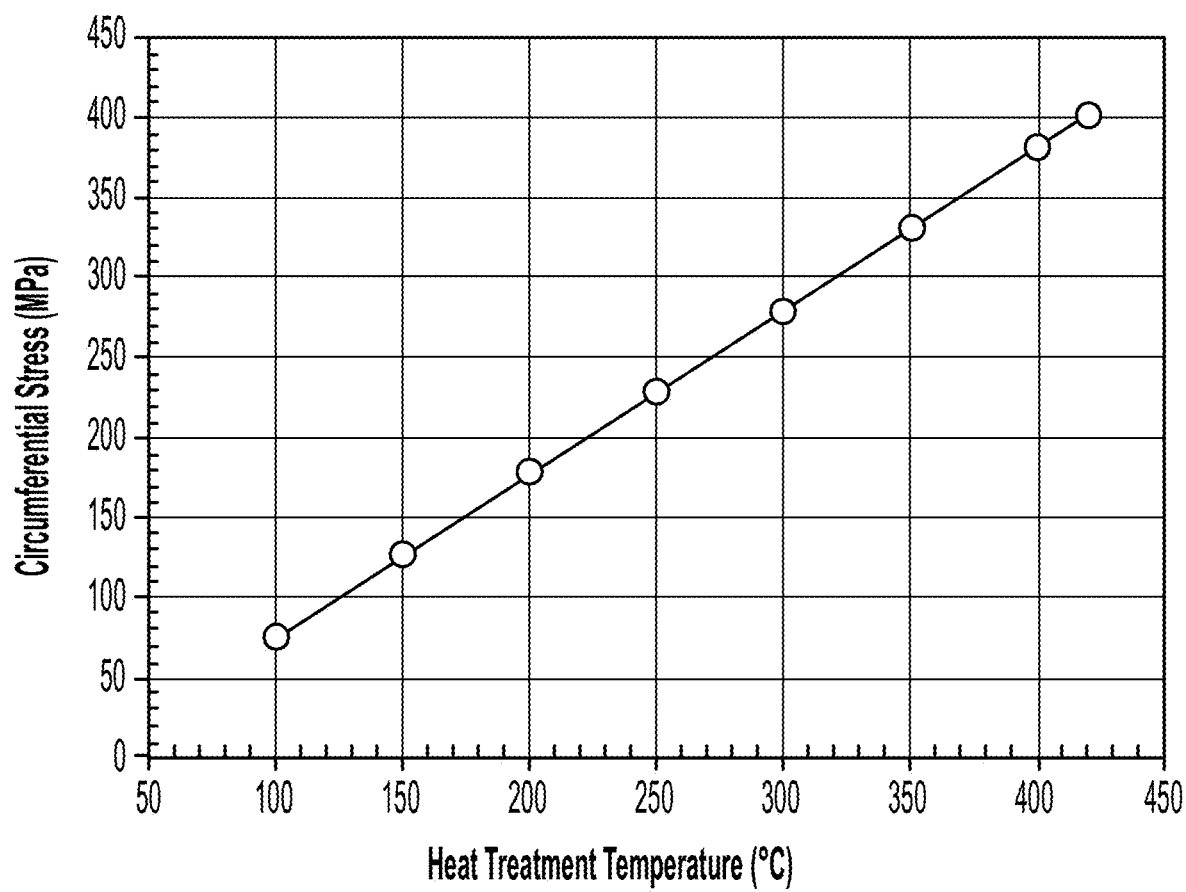
FIG. 16 graphically depicts circumferential stress versus heat treatment temperature for heating a glass or glass ceramic article comprising copper-metallized through vias.

The equation immediately above can be used to determine the maximum tensile circumferential stress value as a function of temperature. FIG. 16 shows a plot of heat treatment temperature (° C.) versus circumferential stress (MPa). The plot in FIG. 16 shows that an increase in the temperature during a heat treatment results in an essentially linear increase in circumferential stress, which shows that the probability for forming radial cracks increases as the temperature of a heat treatment increases. Thus, at higher temperatures, radial cracks are more likely to occur.

Using the above equations and analysis, processes for heating glass or glass ceramic articles comprising copper-metallized through vias according to embodiments disclosed and described herein were formulated that minimize or eliminate the formation of radial cracks in glass or glass ceramic articles comprising copper-metallized through vias. Without being bound by any particular theory, it is believed that using a low average heating rate during high-temperature portions of the heat treatment allows for stress relaxation mechanisms to activate which minimizes the effects of the higher circumferential stress present at high temperatures, thereby reducing or eliminating the formation of radial cracks in the glass or glass ceramic article comprising copper-metallized through vias.

Processes for heating glass or glass ceramic articles comprising copper-metallized through vias according to embodiments will now be described. As mentioned above, using the above equation, it was determined that circumferential stress in glass or glass ceramic articles comprising copper-metallized through vias—which may lead to the formation of radial cracks—increases as heat treatment temperatures increase. Accordingly, it was determined that in processes for heating glass or glass ceramic articles comprising copper-metalized through vias according to embodiments, there is a first temperature at which the probability of radial crack formation becomes significant, and the average heating rate above this first temperature is controlled to be a low average heating rate, thereby reducing or minimizing the formation of radial cracks. According to some embodiments, the heating rate at temperatures below this first temperature does not need to be limited. Thus, the glass or glass ceramic article comprising copper-metallized through vias can be heated to the first temperature using any average heating rate. Therefore, embodiments of processes for heating glass or glass ceramic articles comprising copper-metallized through vias are directed to controlling the average heating rate during the process where the temperature of the glass or glass ceramic article comprising the copper-metallized through vias is greater than or equal to the first temperature and less than or equal to a second temperature where heat treatments are usually concluded. It should be understood that the temperatures disclosed herein refer to the measured atmospheric temperature of the device used to heat the glass or glass ceramic article comprising copper-metallized through vias, such as an oven, furnace, kiln, lehr, or the like.

Using this information, heat treatments were conducted on glass or glass ceramic articles comprising copper-metallized through vias to determine the temperature at which radial cracks form. Through visual observation of the various heat treatments, it was found that the probability that radial cracks will form significantly increases at temperatures greater than or equal to 200° C., such as at temperatures greater than or equal to 210° C., temperatures greater than or equal to 220° C., temperatures greater than or equal to 230° C., temperatures greater than or equal to 240° C., temperatures greater than or equal to 250° C., temperatures greater than or equal to 260° C., temperatures greater than or equal to 270° C., temperatures greater than or equal to 280° C., or temperatures greater than or equal to 290° C. Accordingly, in processes for heating a glass or glass ceramic article comprising copper-metallized through vias according to embodiments, the heating rate at temperatures below the first temperature do not need to be controlled because the probability of radial crack formation at temperatures below the first temperature is low. In embodiments, the first temperature is greater than or equal to 200° C. and less than or equal to 300° C., such as greater than or equal to 210° C. and less than or equal to 300° C., greater than or equal to 220° C. and less than or equal to 300° C., greater than or equal to 230° C. and less than or equal to 300° C., greater than or equal to 240° C. and less than or equal to 300° C., greater than or equal to 250° C. and less than or equal to 300° C., greater than or equal to 260° C. and less than or equal to 300° C., greater than or equal to 270° C. and less than or equal to 300° C., greater than or equal to 280° C. and less than or equal to 300° C., or greater than or equal to 290° C. and less than or equal to 300° C. In some embodiments, the first temperature is greater than or equal to 200° C. and less than or equal to 290° C., such as greater than or equal to 200° C. and less than or equal to 280° C., greater than or equal to 200° C. and less than or equal to 270° C., greater than or equal to 200° C. and less than or equal to 260° C., greater than or equal to 200° C. and less than or equal to 250° C., greater than or equal to 200° C. and less than or equal to 240° C., greater than or equal to 200° C. and less than or equal to 230° C., greater than or equal to 200° C. and less than or equal to 220° C., or greater than or equal to 200° C. and less than or equal to 210° C. In some embodiments, the first temperature is greater than or equal to 220° C. and less than or equal to 280° C., such as greater than or equal to 225° C. and less than or equal to 275° C., or greater than or equal to 240° C. and less than or equal to 260° C.

The probability for radial crack formation in glass or glass ceramic articles having copper-metallized through vias is high from the first temperature, which are mentioned above, to a second temperature where heat treatments generally are concluded. In embodiments, the second temperature is greater than or equal to 350° C. and less than or equal to 450° C., such as greater than or equal to 360° C. and less than or equal to 450° C., greater than or equal to 370° C. and less than or equal to 450° C., greater than or equal to 380° C. and less than or equal to 450° C., greater than or equal to 390° C. and less than or equal to 450° C., greater than or equal to 400° C. and less than or equal to 450° C., greater than or equal to 410° C. and less than or equal to 450° C., greater than or equal to 420° C. and less than or equal to 450° C., greater than or equal to 430° C. and less than or equal to 450° C., or greater than or equal to 440° C. and less than or equal to 450° C. In some embodiments, the second temperature is greater than or equal to 350° C. and less than or equal to 440° C., such as greater than or equal to 350° C. and less than or equal to 430° C., greater than or equal to 350° C. and less than or equal to 420° C., greater than or equal to 350° C. and less than or equal to 410° C., greater than or equal to 350° C. and less than or equal to 400° C., greater than or equal to 350° C. and less than or equal to 390° C., greater than or equal to 350° C. and less than or equal to 380° C., greater than or equal to 350° C. and less than or equal to 370° C., or greater than or equal to 350° C.

and less than or equal to 360° C. In embodiments the second temperature is greater than or equal to 375° C. and less than or equal to 450° C., such as greater than or equal to 375° C. to less than or equal to 425° C.

As mentioned above, processes for heating glass or glass ceramic articles comprising copper-metallized through vias according to embodiments disclosed and described herein control the average heating rate when the glass or glass ceramic article comprising copper-metallized through vias is at temperatures greater than or equal to the first temperature and less than or equal to the second temperature—where the probability for crack formation is high. As used herein, the average heating rate is the difference between the second temperature and the first temperature divided by the amount of time it takes to heat the glass or glass ceramic article comprising copper-metallized through vias from the first temperature to the second temperature. Thus, the average heating rate, as used herein, includes any temperature holds where the glass or glass ceramic article comprising copper-metallized through vias is at a temperature greater than or equal to the first temperature and less than or equal to the second temperature. As an example, if a glass or glass ceramic article comprising copper-metallized through vias is heated from a first temperature of 300° C. to 350° C. in 10 minutes, held at 350° C. for 10 minutes and then heated from 350° C. to the second temperature of 400° C. in 10 minutes, the average heating rate is 3.33° C./min $$\left(\text{i.e., } \frac{400° \text{ C.} - 300° \text{ C.}}{30 \text{ min}}\right).$$

In embodiments, the average heating rate from the first temperature to the second temperature is greater than 0.0° C./min and less than 8.7° C./min, such as greater than 0.0° C./min and less than or equal to 8.5° C./min, greater than 0.0° C./min and less than or equal to 8.2° C./min, greater than 0.0° C./min and less than or equal to 8.0° C./min, greater than 0.0° C./min and less than or equal to 7.8° C./min, greater than 0.0° C./min and less than or equal to 7.5° C./min, greater than 0.0° C./min and less than or equal to 7.2° C./min, greater than 0.0° C./min and less than or equal to 7.0° C./min, greater than 0.0° C./min and less than or equal to 6.8° C./min, greater than 0.0° C./min and less than or equal to 6.5° C./min, greater than 0.0° C./min and less than or equal to 6.2° C./min, greater than 0.0° C./min and less than or equal to 6.0° C./min, greater than 0.0° C./min and less than or equal to 5.8° C./min, greater than 0.0° C./min and less than or equal to 5.5° C./min, greater than 0.0° C./min and less than or equal to 5.2° C./min, or greater than 0.0° C./min and less than or equal to 5.0° C./min. In some embodiments, the average heating rate from the first temperature to the second temperature is greater than or equal to 2.0° C./min and less than 8.7° C./min, such as greater than or equal to 2.2° C./min and less than 8.7° C./min, greater than or equal to 2.5° C./min and less than 8.7° C./min, greater than or equal to 2.8° C./min and less than 8.7° C./min, greater than or equal to 3.0° C./min and less than 8.7° C./min. In embodiments, the average heating rate from the first temperature to the second temperature is greater than or equal to 2.0° C./min and less than or equal to 6.5° C./min, such as greater than or equal to 2.2° C./min and less than or equal to 6.5° C./min, greater than or equal to 2.5° C./min and less than or equal to 6.5° C./min, greater than or equal to 2.8° C./min and less than 6.5° C./min, or greater than or equal to 3.0° C./min and less than 6.5° C./min. Heating of the glass or glass ceramic article comprising copper-metallized through vias from the first temperature to the second temperature at the above average heating rates does not cause radial cracks in the glass or glass ceramic article comprising copper-metallized through vias.

According to some embodiments, the heating rate from the first temperature to the second temperature is kept substantially constant such that a uniform heating rate is used in the entire temperature range from the first temperature to the second temperature. As used herein, a substantially constant heating rate refers to a heating rate that is maintained as close the heating rate set point as can be controlled by the device used to heat the glass or glass ceramic article comprising the copper-metallized through vias. For instance, it may be determined that the heating rate in a temperature range from the first temperature to the second temperature should be constant and set at 6.5° C./min. However, given inherent inconsistencies and inefficiencies in the device used to heat the glass or glass ceramic article comprising copper-metallized through vias, the heating rate may decrease to, for example, 6.2° C./min or increase to, for example 6.8° C./min even though the heating rate is intended to be constant at 6.5° C./min. As used herein, this situation would be a "substantially constant" heating rate. In some embodiments, the heating rate from the first temperature to the second temperature may be variable. As used herein, a "variable" heating rate refers to a heating rate that is intentionally changed in a temperature range from the first temperature to the second temperature. An example of an embodiment having a variable heating rate would be where the glass or glass ceramic article comprising copper-metallized through vias is heated from the first temperature of 300° C. to a temperature of 350° C. at a heating rate of 6.5° C./min and then intentionally heated from 350° C. to a second temperature of 400° C. at a heating rate of 2.3° C./min.

Although, in embodiments, the average heating rate where the glass or glass ceramic article comprising copper-metallized through vias is at a temperature from room temperature (about 25° C.) to the first temperature is not limited, in some embodiments the average heating rate the average heating rate where the glass or glass ceramic article comprising copper-metallized through vias is at a temperature from room temperature (about 25° C.) to the first temperature is also kept low to help ensure that radial cracks do not form. Accordingly, in embodiments, the average heating rate from room temperature to the first temperature is greater than 0.0° C./min and less than 8.7° C./min, such as greater than 0.0° C./min and less than or equal to 8.5° C./min, greater than 0.0° C./min and less than or equal to 8.2° C./min, greater than 0.0° C./min and less than or equal to 8.0° C./min, greater than 0.0° C./min and less than or equal to 7.8° C./min, greater than 0.0° C./min and less than or equal to 7.5° C./min, greater than 0.0° C./min and less than or equal to 7.2° C./min, greater than 0.0° C./min and less than or equal to 7.0° C./min, greater than 0.0° C./min and less than or equal to 6.8° C./min, greater than 0.0° C./min and less than or equal to 6.5° C./min, greater than 0.0° C./min and less than or equal to 6.2° C./min, greater than 0.0° C./min and less than or equal to 6.0° C./min, greater than 0.0° C./min and less than or equal to 5.8° C./min, greater than 0.0° C./min and less than or equal to 5.5° C./min, greater than 0.0° C./min and less than or equal to 5.2° C./min, or greater than 0.0° C./min and less than or equal to 5.0° C./min. In some embodiments, the average heating rate from room temperature to the first temperature is greater than or equal to 1.0° C./min and less than 8.7°

C./min, such as greater than or equal to 2.0° C./min and less than 8.7° C./min, greater than or equal to 2.5° C./min and less than 8.7° C./min, greater than or equal to 2.8° C./min and less than 8.7° C./min, greater than or equal to 3.0° C./min and less than 8.7° C./min. In embodiments, the average heating rate from room temperature to the first temperature is greater than or equal to 1.0° C./min and less than or equal to 6.5° C./min, such as greater than or equal to 2.0° C./min and less than or equal to 6.5° C./min, greater than or equal to 2.2° C./min and less than 6.5° C./min, greater than or equal to 2.5° C./min and less than 6.5° C./min, greater than or equal to 2.7° C./min and less than 6.5° C./min, or greater than or equal to 3.0° C./min and less than 6.5° C./min.

As mentioned above, processes for heating a glass or glass ceramic article comprising copper-metallized through vias from the first temperature to the second temperature may include various temperature holds, where the temperature is held constant for a period of time. Without being bound to any particular theory, it is believed that by holding the glass or glass ceramic article comprising copper-metallized through vias at a constant temperature, relaxation occurs during the temperature hold, and the stress in the glass or glass ceramic article comprising copper-metallized through vias may decrease. Accordingly, if a temperature hold is conducted before crack formation occurs, relaxation resulting from the temperature hold may reduce the stresses in the glass or glass ceramic article comprising copper-metallized through vias enough that there is no crack formation. In addition, temperature holds may be used at one or more of the first temperature and the second temperature to allow the stresses in the glass or glass ceramic article comprising copper-metallized through vias to relax.

In embodiments, the glass or glass ceramic article comprising copper-metallized through vias may be held at the first temperature for a duration greater than or equal to ten (10) minutes and less than or equal to 120 minutes, such as greater than or equal to fifteen (15) minutes and less than or equal to 120 minutes, greater than or equal to thirty (30) minutes and less than or equal to 120 minutes, greater than or equal to forty five (45) minutes and less than or equal to 120 minutes, greater than or equal to sixty (60) minutes and less than or equal to 120 minutes, greater than or equal to seventy five (75) minutes and less than or equal to 120 minutes, greater than or equal to ninety (90) minutes and less than or equal to 120 minutes, or greater than or equal to 105 minutes and less than or equal to 120 minutes. In embodiments, the glass or glass ceramic article comprising copper-metallized through vias may be held at the first temperature for a duration greater than or equal to ten (10) minutes and less than or equal to 105 minutes, such as greater than or equal to ten (10) minutes and less than or equal to ninety (90) minutes, greater than or equal to ten (10) minutes and less than or equal to seventy five (75) minutes, greater than or equal to ten (10) minutes and less than or equal to sixty (60) minutes, greater than or equal to ten (10) minutes and less than or equal to forty five (45) minutes, greater than or equal to ten (10) minutes and less than or equal to thirty (30) minutes, or greater than or equal to ten (10) minutes and less than or equal to fifteen (15) minutes.

In embodiments, the glass or glass ceramic article comprising copper-metallized through vias may be held at the second temperature for a duration greater than or equal to ten (10) minutes and less than or equal to 120 minutes, such as greater than or equal to fifteen (15) minutes and less than or equal to 120 minutes, greater than or equal to thirty (30) minutes and less than or equal to 120 minutes, greater than or equal to forty five (45) minutes and less than or equal to 120 minutes, greater than or equal to sixty (60) minutes and less than or equal to 120 minutes, greater than or equal to seventy five (75) minutes and less than or equal to 120 minutes, greater than or equal to ninety (90) minutes and less than or equal to 120 minutes, or greater than or equal to 105 minutes and less than or equal to 120 minutes. In embodiments, the glass or glass ceramic article comprising copper-metallized through vias may be held at the second temperature for a duration greater than or equal to ten (10) minutes and less than or equal to 105 minutes, such as greater than or equal to ten (10) minutes and less than or equal to ninety (90) minutes, greater than or equal to ten (10) minutes and less than or equal to seventy five (75) minutes, greater than or equal to ten (10) minutes and less than or equal to sixty (60) minutes, greater than or equal to ten (10) minutes and less than or equal to forty five (45) minutes, greater than or equal to ten (10) minutes and less than or equal to thirty (30) minutes, or greater than or equal to ten (10) minutes and less than or equal to fifteen (15) minutes.

In embodiments, the glass or glass ceramic article comprising copper-metallized through vias may be held at a constant temperature between the first temperature and the second temperature for a duration greater than or equal to ten (10) minutes and less than or equal to 120 minutes, such as greater than or equal to fifteen (15) minutes and less than or equal to 120 minutes, greater than or equal to thirty (30) minutes and less than or equal to 120 minutes, greater than or equal to forty five (45) minutes and less than or equal to 120 minutes, greater than or equal to sixty (60) minutes and less than or equal to 120 minutes, greater than or equal to seventy five (75) minutes and less than or equal to 120 minutes, greater than or equal to ninety (90) minutes and less than or equal to 120 minutes, or greater than or equal to 105 minutes and less than or equal to 120 minutes. In embodiments, the glass or glass ceramic article comprising copper-metallized through vias may be held at a constant temperature between the first temperature and the second temperature for a duration greater than or equal to ten (10) minutes and less than or equal to 105 minutes, such as greater than or equal to ten (10) minutes and less than or equal to ninety (90) minutes, greater than or equal to ten (10) minutes and less than or equal to seventy five (75) minutes, greater than or equal to ten (10) minutes and less than or equal to sixty (60) minutes, greater than or equal to ten (10) minutes and less than or equal to forty five (45) minutes, greater than or equal to ten (10) minutes and less than or equal to thirty (30) minutes, or greater than or equal to ten (10) minutes and less than or equal to fifteen (15) minutes.

Although processes disclosed herein may be used on glass or glass ceramic articles comprising any sized copper-metallized through vias, the processes disclosed herein may be particularly suitable for use on glass or glass ceramic articles comprising relatively small copper-metallized through vias. In embodiments, the copper-metallized through vias may have a diameter greater than or equal to 25 µm and less than or equal to 75 µm, such as greater than or equal to 30 µm and less than or equal to 70 µm, greater than or equal to 35 µm and less than or equal to 70 µm, greater than or equal to 40 µm and less than or equal to 70 µm, greater than or equal to 45 µm and less than or equal to 70 µm, greater than or equal to 50 µm and less than or equal to 70 µm, greater than or equal to 55 µm and less than or equal to 70 µm, greater than or equal to 60 µm and less than or equal to 70 µm, or greater than or equal to 65 µm and less than or equal to 70 µm. In embodiments, the copper-metallized through vias may have a diameter greater than or equal to 25 µm and less than or equal to 65 µm, such as greater than or equal to 25 µm and less than or equal to 60 µm, greater than or equal to 25 µm and less than or equal to 55 µm, greater than or equal to 25 µm and less than or equal to 50 µm, greater than or equal to 25 µm and less than or equal to 45 µm, greater than or equal to 25 µm and less than or equal to 40 µm, greater than or equal to 25 µm and less than or equal to 35 µm, or greater than or equal to 25 µm and less than or equal to 30 µm. In embodiments, the copper-metallized through vias may have a diameter greater than or equal to 35 µm and less than or equal to 65 µm, such as greater than or equal to 40 µm and less than or equal to 60 µm.

It should be understood that the processes disclosed and described herein may be used with through vias having any pitch. Specifically, by heating glass or glass ceramic articles according to embodiments disclosed and described herein, radial cracking can be minimized or eliminated regardless of the pitch of the through vias. Further, the pitch of the through vias will depend on the diameter of the through vias in the substrate. However, in some embodiments, where the diameter of the through vias is about 50 µm, the copper-metallized through vias may have a pitch greater than or equal to 60 µm and less than or equal to 800 µm, such as greater than or equal to 100 µm and less than or equal to 750 µm, greater than or equal to 150 µm and less than or equal to 700 µm, greater than or equal to 200 µm and less than or equal to 650 µm, greater than or equal to 250 µm and less than or equal to 600 µm, greater than or equal to 300 µm and less than or equal to 550 µm, greater than or equal to 350 µm and less than or equal to 500 µm, or greater than or equal to 400 µm and less than or equal to 450 µm. In embodiments, the copper-metallized through vias may have a pitch greater than or equal to 60 µm and less than or equal to 140 µm, such as greater than or equal to 60 µm and less than or equal to 130 µm, greater than or equal to 60 µm and less than or equal to 120 µm, greater than or equal to 60 µm and less than or equal to 110 µm, greater than or equal to 60 µm and less than or equal to 100 µm, greater than or equal to 60 µm and less than or equal to 90 µm, greater than or equal to 60 µm and less than or equal to 80 µm, or greater than or equal to 60 µm and less than or equal to 70 µm.

It should be understood that the processes disclosed and described herein may be used with through vias having any depth. Specifically, by heating glass or glass ceramic articles according to embodiments disclosed and described herein, radial cracking can be minimized or eliminated regardless of the depth of the through vias. However, in some embodiments, the copper-metallized through vias may have a depth greater than or equal to 50 µm and less than or equal to 600 µm, such as greater than or equal to 75 µm and less than or equal to 575 µm, greater than or equal to 100 µm and less than or equal to 550 µm, greater than or equal to 125 µm and less than or equal to 525 µm, greater than or equal to 150 µm and less than or equal to 500 µm, greater than or equal to 175 µm and less than or equal to 475 µm, greater than or equal to 200 µm and less than or equal to 450 µm, greater than or equal to 225 µm and less than or equal to 425 µm, greater than or equal to 250 µm and less than or equal to 400 µm, greater than or equal to 275 µm and less than or equal to 375 µm, or greater than or equal to 300 µm and less than or equal to 350 µm. In embodiments, the copper-metallized through vias may have a depth greater than or equal to 200 µm and less than or equal to 400 µm, such as greater than or equal to 200 µm and less than or equal to 375 µm, greater than or equal to 200 µm and less than or equal to 350 µm, greater than or equal to 200 µm and less than or equal to 325 µm, greater than or equal to 200 µm and less than or equal to 300 µm, greater than or equal to 200 µm and less than or equal to 275 µm, greater than or equal to 200 µm and less than or equal to 250 µm, or greater than or equal to 200 µm and less than or equal to 225 µm.

Glass or glass ceramic articles comprising copper-metallized through vias made according to processes disclosed and described herein may be free of radial cracks after the heat treatment when viewed at 50× magnification or more.

Helium Hermeticity of Through Vias

Various embodiments comprising structures and methods that can be combined to improve the helium hermeticity of glass or glass ceramic substrates comprising filled through vias. For example, using substrates having the via shape, partial adhesion, conformal coating (including the thickness of the conformal coating), partial adhesion, thermal cycling, and metal connector described above can improve the helium hermeticity of glass or glass ceramic substrates comprising vias. The helium hermeticity that is achieved by combining the above embodiments is a significant improvement over the helium hermeticity of conventional glass or glass ceramic substrates comprising vias.

To test the helium hermeticity of glass or glass ceramic substrates with filled through, thermal shock testing and highly accelerated stress tests (HAST) were conducted. The thermal shock tests used herein involve cooling the glass or glass ceramic substrates to −40° C. and then rapidly heating the glass or glass ceramic substrates to 125° C. This comprises one "cycle" of the thermal shock test. The helium hermeticity of the glass or glass ceramic substrate was tested after numerous cycles of the shock test. In addition, HAST were conducted on the glass or glass ceramic substrates by exposing the glass or glass ceramic substrates to 130° C. temperatures and relative humidity of 85% for hundreds of hours. The helium hermeticity of the glass or glass ceramic substrates was tested using a helium hermeticity testing technique after various thermal shock cycles and many hours of HAST. As used herein, exceeding a baseline helium hermeticity of $1.0 \times 10^{-8}$ atm-cc/s is considered a failure. Put differently, the helium hermeticity of glass or glass ceramic substrates described herein is less than or equal to $1.0 \times 10^{-8}$ atm-cc/s after a prescribed number of thermal shock cycles and/or hours of HAST.

According to embodiments, glass or glass ceramic substrates having filled vias have a helium hermeticity of less than or equal to $1.0 \times 10^{-8}$ atm-cc/s after 1000 thermal shock cycles, such as a helium hermeticity of less than or equal to $1.0 \times 10^{-8}$ atm-cc/s after 1200 thermal shock cycles, a helium hermeticity of less than or equal to $1.0 \times 10^{-8}$ atm-cc/s after 1400 thermal shock cycles, a helium hermeticity of less than or equal to $1.0 \times 10^{-8}$ atm-cc/s after 1500 thermal shock cycles, a helium hermeticity of less than or equal to $1.0 \times 10^{-8}$ atm-cc/s after 1800 thermal shock cycles, a helium hermeticity of less than or equal to $1.0 \times 10^{-8}$ atm-cc/s after 2000 thermal shock cycles, a helium hermeticity of less than or equal to $1.0 \times 10^{-8}$ atm-cc/s after 2200 thermal shock cycles, a helium hermeticity of less than or equal to $1.0 \times 10^{-8}$ atm-cc/s after 2500 thermal shock cycles, a helium hermeticity of less than or equal to $1.0 \times 10^{-8}$ atm-cc/s after 2800 thermal shock cycles, or a helium hermeticity of less than or equal to $1.0 \times 10^{-8}$ atm-cc/s after 3000 thermal shock cycles. As used herein, and using 3000 thermal shock cycles as an example, "after 3000 thermal shock cycles" means that 3000 thermal cycles were performed and the glass or glass ceramic substrate has the stated hermeticity.

As described above, the helium hermeticity of the glass or glass ceramic substrates having filled vias is also measured after hours of HAST. In embodiments, the glass or glass ceramic substrates having through vias have a helium hermeticity of less than or equal to $1.0\times10^{-8}$ atm-cc/s after 100 hours of HAST, such as after 120 hours of HAST, after 150 hours of HAST, after 180 hours of HAST, after 200 hours of HAST, after 220 hours of HAST, after 250 hours of HAST, after 280 hours of HAST, after 300 hours of HAST, after 320 hours of HAST, after 350 hours of HAST, after 380 hours of HAST, after 400 hours of HAST, after 420 hours of HAST, after 450 hours of HAST, after 480 hours of HAST, after 500 hours of HAST, after 520 hours of HAST, after 550 hours of HAST, after 580 hours of HAST, or after 600 hours of HAST. As used herein, and using 100 hours as an example, "after 100 hours of HAST" means that 100 hours of HAST were performed and the glass or glass ceramic substrate has the stated hermeticity

EXAMPLES

Embodiments will be further clarified by the following examples.

Example 1

As an example, a Ti/Cu was first deposited using sputtering as the sealant layer. Next, electroless Cu deposition was carried out to create a continuous seed layer. The TGV samples underwent SC1 cleaning process followed by application of a silane as the adhesion layer. The electroless copper deposition was carried out in a commercial "Uyemura electroless" bath using Pd/Sn colloid as the catalyst and formaldehyde as the reducing agent. The thickness of the seed layer was about 400 nm.

Following deposition of the seed layer, the TGV substrate was electroplated with Cu. First, a conformal plating of copper was carried out using a commercial Cupracid TP bath to ensure a good and uniform conductivity inside the vias. The thickness of the conformal plating layer was about 3 μm. Next, metallization using a NTBC additive bath was performed. The bath composition was 0.88 M $CuSO_4$, 45 ppm NTBC, 0.56 M $H_2SO_4$, and 45 ppm $Cl^-$ ions. The plating was done at a constant current density of 1.5 mA/cm². The X-ray CT scan of metallized TGVs with this process is shown in FIG. 9. All the TGVs are metallized with a structure that resemble the schematic of the inventive article in FIG. 2. In FIG. 10A-C, the SEM images which validate the plating thickness profile are provided. As shown in FIGS. 10A and 10B, it is evident that the center of the via is fully plugged with Cu while the coating thickness is about 8 μm (FIG. 10C).

Example 2

A fully filled cylindrical bottom-up electroplated copper-metallized through vias in a glass substrate comprising at least 90 mol % silica was used. After filling the through vias with copper by bottom-up electroplating, chemical-mechanical-polishing (CMP) was used to remove copper overburden. Thereafter the substrate was diced into die size of 14 mm by 14 mm, resulting in a die area of 196 mm². Each die contained four columns of copper-metallized through via arrays, with a total of 952 copper-metallized through vias. The copper-metallized through via diameter, pitch and depth were 50 μm, 100 μm and 300 μm respectively. The samples were then subjected to annealing treatments using different heating rates to a maximum temperature of 420° C. before the sample was oven cooled to room temperature (about 25°

Figure 17A:
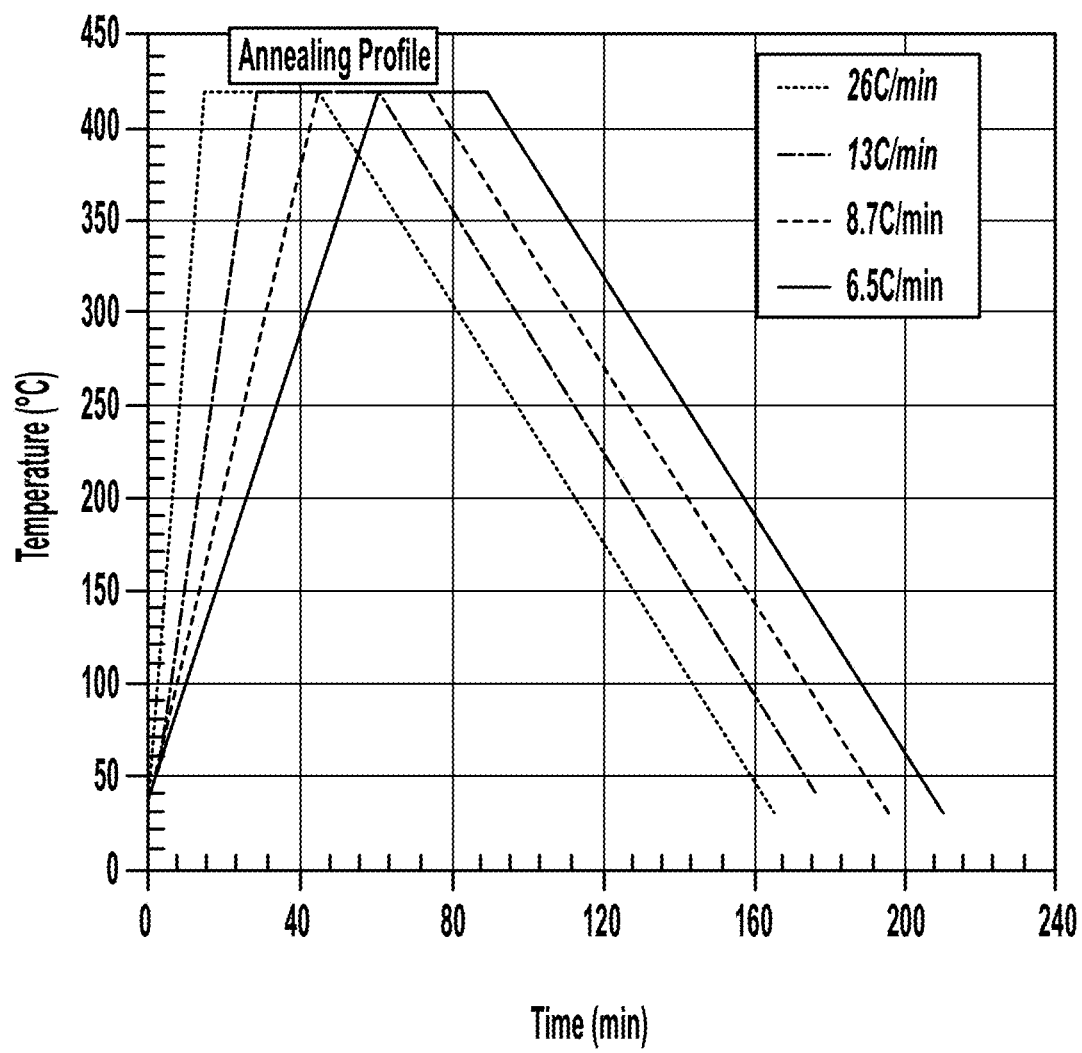
FIG. 17A graphically depicts substantially constant heating rates in temperature versus time for heating a glass or glass ceramic article comprising copper-metallized through vias.
Figure 17B:
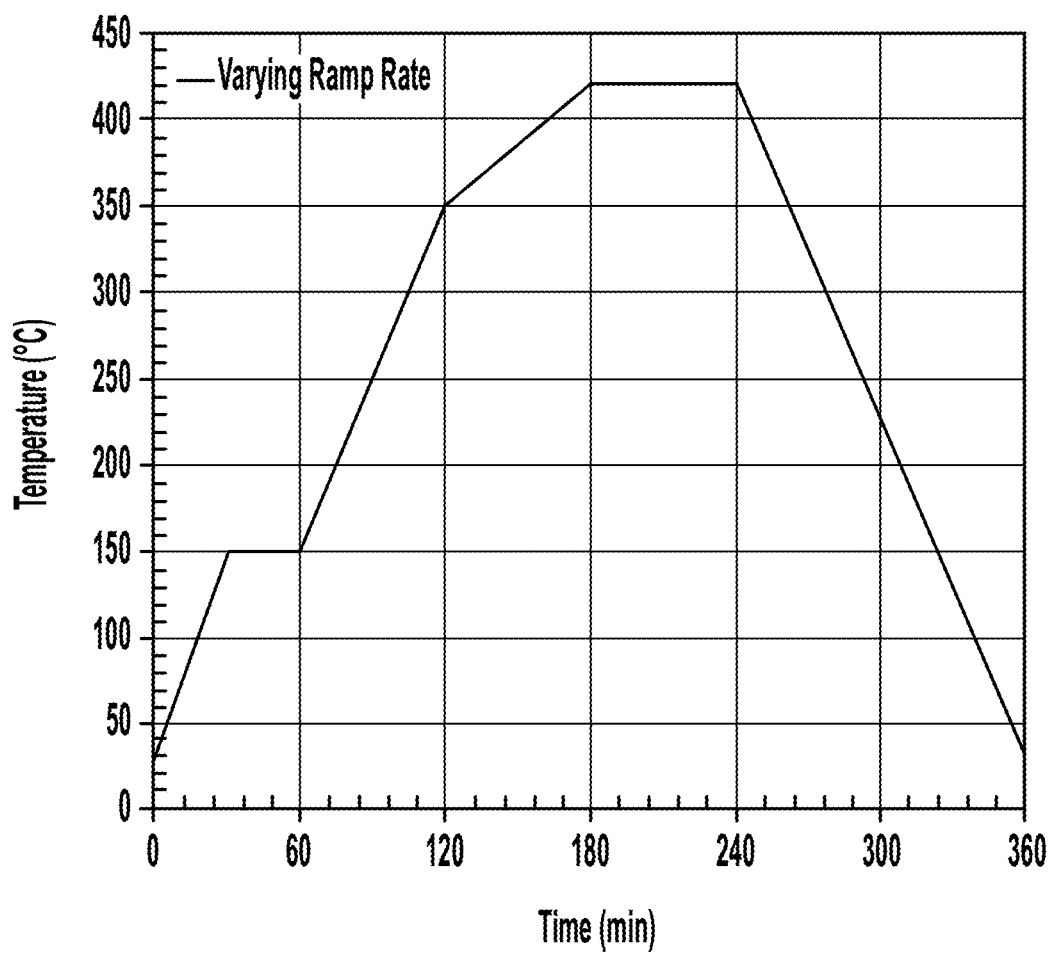
FIG. 17B graphically depicts variable heating rates in temperature versus time for heating a glass or glass ceramic article comprising copper-metallized through vias.

C.). FIG. 17A graphically depicts the annealing profile of four samples having substantially constant heating rates at 6.5° C./min, 8.7° C./min, 13.0° C./min, and 26.0° C./min. FIG. 17B graphically depicts the annealing profile having a variable heating rate, with an average heating rate of 2.3° C./min. Accordingly, heating rates from 2.3° C./min to 26.0° C./min were studied and their full details are presented in Table 3.

TABLE 3

| Total Heating Time to 420° C. (min) | Average Heating Rate (° C./min) | Constant or Variable Heating Rate | Annealing Environment. |
|---|---|---|---|
| 15 | 26.0 | Constant | Air |
| 30 | 13.0 | Constant | Air |
| 45 | 8.7 | Constant | Air |
| 60 | 6.5 | Constant | Air |
| 180 | 2.3 | Variable | Vacuum |

A constant temperature hold for a duration of 30 min at 420° C. was used for all test conditions with the exception of the test condition having an average heating rate of 2.3° C./min, which had a constant temperature hold for a duration of 60 min. The cooling, which is achieved by oven cooling was not varied and took about 120 min.

After the annealing treatment, optical inspection of the dies was performed to determine the dependence of ramp-rate on radial crack formation. The number of cracks on a die for the different ramp-up rates was counted and the crack density for each test condition was calculated using the equation below. The cracks were observed by optical microscope at 50× to 500× magnification. One sample was used for the study of each heating rate.

$$\text{Crack Density} = \frac{\text{Number of Cracks}}{\text{Die Area}} \quad (3)$$

In order to determine the temperature at which cracks are initiated, an in-situ temperature-dependent study was performed. In this study the sample was heated up to 420° C. at a ramp-rate of 20.5° C./min. By using an in-situ imaging system, images of the same particular set of vias were acquired as a function of temperature every 10 seconds, which were later analyzed to determine the temperature at which cracks were initiated.

Additionally, Zygo topography measurement method was used determine how much copper protrusion occurred with respect to the used annealing heating rate. Based on this measurement, the height of the protruding copper was determined.

Figure 18:
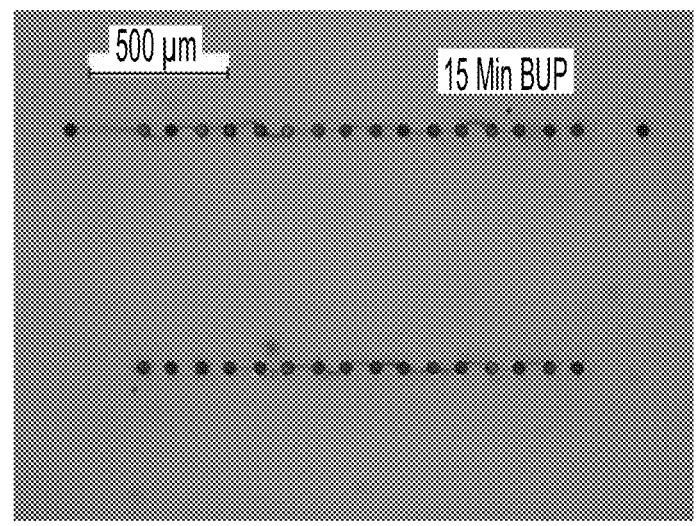
FIG. 18 is a magnified photograph of a glass or glass ceramic article comprising copper-metallized through vias with radial cracks when heated at a substantially constant heating rate of 26.0° C./min.

FIG. 18 presents a 50× optical image of a sample having a heating/ramp-up rate of 26.0° C./min. It was observed that using this fast heating rate results in the formation of cracks in the sample. The radial cracks are shown to form crack chains all through the sample, as they were found to link up with cracks from the adjacent copper-metallized through vias, leading to a network of radial cracks. The total number of radial cracks on the 14 mm by 14 mm die was 375 cracks; yielding a crack density of 1.91 cracks/mm².

Figure 19A:
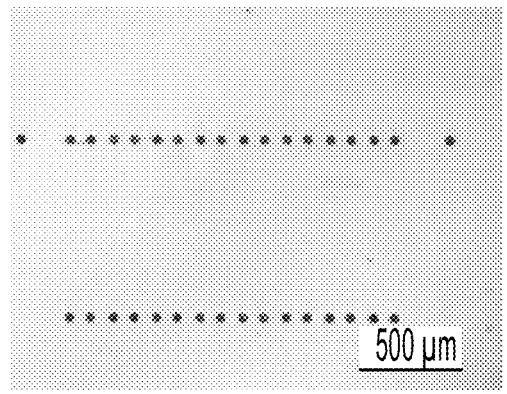
FIG. 19A is a 50× magnified photograph of a glass or glass ceramic article comprising copper-metallized through vias with radial cracks when heated at a substantially constant heating rate of 13.0° C./min.
Figure 19B:
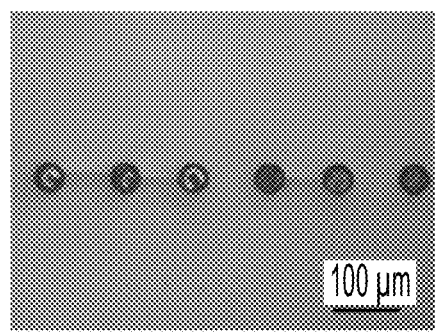
FIG. 19B is a 200× magnified photograph of a glass or glass ceramic article comprising copper-metallized through vias with radial cracks when heated at a substantially constant heating rate of 13.0° C./min.
Figure 20A:
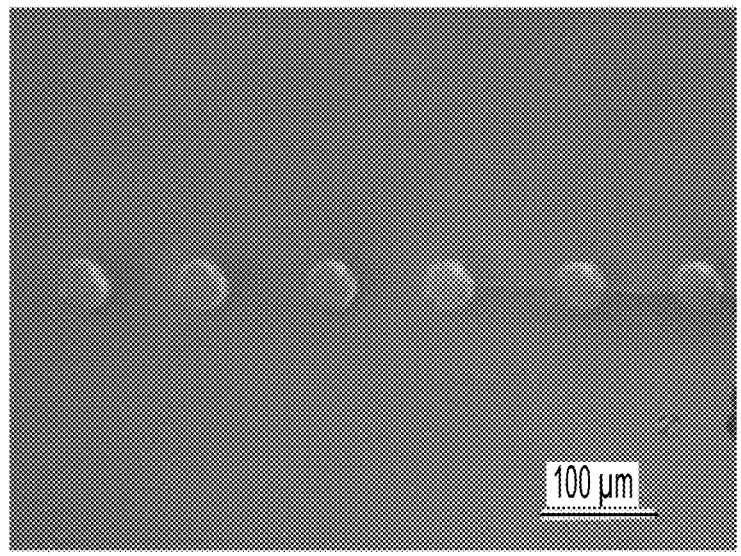
FIG. 20A is a 50× magnified photograph of a glass or glass ceramic article comprising copper-metallized through vias with radial cracks when heated at a substantially constant heating rate of 8.7° C./min.
Figure 20B:
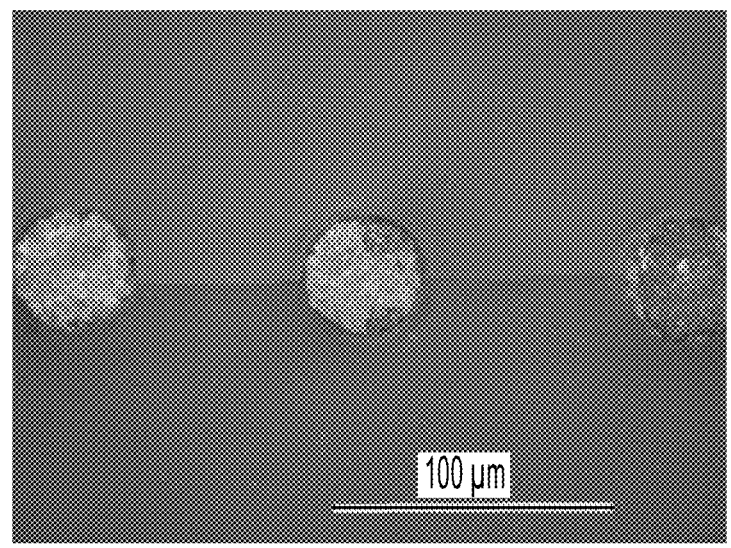
FIG. 20B is a 500× magnified photograph of a glass or glass ceramic article comprising copper-metallized through vias with radial cracks when heated at a substantially constant heating rate of 8.7° C./min.

Slowing the heating rate to 13.0° C./min and 8.7° C./min continued to result in the formation of radial cracks. The cracks formed at a heating rate of 13.0° C./min are shown in FIG. 19A (50×) and FIG. 19B (200×). The cracks formed at a heating rate of 8.7° C./min are shown in FIG. 20A (50×) and FIG. 20B (500×). However, a significant continual drop in the number of cracks was observed. The total number of radial cracks for the 13.0° C./min heating rate was found to be only 8 cracks, and the total number of cracks for the 8.7° C./min heating rate was only 4 cracks; yielded densities of 0.04 cracks/mm² and 0.02 cracks/mm², respectively.

Figure 21A:
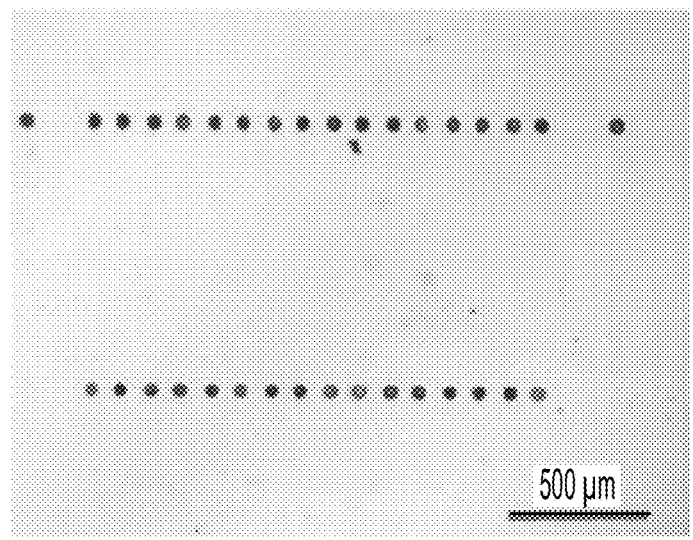
FIG. 21A is a 50× magnified photograph of a glass or glass ceramic article comprising copper-metallized through vias with no radial cracks when heated at a heating rate of 6.5° C./min.
Figure 21B:
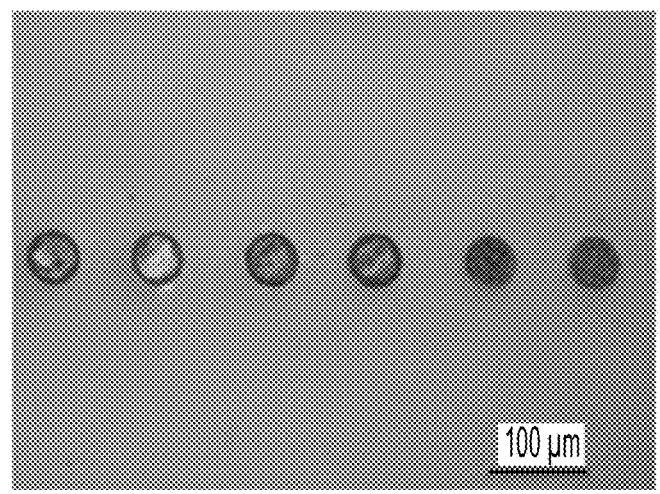
FIG. 21B is a 200× magnified photograph of a glass or glass ceramic article comprising copper-metallized through vias with no radial cracks when heated at a substantially constant heating rate of 6.5° C./min.
Figure 22:
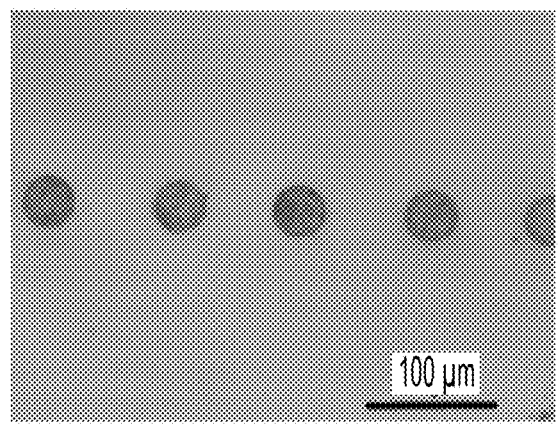
FIG. 22 is a 200× magnified photograph of a glass or glass ceramic article comprising copper-metallized through vias with no radial cracks when heated at a variable heating rate and an average heating rate of 2.3° C./min.

However, at a heating rate of 6.5° C./min, no cracks were observed, as shown in FIG. 21A (50×) and FIG. 21B (200×). Similarly, no cracks were observed for samples annealed using a variable heating rate with an average heating rate of 2.3° C./min, as shown in FIG. 22 (200×).

Table 4 below summarizes the results of the above tests.

TABLE 4

| Total Heating Time to 420° C. (min) | Average Heating Rate (° C./min) | Number of Radial Cracks on Die | Radial Crack Density (cracks/mm²) |
|---|---|---|---|
| 15 | 26.0 | 375 | 1.91 |
| 30 | 13.0 | 8 | 0.04 |
| 45 | 8.7 | 4 | 0.02 |
| 60 | 6.5 | 0 | 0 |
| 180 | 2.3 | 0 | 0 |

From the summarized results presented in Table 4, it was observed that for heating rates below 8.7° C./min radial cracks are at a minimum, and at heating rates ≥8.7° C./min the number of radial cracks on the die increased with increasing heating. However, at heating rates below 8.7° C./min the number of cracks was minimal and eventually the cracks were not present at heating rates ≤6.5° C./min. This clearly indicates that the formation of radial crack is a time-dependent phenomenon.

Figure 23:
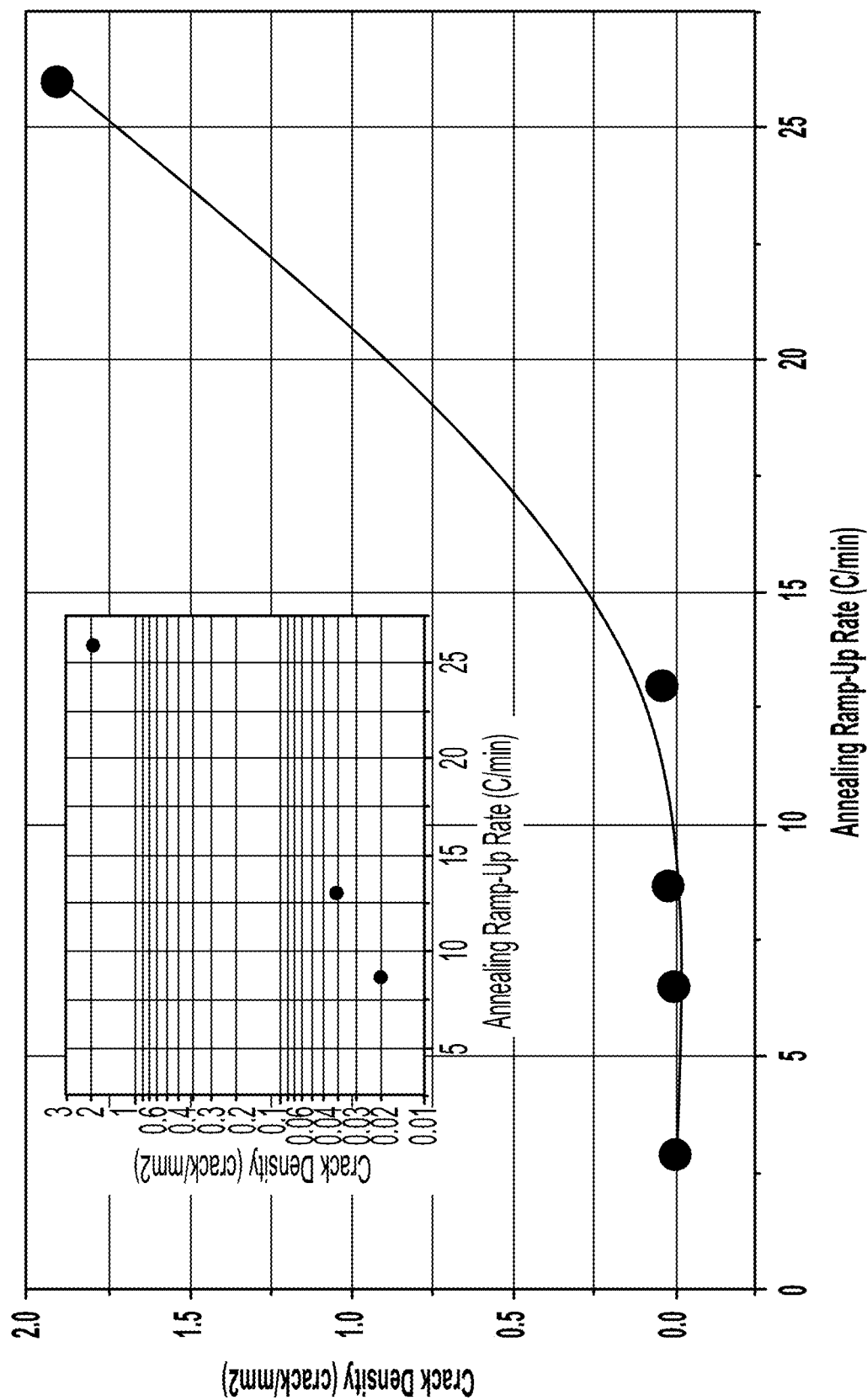
FIG. 23 graphically depicts heating crack density versus heating rate for glass or glass ceramic articles comprising copper-metallized through vias.

Additionally, the crack density was calculated as shown in Table 4 and presented graphically in FIG. 23. Crack density was found to exponentially increase with the used annealing heating rate. FIG. 23 clearly indicates that the formation of radial cracks is a rate-dependent phenomenon. This also shows that radial crack formation is stress driven, emanating from the mismatch in the CTE of copper and its surrounding glass matrix. As such, the absence of cracks for heating rates ≤6.5° C./min, suggests sufficient activation of rate-controlled stress relaxation mechanisms in the copper-metallized through vias. Further, because limited amounts of cracks are observed at heating rates below 8.7° C./min, this means that for heating rates <8.7° C./min, the stresses in the copper-metallized through vias are lower, leading to lower induced stresses in the glass that are below the threshold critical stress value needed for the initiation of cracks in the glass.

Figure 24A:
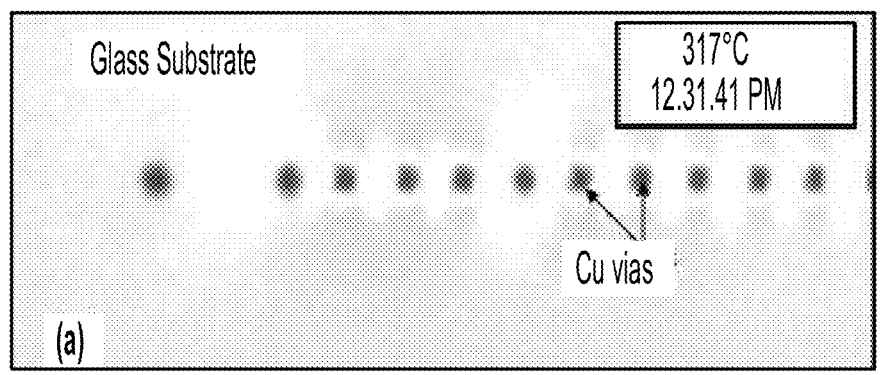
FIGS. 24A-24C show radial crack formation of copper-metallized through vias heated at 20.5° C./min over time.
Figure 24B:
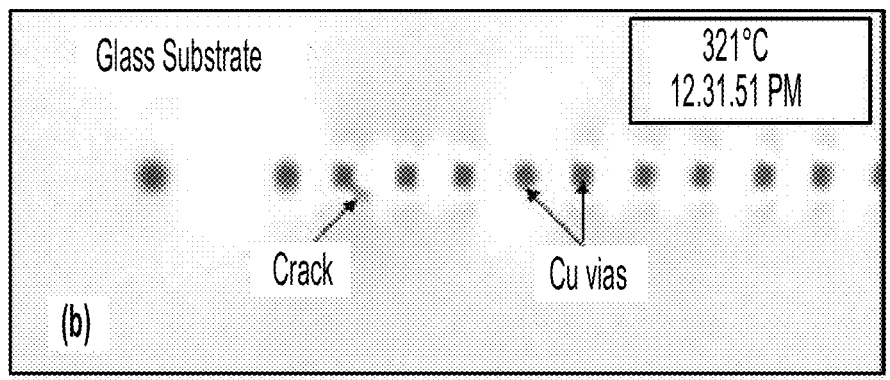
Figure 24C:
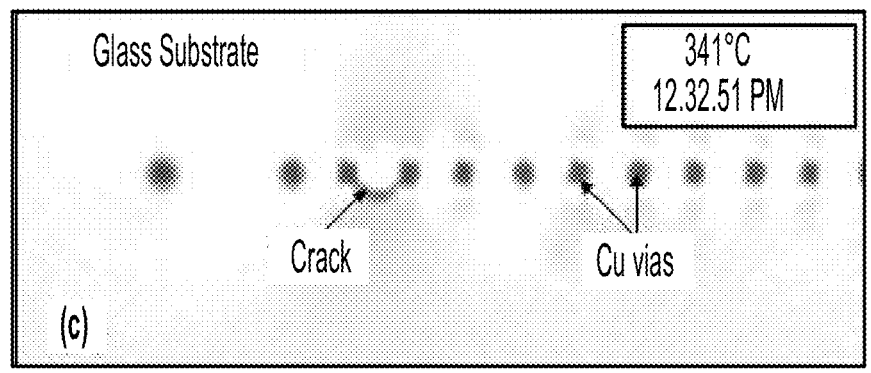

FIGS. 24A-24C are in-situ, temperature-dependent images of copper-metallized through vias. Visually, at 317° C., no radial cracks were observed (FIG. 24A). However, after 10 seconds, a crack is observed to propagate from the third copper-metallized through via from the left, which corresponds to a temperature of 321° C. (FIG. 24B). Further increases in temperature resulted in growth of the crack until it finally connected to the adjacent copper-metallized through via (i.e., the fourth copper-metallized through via from the left) sixty seconds later, as shown in FIG. 24C. Although the radial crack was first observed at 321° C., it may have developed at lower temperatures due to the setup of the testing protocol. For instance, images were only capture every 10 seconds.

Figure 25:
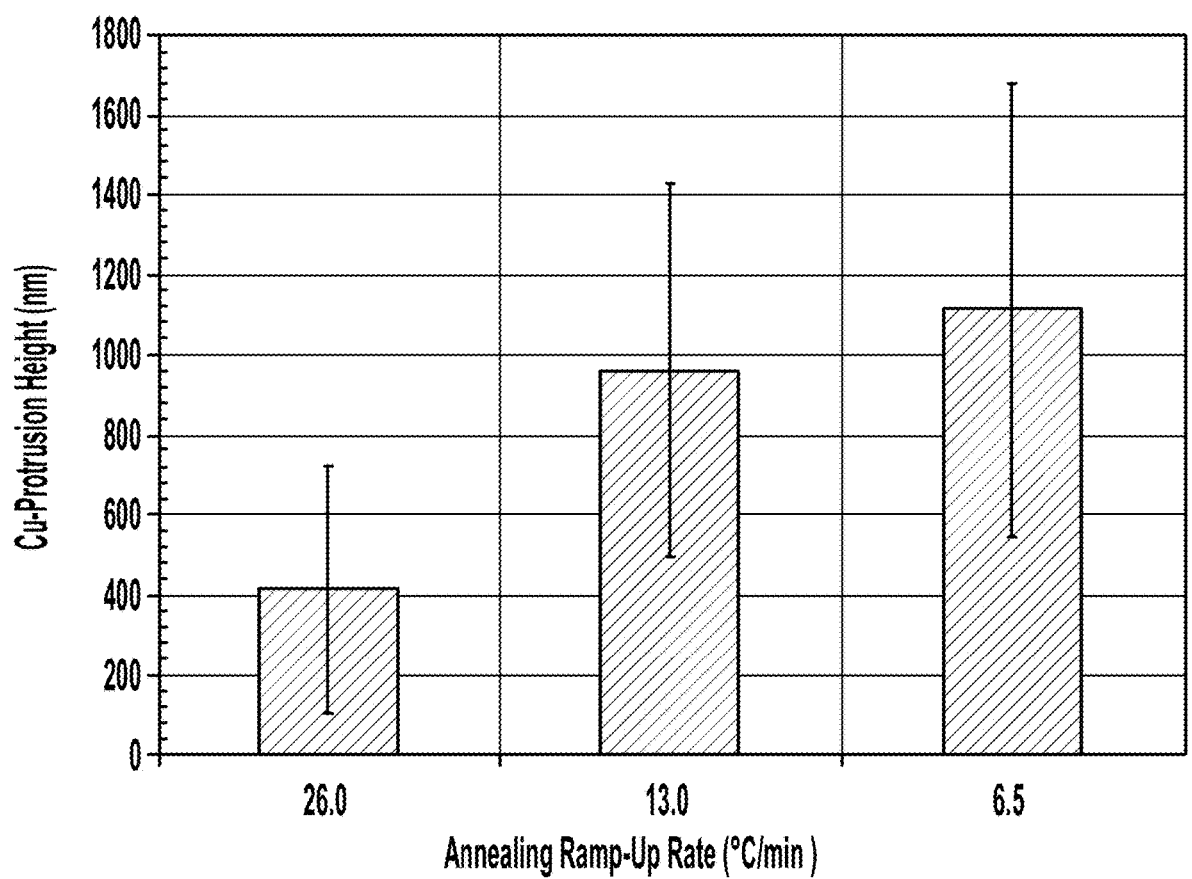
FIG. 25 graphically depicts copper protrusion versus annealing heating rate.

To more fully understand the activity of stress relaxation mechanisms, further experimental study was done by the measurement of the copper protrusion after annealing with respect to the annealing heating rate, which is presented in FIG. 25. Copper protrusion is the inelastic out-of-plane deformation. It occurs during heating due to the buildup of high compressive stresses in the copper due to the mismatch in the CTE of the copper and the surrounding glass substrate. Copper protrusion is a combination of plastically deformed copper, as well as hillock formation. Plastic deformation occurs due to the attainment of the yield strength of copper, which decreases with increasing temperature. On the other hand, hillock formation is a preferential out-of-plane displacement of Cu grain by grain boundary sliding (GBS) phenomenon. GBS is a stress relaxation mechanism which is a diffusion controlled mechanism that results in the approximate translation of one grain over another, parallel to the boundary interface. GBS leads to the formation of copper protrusion due to the vertical displacement of grains during translation.

In FIG. 25, it was measured that the copper protrusion height increased with increasing heating time, in order words, the copper protrusion increased with decreasing heating rates. For instance, the amount of Cu protrusion at a heating rate of 26.0° C./min was measured to be 400 nm, however, when a heating rate of 6.5° C./min was used, the copper protrusion height was measured to be about 1100 nm. FIG. 25, shows a strong dependence of copper protrusion on the used annealing heating rate. Based on Table 2 and FIG. 25, it can be inferred that the increase in copper protrusion results in the decrease in the number of formed radial cracks. This is due to the increased activity of stress relaxation mechanisms with increased heating time or decreased heating rate. GBS is known to be a rate-controlled stress relaxation mechanism that is also accompanied by the formation of micro-voids, as such, its activity increases with lower annealing heating rate. This means that the activity of GBS and plastic deformation sufficiently relaxes the built up stresses in copper below the critical stress threshold needed for the formation of radial cracks when ramp-up rates <8.7° C./min, such as ≤6.5° C./min were used.

Example 3

Figure 26:
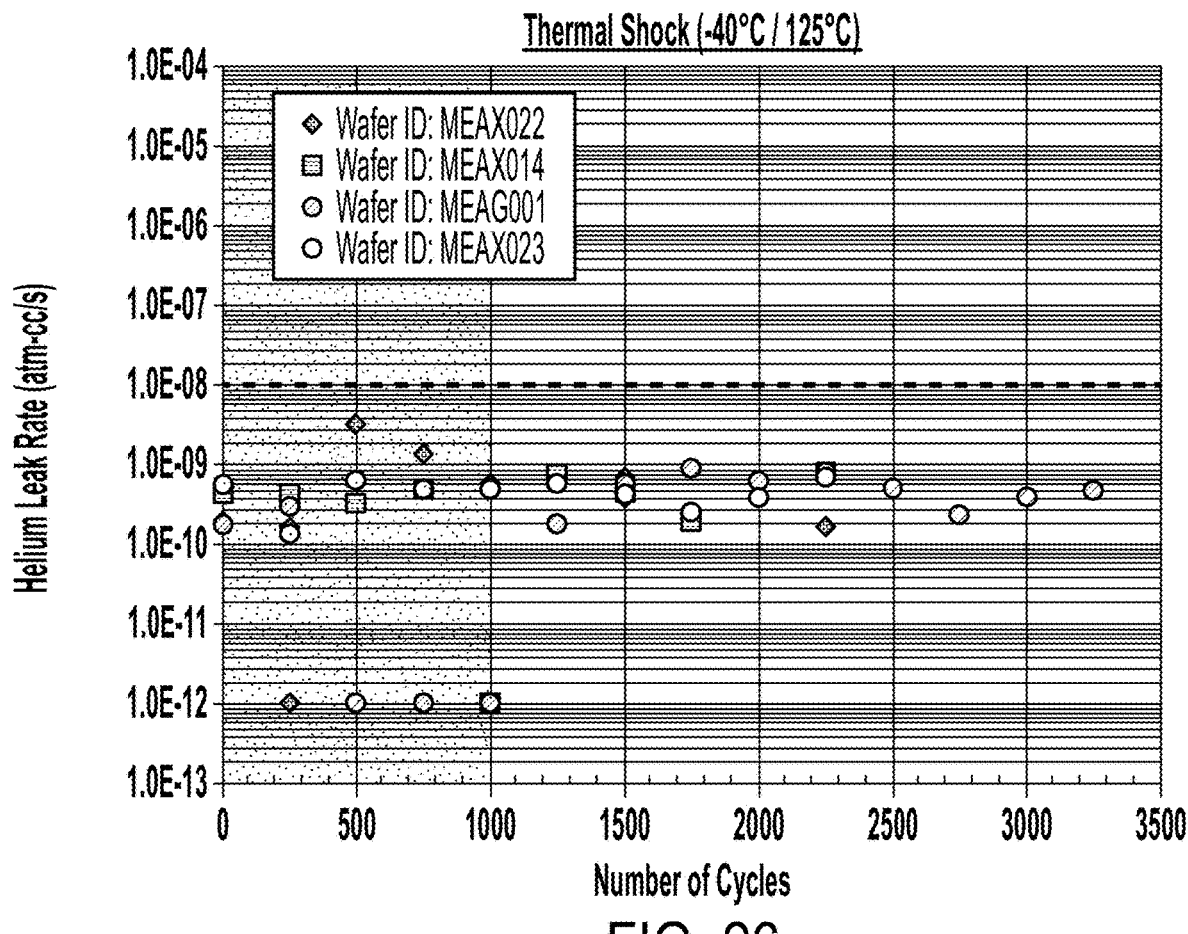
FIG. 26 graphically depicts the results of helium hermeticity for thermal shock testing.

Thermal shock testing was conducted on four different glass wafers—Wafer 1, Wafer 2, Wafer 3, and Wafer 4—with filled vias that were conformally plated as shown in FIGS. 2 and 3. This conformal plating was achieved by electroplating and the glass wafer comprised at least 90 mol % silica. Each of the samples were exposed to thermal shock testing where a thermal shock cycle includes cooling the glass wafer to −40° C. and then heating the glass wafer to 125° C. in 20 seconds with a dwell time (or hold) of 10 minutes at each temperature. The helium hermeticity of the metallized glass wafers was tested using helium leak hermeticity test at 250 cycle intervals (e.g., 250 cycles, 500 cycles, 750 cycles, etc.). The helium leak test was conducted by placing the wafer under a vacuum at $2.3e^{-3}$ Torr. Helium was then sprayed on the top surface of the metallized glass wafer and helium permeability through the metallized glass wafer (from the top surface to the bottom surface) was determined with a commercial helium detector gauge. The thermal shock testing was terminated when the glass wafers with filled vias had a helium hermeticity of greater than $1.0\times10^{-8}$ atm-cc/s. As shown in FIG. 26 all four of the glass wafers with metallized through vias tested in this example maintained a helium hermeticity of less than $1.0\times10^{-8}$ atm-cc/s for at least 2250 thermal shock cycles. In addition, Wafer 3 was able to maintain a helium hermeticity of less than $1.0\times10^{-8}$ atm-cc/s for at least 3250 thermal shock cycles. These examples show that glass and glass ceramic substrates with filled vias prepared according to embodiments disclosed and described herein have good helium hermeticity even after many thermal shock cycles.

Figure 27:
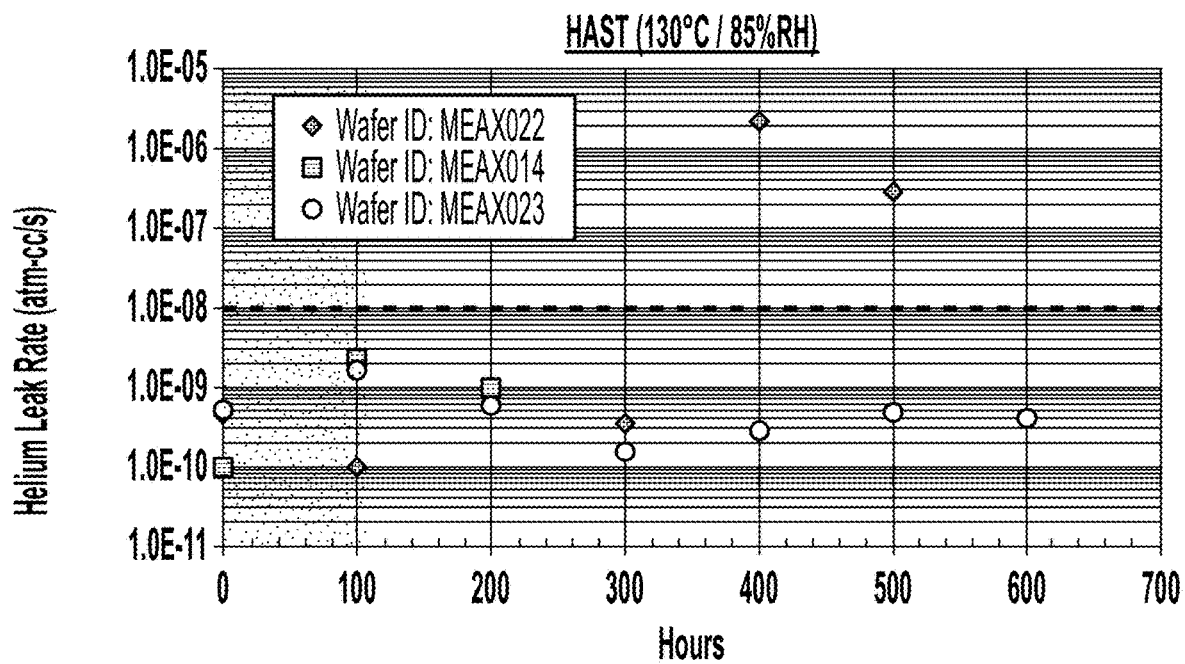
FIG. 27 graphically depicts the results of helium hermeticity for highly accelerated stress testing.

Wafer 1, Wafer 2, and Wafer 4 were also subjected to highly accelerated stress test (HAST), where the wafers were subjected to a temperature of 130° C. and a relative humidity of 85% for a number of hours until the helium hermeticity of the wafers was greater than $1.0 \times 10^{-8}$ atm-cc/s. The helium hermeticity of the glass wafers was tested using helium leak helium hermeticity test was conducted as described above at 100 hour intervals (e.g., 100 hours, 200 hours, 300 hours, etc.). As shown in FIG. 27, all three wafers were able to maintain a helium hermeticity of less than or equal to $1.0 \times 10^{-8}$ atm-cc/s for at least 200 hours. In addition, Wafer 3 was able to maintain a helium hermeticity of less than or equal to $1.0 \times 10^{-8}$ atm-cc/s for at least 300 hours (i.e., Wafer 3 had a helium hermeticity of greater than $1.0 \times 10^{-8}$ atm-cc/s at some point between 300 hours and 400 hours of HAST), and Wafer 4 was able to maintain a helium hermeticity of less than or equal to $1.0 \times 10^{-8}$ atm-cc/s for 600 hours. These examples show that glass and glass ceramic substrates with filled vias prepared according to embodiments disclosed and described herein have good helium hermeticity even after many hours of HAST.

CONCLUSION

As used here, the transitional phrase "consisting essentially of" limits the scope of a claim to the specified materials or steps "and those that do not materially affect the basic and novel characteristic(s)" of the claimed invention.

Those skilled in the relevant art will recognize and appreciate that many changes can be made to the various embodiments described herein, while still obtaining the beneficial results. It will also be apparent that some of the desired benefits of the present embodiments can be obtained by selecting some of the features without utilizing other features. Accordingly, those who work in the art will recognize that many modifications and adaptations are possible and can even be desirable in certain circumstances and are a part of the present disclosure. Therefore, it is to be understood that this disclosure is not limited to the specific compositions, articles, devices, and methods disclosed unless otherwise specified. It is also to be understood that the terminology used herein is for the purpose of describing particular embodiments only and is not intended to be limiting. Features shown in the drawing are illustrative of selected embodiments of the present description and are not necessarily depicted in proper scale. These drawing features are exemplary, and are not intended to be limiting.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or description that the steps are to be limited to a specific order, it is no way intended that any particular order be inferred.

What is claimed is:

1. An article, comprising:
   a glass or glass-ceramic substrate having a first major surface and a second major surface opposite the first major surface, and at least one via extending through the substrate from the first major surface to the second major surface defining an axial length; and
   a metal connector disposed within the via that hermetically seals the via, wherein:
   the via comprises:
      the interior surface over the axial length,
      a first portion, a second portion, and a waist between the first portion and the second portion, a minimum diameter of the waist being smaller than a minimum diameter of the first portion and smaller than a minimum diameter of the second portion, and
      a hermetic adhesion layer disposed on the interior surface in at least one of the first portion and the second portion, and wherein the hermetic adhesion layer is not disposed on the interior surface at the waist,
   the article has a helium hermeticity of less than or equal to $1.0 \times 10^{-8}$ atm-cc/s after 1000 thermal shock cycles, each of the thermal shock cycles comprises cooling the article to a temperature of $-40°$ C. and heating the article to a temperature of $125°$ C., and
   the article has a helium hermeticity of less than or equal to $1.0 \times 10^{-8}$ atm-cc/s after 100 hours of highly accelerated stress testing (HAST) at a temperature of $130°$ C. and a relative humidity of 85%.

2. The article of claim 1, wherein:
   the metal connector coats the interior surface of the via along the axial length of the via from the first major surface to a first cavity length to define a first cavity, with a coating thickness at each position along the axial length of the first cavity that is less than 50% of a via diameter at the first major surface,
   the metal connector coats the interior surface of the via along the axial length of the via from the second major surface to a second cavity length to define a second cavity, with a coating thickness at each position along the axial length of the second cavity that is less than 50% of a via diameter at the second major surface,
   the first cavity length is 5% to 45% of the axial length of the via,
   the second cavity length is 5% to 45% of the axial length of the via, and
   the metal connector fully fills the via for at least 10% of the axial length of the via between the first cavity and the second cavity.

3. The article of claim 2, wherein:
   the first portion includes an intersection of the via with the first major surface, and
   the second portion includes an intersection of the via with the second major surface.

4. The article of claim 1, wherein the article has a helium hermeticity of less than or equal to $1.0 \times 10^{-8}$ atm-cc/s after 3000 thermal shock cycles.

5. The article of claim 1, wherein the article has a helium hermeticity of less than or equal to $1.0 \times 10^{-8}$ atm-cc/s after 300 hours of HAST.

6. The article of claim 1, wherein the article has a helium hermeticity of less than or equal to $1.0 \times 10^{-8}$ atm-cc/s after 2000 thermal shock cycles, and a helium hermeticity of less than or equal to $1.0 \times 10^{-8}$ atm-cc/s after 200 hours of HAST.

7. The article of claim 6, wherein the article the article has a helium hermeticity of less than or equal to $1.0 \times 10^{-8}$ atm-cc/s after 3000 thermal shock cycles, and a helium hermeticity of less than or equal to $1.0 \times 10^{-8}$ atm-cc/s after 300 hours of HAST.

8. The article of claim 1, wherein the axial length of the via is from 10 microns to 2 mm.

9. The article of claim 8, wherein the axial length of the via is from 150 microns to 500 microns.

10. The article of claim 9, wherein the axial length of the via is from 240 microns to 360 microns.

11. The article of claim 1, wherein the substrate comprises a material, the material comprising 50 mol % to 100 mol % $SiO_2$ on an oxide basis.

12. The article of claim 11, wherein the material comprises 90 mol % to 100 mol % $SiO_2$ on an oxide basis.

13. The article of claim 2, wherein the adhesion layer comprises Ti, TiN, Ta, TaN, Cr, Ni, TiW, W and combinations thereof.

14. The article of claim 1, wherein the metal connector consists essentially of copper.

15. An article, comprising:
a glass or glass-ceramic substrate having a first major surface and a second major surface opposite the first major surface, and at least one via extending through the substrate from the first major surface to the second major surface defining an axial length; and
a metal connector disposed within the via that hermetically seals the via, wherein:
the via comprises a first diameter at the first major surface, a second diameter at the second major surface, and a waist diameter between the first major surface and the second major surface, the waist diameter being smaller than the first diameter and the second diameter,
the metal connector fully fills at least the waist diameter, and wherein the metal connector does not fully fill at least one of the first diameter and the second diameter forming at least one annular cavity,
the article has a helium hermeticity of less than or equal to $1.0 \times 10^{-8}$ atm-cc/s after 1000 thermal shock cycles, each of the thermal shock cycles comprises cooling the article to a temperature of $-40°$ C. and heating the article to a temperature of $125°$ C., and
the article has a helium hermeticity of less than or equal to $1.0 \times 10^{-8}$ atm-cc/s after 100 hours of highly accelerated stress testing (HAST) at a temperature of $130°$ C. and a relative humidity of 85%.

16. The article of claim 15, further comprising a hermetic adhesion layer disposed on at least one of the first diameter and the second diameter.

17. The article of claim 16, wherein the adhesion layer comprises Ti, TiN, Ta, TaN, Cr, Ni, TiW, W and combinations thereof.

18. The article of claim 15, wherein the metal connector consists essentially of copper.

* * * * *

UNITED STATES PATENT AND TRADEMARK OFFICE
CERTIFICATE OF CORRECTION

PATENT NO. : 11,152,294 B2
APPLICATION NO. : 16/376467
DATED : October 19, 2021
INVENTOR(S) : Tian Huang et al.

It is certified that error appears in the above-identified patent and that said Letters Patent is hereby corrected as shown below:

On the Title Page

On page 5, in Column 1, item (56), Other Publications, Line 41, delete "(1989." and insert -- (1989). --, therefor.

On page 5, in Column 1, item (56), Other Publications, Line 42, delete "Electroles" and insert -- Electroless --, therefor.

On page 5, in Column 1, item (56), Other Publications, Line 44, delete "(2011." and insert -- (2011). --, therefor.

On page 5, in Column 1, item (56), Other Publications, Line 48, delete "(ECTC." and insert -- (ECTC). --, therefor.

On page 5, in Column 1, item (56), Other Publications, Line 52, delete "(2011." and insert -- (2011). --, therefor.

On page 5, in Column 1, item (56), Other Publications, Line 55, delete "(2008." and insert -- (2008). --, therefor.

On page 5, in Column 1, item (56), Other Publications, Line 57, delete "Barries" and insert -- Barriers --, therefor.

On page 5, in Column 1, item (56), Other Publications, Line 59, delete "(2009." and insert -- (2009). --, therefor.

On page 5, in Column 2, item (56), Other Publications, Lines 13-14, delete "Electornic Componsents" and insert -- Electronic Components --, therefor.

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,152,294 B2

On page 5, in Column 2, item (56), Other Publications, Line 15, delete "(2017." and insert
-- (2017). --, therefor.

On page 5, in Column 2, item (56), Other Publications, Line 20, delete "Technolgy"," and insert
-- Technology", --, therefor.

On page 5, in Column 2, item (56), Other Publications, Line 22, delete "Aminosiline" and insert
-- Aminosilane --, therefor.

On page 5, in Column 2, item (56), Other Publications, Line 40, delete "Mirco-Systems"" and insert
-- Micro-Systems" --, therefor.

On page 5, in Column 2, item (56), Other Publications, Line 49, delete "Throughsilicon" and insert
-- Through silicon --, therefor.

On page 6, in Column 1, item (56), Other Publications, Line 1, delete "{CVD)" and insert
-- {CVD} --, therefor.

In the Claims

In Column 38, Line 2, Claim 1, delete "the" and insert -- an --, therefor.

In Column 38, Line 59, Claim 1, delete "the article the article" and insert -- the article --, therefor.